US012563973B2

(12) United States Patent
Lille et al.

(10) Patent No.: US 12,563,973 B2
(45) Date of Patent: Feb. 24, 2026

(54) BONDED MEMORY DEVICES AND METHODS OF MAKING THE SAME

(71) Applicant: SANDISK TECHNOLOGIES LLC, Addison, TX (US)

(72) Inventors: Jeffrey Lille, Sunnyvale, CA (US); Joyeeta Nag, San Jose, CA (US); Raghuveer S. Makala, Campbell, CA (US)

(73) Assignee: Sandisk Technologies, Inc., Milpitas, CA (US)

( * ) Notice: Subject to any disclaimer, the term of this patent is extended or adjusted under 35 U.S.C. 154(b) by 553 days.

(21) Appl. No.: 17/670,842

(22) Filed: Feb. 14, 2022

(65) Prior Publication Data

US 2022/0165937 A1 May 26, 2022

Related U.S. Application Data

(63) Continuation-in-part of application No. 17/406,758, filed on Aug. 19, 2021, now Pat. No. 12,362,301, which is a continuation-in-part of application No. 16/913,717, filed on Jun. 26, 2020, now Pat. No. 11,903,218.

(51) Int. Cl.
| | |
|---|---|
| *H10N 50/10* | (2023.01) |
| *G11C 5/08* | (2006.01) |
| *H10B 61/00* | (2023.01) |
| *H10N 50/01* | (2023.01) |
| *H10N 50/80* | (2023.01) |

(52) U.S. Cl.
CPC .............. *H10N 50/10* (2023.02); *G11C 5/08* (2013.01); *H10B 61/00* (2023.02); *H10N 50/01* (2023.02); *H10N 50/80* (2023.02)

(58) Field of Classification Search
CPC .......... H01L 29/516; H01L 2924/1441; H10N 70/826–8265
See application file for complete search history.

(56) References Cited

U.S. PATENT DOCUMENTS

| | | | |
|---|---|---|---|
| 5,393,352 A | 2/1995 | Summerfelt | |
| 5,915,167 A | 6/1999 | Leedy | |
| 6,198,652 B1 | 3/2001 | Kawakubo et al. | |
| 6,246,085 B1 | 6/2001 | Yoshida | |
| (Continued) | | | |

FOREIGN PATENT DOCUMENTS

| | | |
|---|---|---|
| CN | 101789490 A | 7/2010 |
| EP | 1845567 A1 | 10/2007 |
| (Continued) | | |

OTHER PUBLICATIONS

USPTO Office Communication, Non-Final Office Action for U.S. Appl. No. 17/406,758, mailed Jun. 17, 2024, 49 pages.
(Continued)

*Primary Examiner* — Amar Movva
(74) *Attorney, Agent, or Firm* — THE MARBURY LAW GROUP PLLC

(57) ABSTRACT

A method of forming a magnetoresistive random access memory (MRAM) device includes providing a first die containing a selector material layer located over a first substrate, providing a second die containing a MRAM layer stack located over a second substrate, and bonding the first die to the second die.

20 Claims, 77 Drawing Sheets

(56)　　　　References Cited

U.S. PATENT DOCUMENTS

| | | | |
|---|---|---|---|
| 9,779,797 | B2 | 10/2017 | Ino et al. |
| 9,941,299 | B1 | 4/2018 | Chen et al. |
| 10,115,897 | B1 | 10/2018 | Sato |
| 10,121,965 | B1 | 11/2018 | Uno et al. |
| 10,199,434 | B1 | 2/2019 | Lee et al. |
| 10,224,372 | B2 | 3/2019 | Mori |
| 10,249,683 | B1 | 4/2019 | Lille et al. |
| 10,256,272 | B2 | 4/2019 | Yoshida et al. |
| 10,283,710 | B2 | 5/2019 | Kikuchi et al. |
| 10,354,728 | B2 | 7/2019 | Rajamohanan et al. |
| 10,381,409 | B1 | 8/2019 | Zhou et al. |
| 10,381,411 | B2 | 8/2019 | Lille |
| 10,381,559 | B1 | 8/2019 | Zhou et al. |
| 10,692,884 | B2 | 6/2020 | Cui et al. |
| 10,700,093 | B1 | 6/2020 | Kalitsov et al. |
| 10,811,431 | B1 | 10/2020 | Makala et al. |
| 10,833,101 | B2 | 11/2020 | Shimomura et al. |
| 10,868,042 | B1 | 12/2020 | Zhang et al. |
| 10,879,269 | B1 | 12/2020 | Zhang et al. |
| 10,916,287 | B2 | 2/2021 | Zhang et al. |
| 10,923,502 | B2 | 2/2021 | Sato |
| 10,937,809 | B1 | 3/2021 | Sharangpani et al. |
| 10,964,752 | B2 | 3/2021 | Takahashi et al. |
| 10,978,482 | B2 | 4/2021 | Alsmeier et al. |
| 11,043,537 | B2 | 6/2021 | Takahashi et al. |
| 11,049,880 | B2 | 6/2021 | Rajashekhar et al. |
| 11,088,170 | B2 | 8/2021 | Zhang et al. |
| 11,176,981 | B1 | 11/2021 | Prasad et al. |
| 11,217,289 | B1 | 1/2022 | Prasad et al. |
| 2002/0036307 | A1 | 3/2002 | Song |
| 2002/0089870 | A1 | 7/2002 | Honda |
| 2006/0091437 | A1 | 5/2006 | Hong et al. |
| 2007/0107774 | A1 | 5/2007 | Jin et al. |
| 2008/0162854 | A1* | 7/2008 | Hashimoto ............ G11C 29/42 |
| | | | 714/E11.038 |
| 2009/0147392 | A1 | 6/2009 | Prejbeanu et al. |
| 2016/0005461 | A1 | 1/2016 | Jo et al. |
| 2016/0064391 | A1 | 3/2016 | Li et al. |
| 2016/0359109 | A1* | 12/2016 | Kamimuta ........... H10N 70/063 |
| 2016/0365133 | A1* | 12/2016 | Ino ......................... H10B 63/80 |
| 2016/0380185 | A1 | 12/2016 | Kato et al. |
| 2017/0069841 | A1 | 3/2017 | Ino et al. |
| 2017/0117027 | A1* | 4/2017 | Braganca ............... H10B 61/10 |
| 2018/0261270 | A1* | 9/2018 | Yoshikawa ............ H10N 50/80 |
| 2018/0277517 | A1 | 9/2018 | Kim et al. |
| 2018/0342557 | A1 | 11/2018 | Mori |
| 2018/0358410 | A1 | 12/2018 | Lee |
| 2018/0374899 | A1 | 12/2018 | Yoshida et al. |
| 2019/0074441 | A1 | 3/2019 | Kikuchi et al. |
| 2019/0088664 | A1 | 3/2019 | Kabuyanagi et al. |
| 2019/0148286 | A1 | 5/2019 | Or-Bach et al. |
| 2019/0189688 | A1 | 6/2019 | Lille |
| 2019/0287599 | A1 | 9/2019 | Higashi et al. |
| 2019/0288032 | A1* | 9/2019 | Furuhashi ............... H10N 50/85 |
| 2019/0288192 | A1 | 9/2019 | Takahashi et al. |
| 2019/0354843 | A1 | 11/2019 | Park et al. |
| 2019/0363179 | A1 | 11/2019 | Or-Bach et al. |
| 2020/0119259 | A1 | 4/2020 | Ahn et al. |
| 2020/0321444 | A1 | 10/2020 | Lien et al. |
| 2020/0365618 | A1 | 11/2020 | Zhang et al. |
| 2021/0082955 | A1 | 3/2021 | Rajashekhar et al. |
| 2021/0091204 | A1 | 3/2021 | Rabkin et al. |
| 2021/0135090 | A1* | 5/2021 | Sun ......................... H10N 50/01 |
| 2021/0151445 | A1 | 5/2021 | Wagner et al. |
| 2021/0159248 | A1 | 5/2021 | Zhang et al. |
| 2021/0210497 | A1 | 7/2021 | Yang et al. |
| 2021/0408019 | A1 | 12/2021 | Makala et al. |
| 2021/0408020 | A1 | 12/2021 | Makala et al. |
| 2021/0408114 | A1 | 12/2021 | Lille et al. |

FOREIGN PATENT DOCUMENTS

| | | | |
|---|---|---|---|
| JP | 11-220103 | A | 8/1999 |
| JP | 2002359357 | A | 12/2002 |
| JP | 2007081112 | A | 3/2007 |
| JP | 2014-229758 | A | 12/2014 |
| KR | 10-2018-0137580 | A | 12/2018 |
| WO | WO2009/031387 | A1 | 3/2009 |

OTHER PUBLICATIONS

EPO Office Communication, Supplemental European Search Report and Provisional Opinion Accompanying the Partial Search Result for European Patent Application No. 20942180.9, mailed Oct. 10, 2023, 12 pages.

KIPO Office Communication, Notice of Preliminary Rejection for Korean Patent Application No. 10-2022-7017454, mailed Oct. 23, 2023, 16 pages.

USPTO Office Communication, Non-Final Office Action for U.S. Appl. No. 16/913,766, mailed May 11, 2022, 26 pages.

USPTO Office Communication, Final Office Action for U.S. Appl. No. 16/913,717, mailed Oct. 20, 2022, 13 pages.

USPTO Office Communication, Final Office Action for U.S. Appl. No. 16/913,717, mailed Jun. 22, 2023, 13 pages.

Chanthbouala, A. et al., "Solid-state memories based on ferroelectric tunnel junctions," Nature Nanotechnology, vol. 7, pp. 101-104, Feb. 2012, www.nature.com/naturenanotechnology, (2012).

Benjamin, S. L. et al., "Controlling the nanostructure of bismuth telluride by selective chemical vapour deposition from a single source precursor," J. Mater. Chem. A, 2014, vol. 2, pp. 4865-4869, (2014).

Goh, Y. et al., "Enhanced tunneling electroresistance effects in HfZrO-based ferroelectric tunnel junctions by high-pressure nitrogen annealing," Appl. Phys. Lett., vol. 113, pp. 052905-1-052905-5 (2018); doi: 10.1063/1.5040031, (2018).

Garcia, V. et al., "Ferroelectric tunnel junctions for information storage and processing," Nature Communications, Nature Communications | 5:4289 | DOI: 10.1038/ncomms5289, www.nature.com/naturecommunications, (2014).

Garcia, V. et al., "Giant tunnel electroresistance for non-destructive readout of ferroelectric states," Nature, vol. 460, Jul. 2, 2009, pp. 81-84, doi: 10.1038/nature08128, (2009).

Xi, Z. et al., "Giant tunneling electroresistance in metal/ferroelectric/semiconductor tunnel junctions by engineering the Schottky barrier," Nature Communications, vol. 8:15217, pp. 1-9, DOI: 10.1038/ncomms15217, (2016).

De Groot, C. H. et al., "Highly Selective Chemical Vapor Deposition of Tin Diselenide Thin Films onto Patterned Substrates via Single Source Diselenoether Precursors," Chem. Mater. 2012, vol. 24, pp. 4442-4449, (2012).

Wen, Z. et al., "Ferroelectric-field-effect-enhanced electroresistance in metal / ferroelectric / semiconductor tunnel junctions," Nature Materials, vol. 12, pp. 617-621 (2013).

Li, J. et al., "Ultrafast polarization switching in thin-film ferroelectrics," Applied Physics Letters, vol. 84, No. 7, pp. 1174-1176 (2004).

Deguet, C. et al., "Germanium-on-Insulator (GeOI) Structures Realized by the Smart Cut Technology," 2004 IEEE International SOI conference, Oct. 2004, 2 pages, (2004).

Lomenzo, P. D. et al., "Ferroelectric Si-Doped HfO2 Device Properties on Highly Doped Germanium," IEEE Electron Deice Letters, vol. 36, No. 8, pp. 766-768, (2015).

Geiger, R. et al., "Uniaxially stressed germanium with fundamental direct band gap" Cond. Mat. Matl. Sci., 9 pages, (2015).

Li, T. et al., "Origin of Ferroelectricity in Epitaxial Si-Doped HfO2 Films" ACS Appl. Mater. Interfaces 2019, vol. 11, pp. 4139-4144, (2019).

Tian, X. et al., "Evolution of ferroelectric HfO2 in ultrathin region down to 3 nm" Appl. Phys. Lett. 112, 102902 (2018); https://doi.org/10.1063/1.5017094.

Fan, Z. et al., "Ferroelectric HfO2-based materials for next-generation ferroelectric memories" Journal of Advanced Dielectrics, vol. 6, No. 2 (2016) 1630003 (11 pages).

Notification of Transmittal of the International Search Report and the Written Opinion of the International Searching Authority for International Patent Application No. PCTUS2020/067428, mailed on Apr. 29, 2021, 11 pages.

(56)     References Cited

OTHER PUBLICATIONS https://technology.discousa.com/solution/sapphire-laser-lift-off/ visited Aug. 20, 2021.

Fichtner, S. et al., "Ferroelectricity in AlScN: Switching, Imprint and sub-150 nm Films," 2020 Joint Conference of the IEEE International Frequency Control Symposium and International Symposium on Applications of Ferroelectrics (IFCS-ISAF) https://arxiv.org/ftp/arxiv/papers/2010/2010.05705.pdf.

Fichtner, S. et al., "AlScN: A III-V semiconductor based Ferroelectric," J. Appl. Phys., vol. 125, No. 114103, (2019); https://doi.org/10.1063/1.5084945.

Max, B. et al., "Ferroelectric Tunnel Junctions based on Ferroelectric-Dielectric Hf0.5Zr0.5O2/Al2O3 Capacitor Stacks," Published in: *2018 48th European Solid-State Device Research Conference (ESSDERC)*; DOI: 10.1109/ESSDERC.2018.8486882.

Ryu, H.Y. et al., "A comparative study of efficiency droop and internal electric field for InGaN blue lighting-emitting diodes on silicon and sapphire substrates," Scientific Reports, vol. 7, (2017); DOI:10.1038/srep44814 Corpus ID: 256092.

Paisley, E. A. et al., "Spectroscopic investigations of band offsets of MgO|AlxGa1-xN epitaxial heterostructures with varying AlN content," Appl. Phys. Lett., vol. 107, No. 102101 (2015); https://doi.org/10.1063/1.4930309.

Yazawa, K. et al., "Reduced Coercive Field in Epitaxial Thin Film of Ferroelectric Wurtzite Al0.7Sc0.3N," Appl. Phys. Lett., vol. 118, No. 162903 (2021); https://doi.org/10.1063/5.0043613.

Yamada, N. et al., "Composition-Dependent Properties of Wurtzite-Type Mg1+xSn1-xN2 Epitaxially Grown on GaN(001) Templates," ACS Appl. Electron. Mater., vol. 3, pp. 1341-1349, (2021); https://pubs.acs.org/action/showCitFormats?doi=10.1021/acsaelm.0c01115&ref=pdf.

Hayden, J. et al., "Ferroelectricity in boron-substituted aluminum nitride thin films," Physical Review Materials, vol. 5, No. 044412, (2021); DOI: 10.1103/PhysRevMaterials.5.044412.

Pandey, A. et al., "High-efficiency AlGaN/GaN/AlGaN tunnel junction ultraviolet light-emitting diodes," Photonics Research, vol. 8, Issue 3, pp. 331-337, (2020); https://doi.org/10.1364/PRJ.383852.

Greenaway, A.L. et al., "Ternary Nitride Materials: Fundamentals and Emerging Device Applications," Annual Review of Materials Research, Vol. 51, pp. 591-618 (Volume publication date Jul. 2021), First published as a Review in Advance on May 12, 2021, https://doi.org/10.1146/annurev-matsci-080819-012444.

Uhrmann, T., "Advances in Heterogeneous Integration Through Wafer Bonding," Mar. 3, 2015, https://www.3dincites.com/2015/03/advances-heterogeneous-integration-wafer-bonding/.

Yakushiji, K. et al., "Fabrication of a reversal stacking of a magnetic tunnel junction by wafer bonding and thinning technique," Magnetics Society of Japan 2016 conference proceedings 6aA-7 (2016) p. 58, https://www.magnetics.jp/kouenkai/2016/doc/program/6aA-7.pdf.

Yakushiji, K. et al., "Further Technologies for STT-MRAM," Session C4, Proceeding of the 28th Magnetic Recording Conference (TMRC 2017), Aug. 2-4, 2017 Tsukuba, Japan. https://www.nims.go.jp/mmu/tmrc2017/att/C4.pdf.

U.S. Appl. No. 17/406,758, filed Aug. 19, 2021, SanDisk Technologies LLC.

USPTO Office Communication, Non-Final Office Action for U.S. Appl. No. 16/913,717, mailed Jun. 8, 2022, 31 pages.

USPTO Office Communication, Final Office Action for U.S. Appl. No. 17/406,758, mailed on Feb. 12, 2025, 16 pages.

Haoqi, T., "A review of semiconductor memory patent technology", Technology Innovation and Application, Issue 25, pp. 10-12, 2017 (English Abstract).

EPO Office Communication Pursuant to Article 94(3) EPC for European Patent Application No. 20942180.9, dated Aug. 7, 2025, 11 pages.

Slesazeck, S. et al., "Nanoscale Resistive Switching Memory Devices: A Review," Nanotechnology, vol. 30, pp. 1-23, (2019); https://doi.org/10.1088/1361-6528/ab2084.

CNIPA Office Communication, Notice of Allowance, for Chinese Patent Application No. 202080080467.5, mailed Nov. 3, 2025, 4 pages.

* cited by examiner

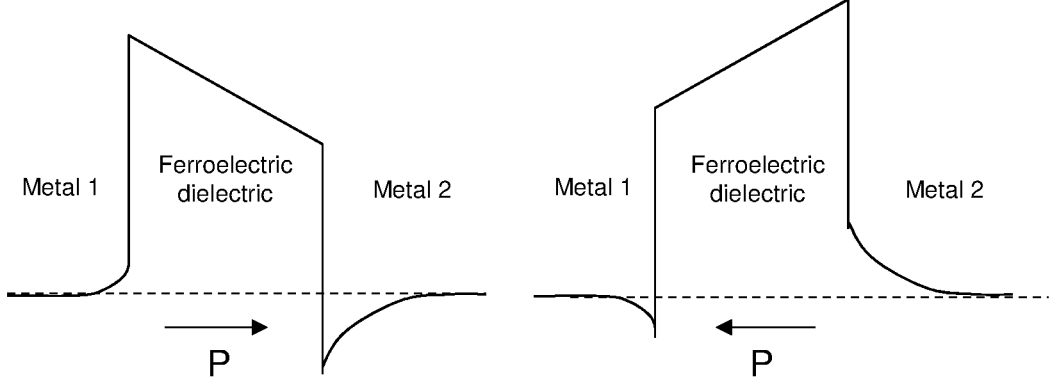
FIG. 21A                    FIG. 21B

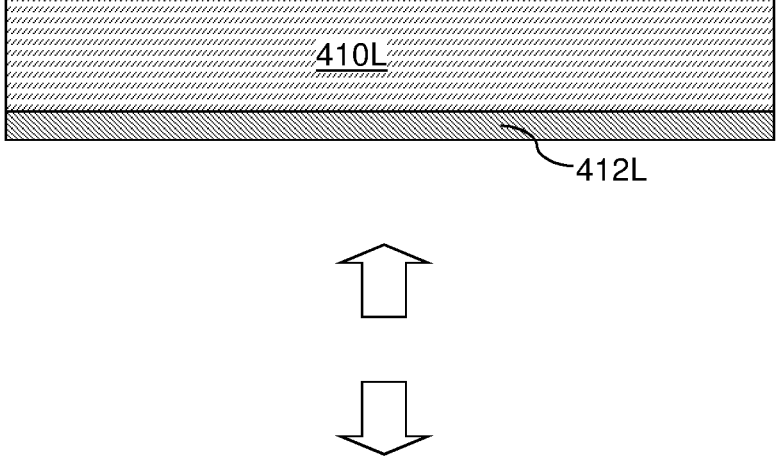
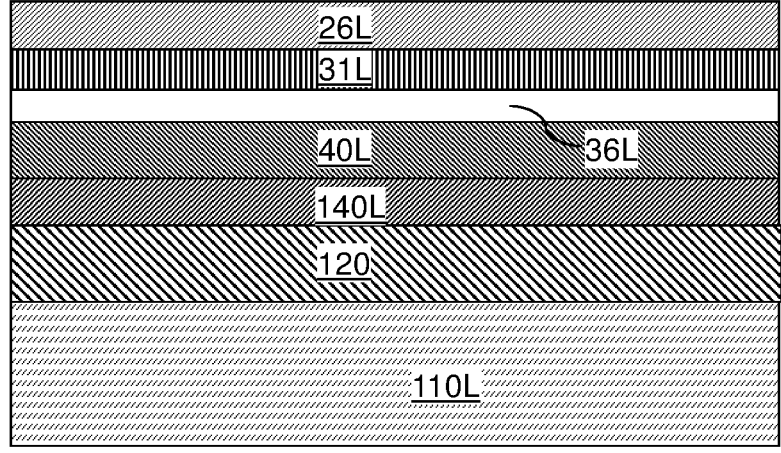
FIG. 59

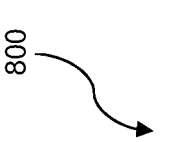
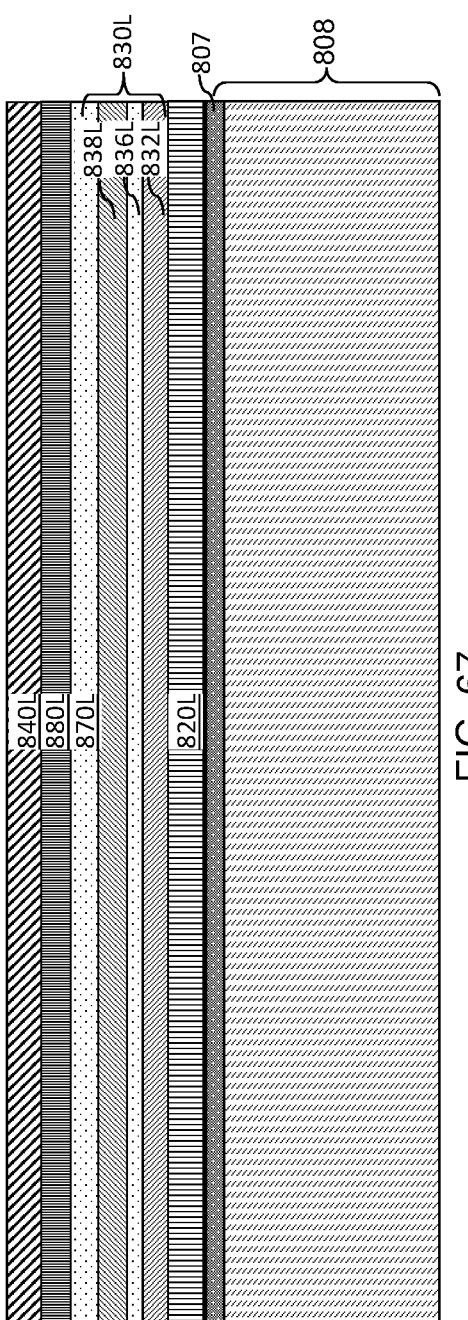
FIG. 67

BONDED MEMORY DEVICES AND METHODS OF MAKING THE SAME

RELATED APPLICATIONS

This application is a continuation-in-part (CIP) application of U.S. patent application Ser. No. 17/406,758 filed on Aug. 19, 2021, which is a CIP application of U.S. patent application Ser. No. 16/913,717 filed on Jun. 26, 2020, the entire contents of which are incorporated herein by reference.

FIELD

The present disclosure relates generally to the field of memory devices and specifically to bonded memory devices and methods of making the same.

BACKGROUND

A magnetoresistive memory device can store information employing the difference in electrical resistance of a first configuration in which a ferromagnetic free layer has a magnetization direction that is parallel to the magnetization of a ferromagnetic reference layer and a second configuration in which the free layer has a magnetization direction that is antiparallel to the magnetization of the reference layer. Programming of the magnetoresistive memory device requires flipping of the direction of the magnetization of the free layer employing an external power source.

SUMMARY

According to an aspect of the present disclosure, a memory device comprises a first electrically conductive line, a second electrically conductive line, and a memory pillar stack located between the first and the second electrically conductive lines. The memory pillar stack comprises a selector pillar structure bonded to a magnetic tunnel junction (MTJ) pillar structure. A bonding interface is located between the selector pillar structure and the MTJ pillar structure.

According to another aspect of the present disclosure, a method of forming a magnetoresistive random access memory (MRAM) device includes providing a first die containing a selector material layer located over a first substrate, providing a second die containing a MRAM layer stack located over a second substrate, and bonding the first die to the second die.

According to another aspect of the present disclosure, a memory system comprises data control circuits, data reading and writing circuits, data error correction circuits, a temperature monitoring circuit, and an array of non-volatile memory elements. Each non-volatile memory element comprises a combined magnetic tunnel junction (MTJ) and a selector device. A bonding interface is located between the MTJ and the selector device. In one embodiment, the selector device is laterally offset the MTJ, and an extent of the offset is less than a width of the MTJ.

BRIEF DESCRIPTION OF THE DRAWINGS

FIGS. 21A and 21B are schematic diagrams of electrostatic potential energy band profiles of ferroelectric tunnel junction devices of the first and second embodiments of the present disclosure.

FIG. 59 is a vertical cross-sectional view of the sixth exemplary structure after detaching the first substrate by laser irradiation according to the sixth embodiment of the present disclosure.

FIG. 67 is a vertical cross-sectional view of a second substrate after formation of a continuous magnetic tunnel junction layer stack and a junction-side bonding material layer according to the seventh embodiment of the present disclosure.

DETAILED DESCRIPTION

Figure 1A:
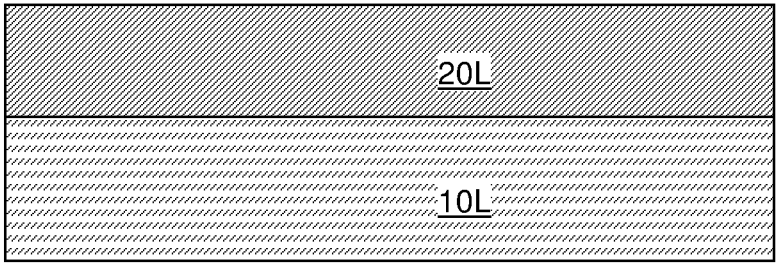
FIG. 1A is a vertical cross-sectional view of a first substrate after formation of a single crystalline semiconductor layer thereupon according to a first embodiment of the present disclosure.

Embodiments of the present disclosure provide bonded memory devices and methods of making thereof by bonding different portions of the same memory cell to each other.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. The term "at least one" element refers to all possibilities including the possibility of a single element and the possibility of multiple elements.

The same reference numerals refer to the same element or similar element. Unless otherwise indicated, elements having the same reference numerals are presumed to have the same composition and the same function. Unless otherwise indicated, a "contact" between elements refers to a direct contact between elements that provides an edge or a surface shared by the elements. If two or more elements are not in direct contact with each other or among one another, the two elements are "disjoined from" each other or "disjoined among" one another. As used herein, a first element located "on" a second element can be located on the exterior side of a surface of the second element or on the interior side of the second element. As used herein, a first element is located "directly on" a second element if there exist a physical contact between a surface of the first element and a surface of the second element. As used herein, a first element is "electrically connected to" a second element if there exists a conductive path consisting of at least one conductive material between the first element and the second element. As used herein, a "prototype" structure or an "in-process" structure refers to a transient structure that is subsequently modified in the shape or composition of at least one component therein.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

As used herein, a first surface and a second surface are "vertically coincident" with each other if the second surface overlies or underlies the first surface and there exists a vertical plane or a substantially vertical plane that includes the first surface and the second surface. A substantially vertical plane is a plane that extends straight along a direction that deviates from a vertical direction by an angle less than 5 degrees. A vertical plane or a substantially vertical plane is straight along a vertical direction or a substantially vertical direction, and may, or may not, include a curvature along a direction that is perpendicular to the vertical direction or the substantially vertical direction.

As used herein, a "memory level" or a "memory array level" refers to the level corresponding to a general region between a first horizontal plane (i.e., a plane parallel to the top surface of the substrate) including topmost surfaces of an array of memory elements and a second horizontal plane including bottommost surfaces of the array of memory elements. As used herein, a "through-stack" element refers to an element that vertically extends through a memory level.

A ferroelectric material refers to a material that displays spontaneous polarization of electrical charges in the absence of an applied electric field. The net polarization P of electrical charges within the ferroelectric material is non-zero in the minimum energy state. Thus, spontaneous ferroelectric polarization of the material occurs, and the ferroelectric material accumulates surfaces charges of opposite polarity types on two opposing surfaces. Polarization P of a ferroelectric material as a function of an applied voltage V thereacross displays hysteresis. The product of the remanent polarization and the coercive field of a ferroelectric material is a metric for characterizing effectiveness of the ferroelectric material. A ferroelectric memory device is a memory device containing the ferroelectric material which is used to store information. The ferroelectric material acts as the memory material of the memory device. The dipole moment of the ferroelectric material is programmed in two different orientations (e.g., "up" or "down" polarization positions based on atom positions, such as oxygen and/or metal atom positions, in the crystal lattice) depending on the polarity of the applied electric field to the ferroelectric material to store information in the ferroelectric material. The different orientations of the dipole moment of the ferroelectric material may be detected by the electric field generated by the dipole moment of the ferroelectric material.

Ferroelectric properties of a ferroelectric material depend on stabilizing a particular crystalline phase of the ferroelectric material. For example, hafnium oxide based layers exhibit ferroelectricity only in an orthorhombic phase (e.g., a non-centrosymmetric orthorhombic phase). The first and second embodiments of the present disclosure are directed to a memory device including crystalline ferroelectric memory elements and methods of making the same, the various aspects of which are described below. The crystalline layers of the memory device stabilize the ferroelectric crystallographic phase of the ferroelectric material to provide a high-performance ferroelectric device. In one embodiment, the crystalline ferroelectric material comprises a relatively thin, epitaxial hafnium oxide based layer in the orthorhombic phase. The hafnium oxide based layer is epitaxially grown on a germanium based buffer layer. After growth, the epitaxial hafnium oxide based layer is transferred to another substrate by wafer bonding and layer transfer methods.

Referring to FIG. 1A, a first exemplary structure according to a first embodiment of the present disclosure includes a first substrate 10L. The first substrate 10L which can be a single crystalline substrate on which a single crystalline semiconductor material can be subsequently grown. For example, the first substrate 10L may be a commercially available single crystalline silicon wafer. A single crystalline semiconductor layer 20L can be formed upon a top surface of the first substrate 10L by an epitaxial semiconductor deposition process. The single crystalline semiconductor layer 20L can include a germanium-containing single crystalline semiconductor material. For example, the single crystalline semiconductor layer 20L can include germanium or a silicon-germanium alloy. In one embodiment, the single crystalline semiconductor layer 20L may include germanium at an atomic percentage in a range from 50% to 100%. The single crystalline semiconductor layer 20L can be formed by performing an epitaxial semiconductor deposition process. In one embodiment, the bottom portion of the single crystalline semiconductor layer 20L may have a vertically graded material composition such that the atomic concentration of germanium increases with a distance from the top surface of the first substrate 10L. In one embodiment, the top portion of the single crystalline semiconductor layer 20L may include germanium at an atomic percentage in a range from 50% to 100%, such as from 80% to 90%. In one embodiment, the top portion of the single crystalline semiconductor layer 20L may include germanium at an atomic percentage of 100%. The thickness of the single crystalline semiconductor layer 20L may be in a range from 50 nm to 600 nm, such as from 100 nm to 300 nm, although lesser and greater thicknesses may also be employed.

Figure 1B:
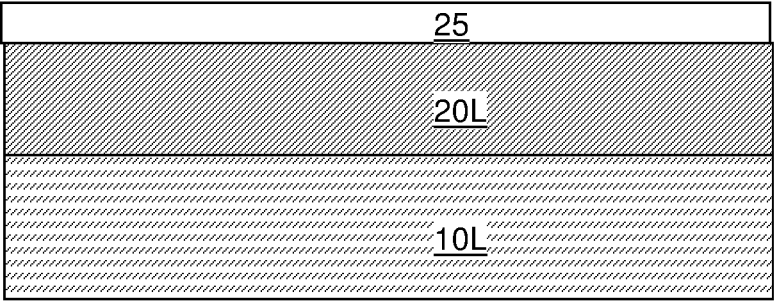
FIG. 1B is a vertical cross-sectional view of an assembly including the first substrate after formation of a semiconductor oxide layer thereupon according to the first embodiment of the present disclosure.

Referring FIG. 1B, an optional semiconductor oxide layer 25 can be formed on the top surface of the single crystalline semiconductor layer 20L. In one embodiment, the semiconductor oxide layer 25 may be formed by oxidation of a surface portion of the single crystalline semiconductor layer 20L. In one embodiment, the semiconductor oxide layer 25 may include germanium oxide, silicon oxide, or a silicon-germanium oxide. The thickness of the semiconductor oxide layer 25 can be in a range from 5 nm to 50 nm, such as from 10 nm to 30 nm, although lesser and greater thicknesses may also be employed.

Figure 1C:
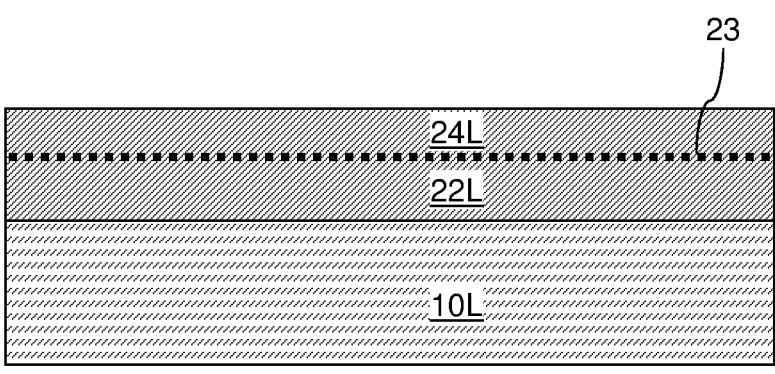
FIG. 1C is a vertical cross-sectional view of the assembly including the first substrate after formation of a hydrogen implanted layer and removal of the semiconductor oxide layer according to the first embodiment of the present disclosure.

Referring to FIG. 1C, hydrogen or deuterium atoms can be implanted through the semiconductor oxide layer 25 into the single crystalline semiconductor layer 20L to form an implanted layer (i.e., hydrogen or deuterium implanted region) 23. The single crystalline semiconductor layer 20L is divided into a proximal single crystalline semiconductor layer 22L and a distal single crystalline semiconductor layer 24L. The thickness of the proximal single crystalline semiconductor layer 22L may be in a range from 25 nm to 300 nm, such as from 50 nm to 150 nm, although lesser and greater thicknesses may also be employed. The thickness of the distal single crystalline semiconductor layer 24L may be in a range from 25 nm to 300 nm, such as from 50 nm to 150 nm, although lesser and greater thicknesses may also be employed. In one embodiment, the distal single crystalline semiconductor layer 24L may comprise, and/or may consist essentially of, germanium or a silicon-germanium alloy including germanium at an atomic percentage in a range from 50% to 100%. The semiconductor oxide layer 25 can be removed, for example, by a selective wet etch process. A suitable surface clean process may be performed on a physically exposed top surface of the distal single crystalline semiconductor layer 24L.

Figure 1D:
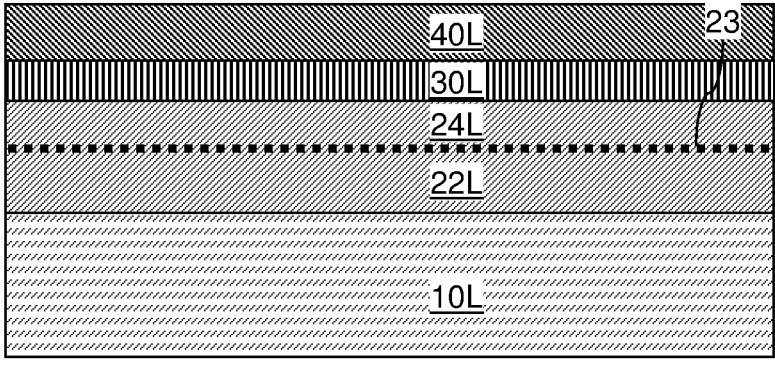
FIG. 1D is a vertical cross-sectional view of the assembly including the first substrate after formation of a single crystalline ferroelectric material layer and a first metallic material layer according to the first embodiment of the present disclosure.

Referring to FIG. 1D, a memory material layer, such as a single crystalline ferroelectric material layer 30L can be epitaxially grown on the top surface of the distal single crystalline semiconductor layer 24L. The single crystalline ferroelectric material layer 30L includes a single crystalline ferroelectric material that is epitaxially aligned to the single crystalline semiconductor material of the distal single crystalline semiconductor layer 24L.

In one embodiment, the single crystalline ferroelectric material layer 30L can include a transition metal oxide material. In one embodiment, the transition metal oxide material comprises a hafnium oxide based material, which comprises doped or undoped hafnium oxide. In an illustrative example, the single crystalline ferroelectric material layer 30L may include single crystalline hafnium oxide doped with zirconium (also referred to as hafnium-zirconium oxide), silicon, strontium. aluminum, yttrium, germanium and/or gadolinium.

In another embodiment, the transition metal oxide material comprises a perovskite material, such as barium titanate (such as $BaTiO_3$; BT), europium barium titanate, lead scandium tantalate (such as $Pb(Sc_xTa_{1-x})O_3$), lead titanate (such as $PbTiO_3$; PT), lead zirconate titanate (such as Pb (Zr,Ti)$O_3$; PZT), lithium niobate (such as $LiNbO_3$; LN), ($LaAlO_3$)), potassium niobate (such as $KNbO_3$), sodium bismuth titanate (such as $Na_{0.5}Bi_{0.5}TiO_3$), lithium tantalate (such as $LiTaO_3$ (LT)), lead lanthanum titanate (such as (Pb,La)$TiO_3$ (PLT)), or lead lanthanum zirconate titanate (such as (Pb,La)(Zr,Ti)$O_3$ (PLZT)). In case of perovskite materials, layers of strontium titanate ($SrTiO_3$) or strontium ruthenate ($SrRuO_3$) may be used as the distal crystalline layer 24L.

The single crystalline ferroelectric material layer 30L may be epitaxially grown by atomic layer deposition or another suitable method. The dopants may be introduced in-situ or ex-situ (for example, by ion implantation). The thickness of the single crystalline ferroelectric material layer 30L may be in a range from 2 nm to 30 nm, such as from 5 nm to 15 nm, for example about 10 nm, although lesser and greater thicknesses may also be employed. A thermal anneal can be performed to improve crystallinity of the material of the single crystalline ferroelectric material layer 30L and to enhance ferroelectric properties (such as magnitude of electrical polarization) of the ferroelectric material of the single crystalline ferroelectric material layer 30L. For example, layer 30L may be a hafnium oxide based ferroelectric layer having the ferroelectric non-centrosymmetric orthorhombic phase after the anneal.

A first metallic material layer 40L can be formed by deposition of a first metallic material on the top surface of the single crystalline ferroelectric material layer 30L. The first metallic material layer 40L may include an elemental metal, such as W, Mo or Ru, and/or a conductive metallic compound material, such as MoN, TiN, TaN, or WN. The first metallic material layer 40L can be formed by chemical vapor deposition or by physical vapor deposition. The first metallic material layer 40L can have a thickness in a range from 5 nm to 50 nm, such as from 10 nm to 25 nm, although lesser and greater thicknesses may also be employed.

Figure 2A:
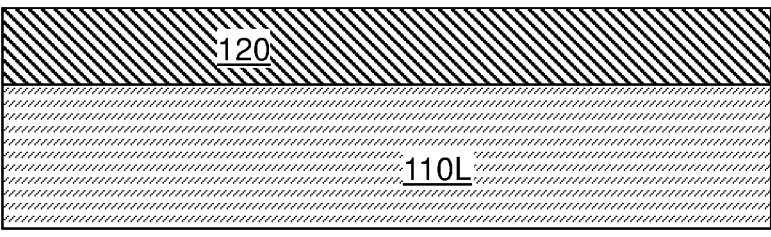
FIG. 2A is a vertical cross-sectional view along plane A-A' in FIG. 2B of a second substrate after formation of first electrically conductive lines laterally spaced by first dielectric rails thereupon according to the first embodiment of the present disclosure.

Referring to FIG. 2A, a second substrate 110L can be provided. The second substrate 110L may include an insulating material layer at a topmost portion thereof. In one embodiment, the second substrate 110L may include a semiconductor substrate such as a silicon wafer, and semiconductor devices (not expressly shown) such as field effect transistors that are formed on the semiconductor substrate. Dielectric material layers (not expressly shown) embedding metal interconnect structures (not expressly shown) can be formed over the semiconductor devices. The metal interconnect structures can provide electrical interconnection among the various nodes of the semiconductor devices.

A dielectric material layer can be deposited over the second substrate 110L. The dielectric material layer includes a dielectric material such as silicon oxide, and can be formed by chemical vapor deposition. The thickness of the dielectric material layer may be in a range from 50 nm to 500 nm, although lesser and greater thicknesses can also be employed. A photoresist layer (not shown) can be applied over the dielectric material layer, and can be lithographically patterned to form a line and space pattern. Elongated openings laterally extending along a first horizontal direction hd1 and laterally spaced apart among one another along a second horizontal direction hd2 can be formed in the photoresist layer. The width of each opening along the second horizontal direction hd2 can be in a range from 10 nm to 50 nm, such as 15 nm to 25 nm, although lesser and greater widths can also be employed. The pitch of the line and space pattern may be in a range from 20 nm to 100 nm, such as from 30 nm to 50 nm, although lesser and greater pitches may also be employed. The pattern in the photoresist layer can be transferred through the dielectric material layer by an anisotropic etch process. The photoresist layer can be employed as an etch mask during the anisotropic etch process. First line trenches can be formed through the dielectric material layer. The photoresist layer can be subsequently removed, for example, by ashing. Remaining portions of the dielectric material layer comprise first dielectric rails 122.

An optional metallic liner layer including a metallic barrier material can be deposited in the first line trenches and over the first dielectric rails 122. The metallic liner layer can include a conductive metallic barrier material such as a conductive metallic nitride material (e.g., TiN, TaN, and/or WN) and/or a conductive metallic carbide material (e.g., TiC, TaC, and/or WC). The metallic liner layer can be deposited by chemical vapor deposition or physical vapor deposition. A metallic fill material layer can be deposited over the metallic liner layer. The metallic fill material layer includes a metallic material having high electrical resistivity. For example, the metallic fill material layer can include copper, tungsten, titanium, tantalum, molybdenum, ruthenium, cobalt, or a combination thereof.

Excess portions of the metallic fill material layer and the metallic liner layer can be removed from above the horizontal plane including the top surface of the first dielectric rails. Each remaining portion of the metallic fill material layer comprises a first metallic fill material portion. Each remaining portion of the metallic liner layer comprises a first metallic liner. Each contiguous combination of a first metallic liner and a first metallic fill material portion constitutes a first electrically conductive line 120. The first electrically conductive lines 120 laterally extend along the first horizontal direction hd1, and are laterally spaced apart along the second horizontal direction hd2. Generally, first electrically conductive lines 120 laterally spaced by first dielectric rails 122 are formed over the second substrate 110L.

Alternatively, the first electrically conductive lines 120 may be formed first by depositing one or more electrically conductive layers over the second substrate 110L, followed by patterning the one or more electrically conductive layers by reactive ion etching (RIE) to form the lines 120. The first dielectric rails 122 are then formed between the first electrically conductive lines 120 by depositing the dielectric material layer between the first electrically conductive lines 120 and planarizing the dielectric material layer.

Figure 3:
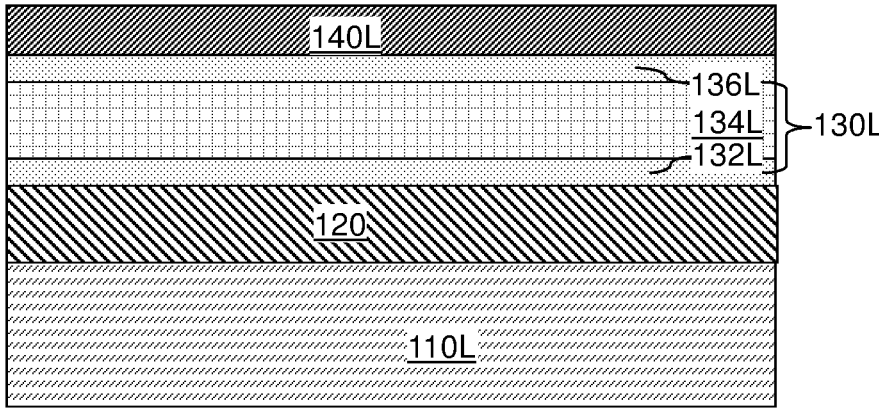
FIG. 3 is a vertical cross-sectional view of an assembly including the second substrate after formation of a lower electrode layer, a selector material layer, an upper electrode layer, and a second metallic material layer thereupon according to the first embodiment of the present disclosure.

Referring to FIG. 3, a layer stack comprising a selector material layer 134L and a second metallic material layer 140L can be formed over the first electrically conductive lines 120. In one embodiment, the layer stack can include, from bottom to top, a lower electrode layer 132L, the selector material layer 134L, an upper electrode layer 136L, and the second metallic material layer 140L. The combination of the lower electrode layer 132L, the selector material layer 134L, and the upper electrode layer 136L is herein referred to as selector-level layers 130L.

Each of the lower electrode layer 132L and the upper electrode layer 136L includes at least one electrically conductive material. The at least one electrically conductive material may include a non-metallic conductive material. Exemplary non-metallic conductive materials that can be employed for the lower electrode layer 132L and the upper electrode layer 136L include amorphous carbon, amorphous boron-doped carbon, amorphous nitrogen-doped carbon, amorphous silicon, amorphous germanium, alloys or mixtures thereof, and layer stacks thereof. Each of the lower electrode layer 132L and the upper electrode layer 136L may be free of transition metal elements.

Each of the lower electrode layer 132L and the upper electrode layer 136L may be deposited by chemical vapor deposition, physical vapor deposition, or atomic layer deposition. Each of the lower electrode layer 132L and the upper electrode layer 136L can have a respective thickness in a range from 0.5 nm to 10 nm, such as from 1 nm to 5 nm, although lesser and greater thicknesses may also be employed.

The selector material layer 134L includes a material that can function as a voltage-dependent switch. Generally, the selector material layer 134L can include any suitable threshold switch material which exhibits non-linear electrical behavior, such as an ovonic threshold switch material or a diode threshold switch material (e.g., materials for p-n semiconductor diode, p-i-n semiconductor diode, Schottky diode or metal-insulator-metal diode). In one embodiment, the selector material layer 134L includes an ovonic threshold switch material.

As used herein, an ovonic threshold switch (OTS) is a device that does not crystallize in a low resistance state under a voltage above the threshold voltage, and reverts back to a high resistance state when not subjected to a voltage above the threshold voltage across the OTS material layer. As used herein, an "ovonic threshold switch material" refers to a material that displays a non-linear resistivity curve under an applied external bias voltage such that the resistivity of the material decreases with the magnitude of the applied external bias voltage. In other words, an ovonic threshold switch material is non-Ohmic, and becomes more conductive under a higher external bias voltage than under a lower external bias voltage.

An ovonic threshold switch material (OTS material) can be non-crystalline (for example, amorphous) in a high resistance state, and can remain non-crystalline (for example, remain amorphous) in a low resistance state during application of a voltage above its threshold voltage across the OTS material. The OTS material can revert back to the high resistance state when the high voltage above its threshold voltage is removed. Throughout the resistive state changes, the ovonic threshold switch material can remain non-crystalline (e.g., amorphous). In one embodiment, the ovonic threshold switch material can comprise layer a chalcogenide material which exhibits hysteresis in both the write and read states. The chalcogenide material may be a GeTe compound or a Ge—Se compound doped with a dopant selected from As, N, and C, such as a Ge—Se—As compound semiconductor material. The ovonic threshold switch material layer can include a selector material layer 134L which contains any ovonic threshold switch material. In one embodiment, the selector material layer 134L can include, and/or can consist essentially of, a GeSeAs alloy, a GeSe alloy, a SeAs alloy, a GeTe alloy, or a SiTe alloy.

In one embodiment, the material of the selector material layer 134L can be selected such that the resistivity of the selector material layer 134L decreases at least by two orders of magnitude (i.e., by more than a factor of 100) upon application of an external bias voltage that exceeds a critical bias voltage magnitude (also referred to as threshold voltage). In one embodiment, the composition and the thickness of the selector material layer 134L can be selected such that the critical bias voltage magnitude can be in a range from 1 V to 4 V, although lesser and greater voltages can also be employed for the critical bias voltage magnitude. The thickness of the selector material layer 134L can be, for example, in a range from 5 nm to 40 nm, such as 10 nm to 20 nm, although lesser and greater thicknesses can also be employed.

The second metallic material layer 140L can be formed by deposition of a second metallic material on the top surface of the selector-level layers 130L. The second metallic material layer 140L may include an elemental metal (such as W, Cu or Ru) and/or a conductive metallic compound material such as (TiN, TaN, or WN). The second metallic material layer 140L can be formed by chemical vapor deposition or by physical vapor deposition. The second metallic material layer 140L can have a thickness in a range from 5 nm to 50 nm, such as from 10 nm to 25 nm, although lesser and greater thicknesses may also be employed. Generally, the materials of the first metallic material layer 40L and the second metallic material layer 140L can be selected such that the first metallic material layer 40L and the second metallic material layer 140L can be subsequently bonded to each other. The material of the second metallic material layer 140L may be the same as, or may be different from, the material of the first metallic material layer 40L.

Figure 4:
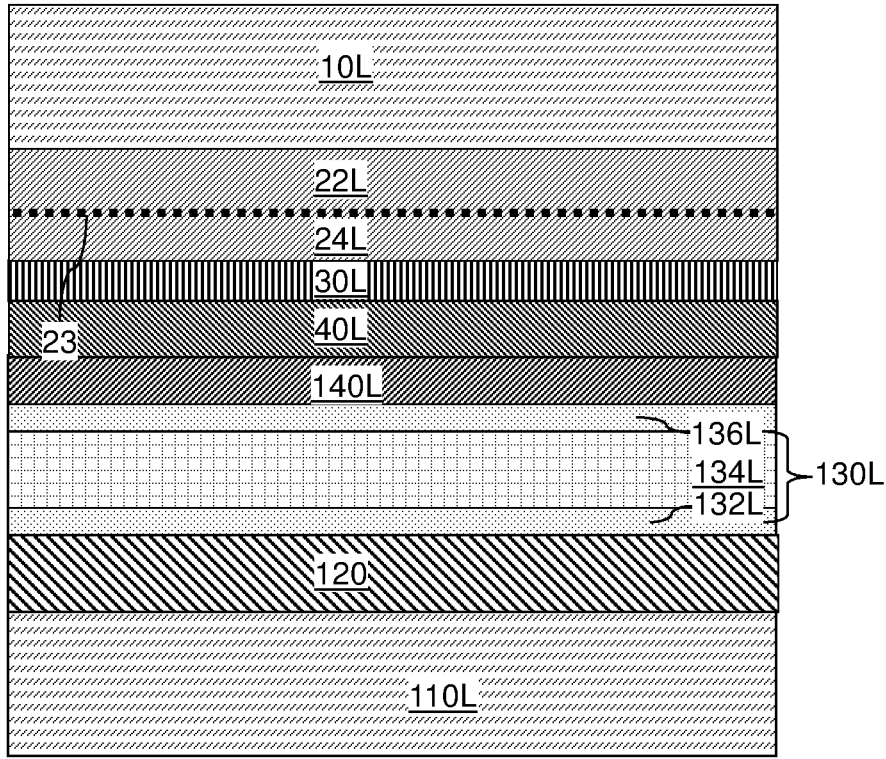
FIG. 4 is a vertical cross-sectional view of a first exemplary structure after bonding the second metallic material layer to the first metallic material layer according to the first embodiment of the present disclosure.

Referring to FIG. 4, the structure of FIG. 3 and the structure of FIG. 1D can be positioned such that the second metallic material layer 140L contacts the first metallic material layer 40L. A first thermal anneal process is performed to bond the second metallic material layer 140L to the first metallic material layer 40L. The temperature of the first thermal anneal process can be in a range from 200 degrees Celsius to 500 degrees Celsius, such as from 250 degrees Celsius to 400 degrees Celsius. The temperature of the first thermal anneal process may be limited by the thermal stability of the ferroelectric material of the single crystalline ferroelectric material layer 30L and the thermal stability of the implanted layer 23. Alternatively, the second metallic material layer 140L may be omitted, and metal-hybrid bonding can be used instead.

Figure 5:
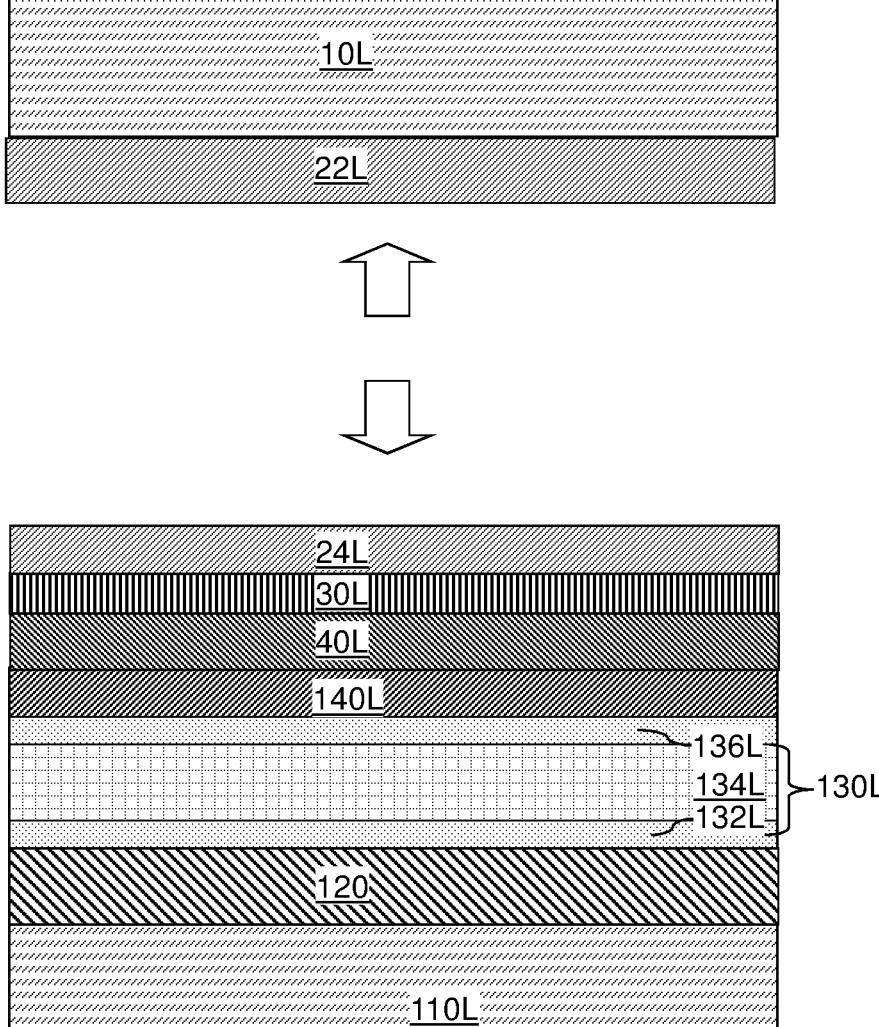
FIG. 5 is a vertical cross-sectional view of the first exemplary structure after removing an assembly of the first substrate and a proximal single crystalline semiconductor sublayer by cleaving the single crystalline semiconductor layer at the hydrogen implanted layer according to the first embodiment of the present disclosure.

Referring to FIG. 5, the single crystalline semiconductor layer 20L (i.e., 22L, 24L) can be cleaved (i.e., separated) at the hydrogen or deuterium implanted layer 23. A second thermal anneal process can be performed to induce bubbling of hydrogen or deuterium atoms in the hydrogen implanted layer 23. For example, the temperature of the second thermal anneal process may be in a range from 500 degrees Celsius to 700 degrees Celsius. The assembly of the first substrate 10L and the proximal single crystalline semiconductor layer 22L can be detached from the assembly including the second substrate 110L, the first electrically conductive lines 120 and the first dielectric rails 122, the selector-level layers 130L, the second metallic material layer 140L, the first metallic material layer 40L, the single crystalline ferroelectric material layer 30L, and the distal single crystalline semiconductor layer 24L (which is hereafter referred to as a single crystalline semiconductor layer 24L).

Figure 6:
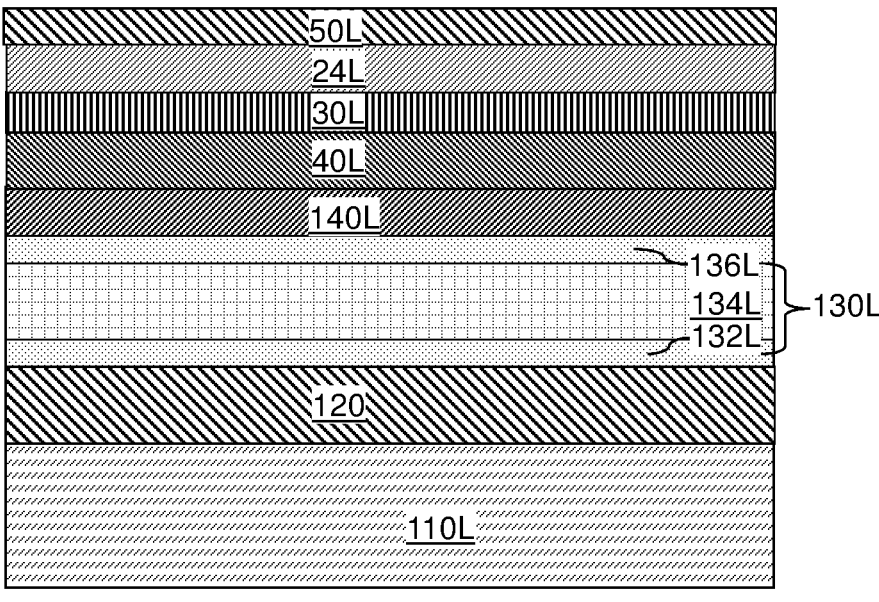
FIG. 6 is a vertical cross-sectional view of the first exemplary structure after formation of a metallic cap layer according to the first embodiment of the present disclosure.
Figure 10A:
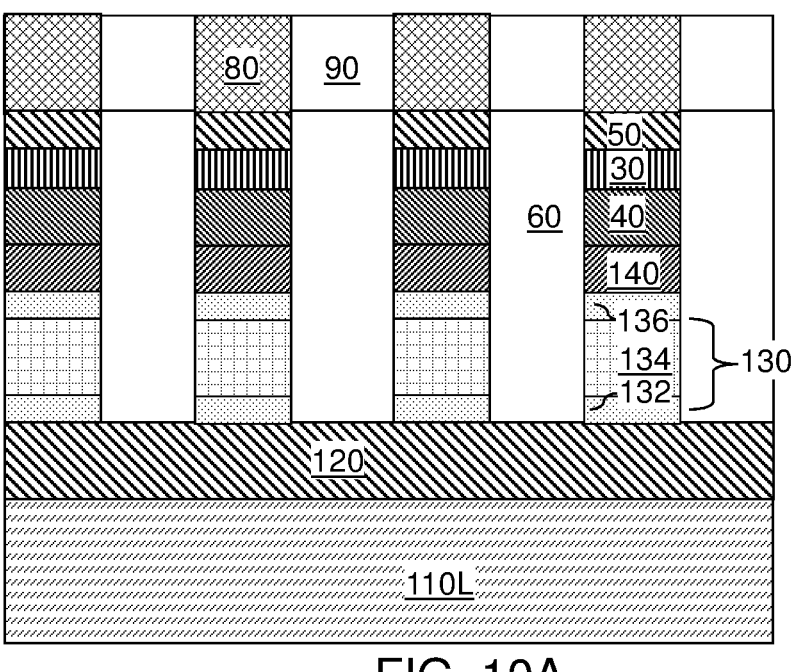
FIG. 10A is a vertical cross-sectional view along plane A-A' in FIG. 10B of an alternative configuration of the first exemplary structure after formation of second electrically conductive lines laterally spaced by second dielectric rails according to the first embodiment of the present disclosure.
Figure 10B:
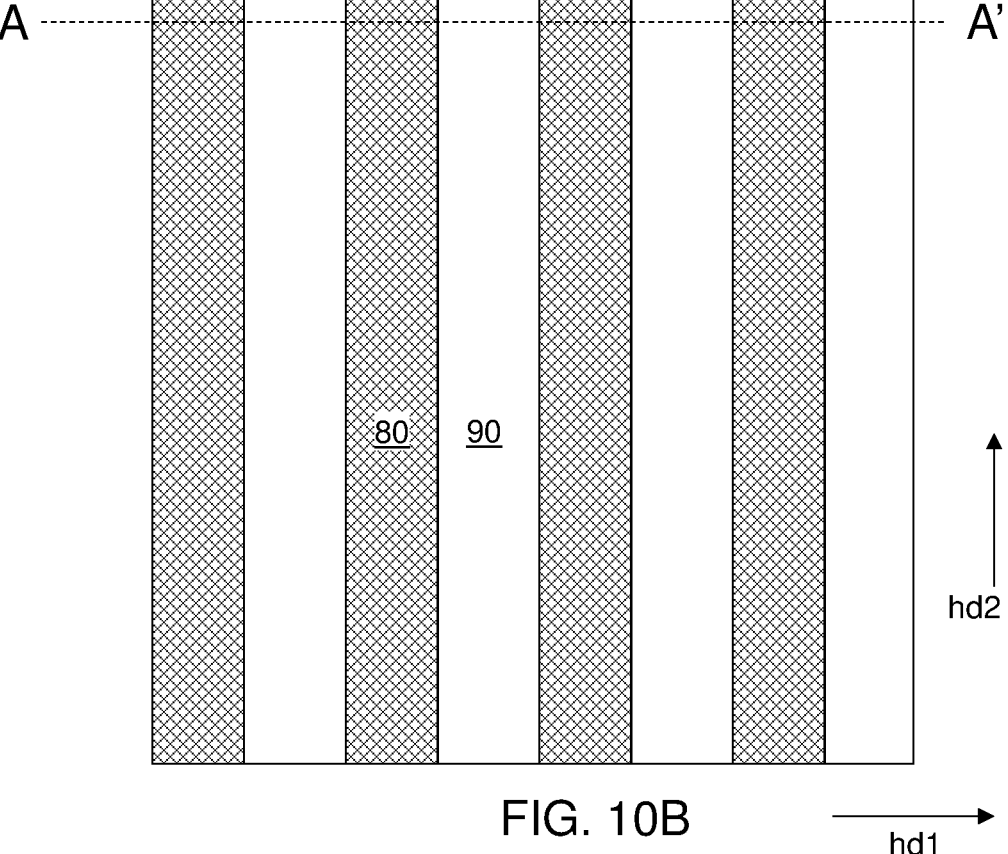
FIG. 10B is a top-down view of the first exemplary structure of FIG. 10A.

If desired, the single crystalline semiconductor layer 24L may be removed by selective etching to expose the single crystalline ferroelectric material layer 30L. Alternatively, the single crystalline semiconductor layer 24L may be retained either partially or completely as part of an electrode of a ferroelectric tunnel junction memory device. Referring to FIG. 6, a metallic cap layer 50L can be optionally deposited on the top surface of the single crystalline semiconductor layer 24L (if layer 24L is retained). If layer 24L is removed, then the metallic cap layer 50L can be optionally deposited on the top surface of the single crystalline ferroelectric material layer 30L, such that the device shown in FIGS. 10A and 10B is formed after the steps shown in FIGS. 7 to 8B and described below.

The metallic cap layer 50L comprises, and/or consists essentially of, a material selected from an elemental metal, an intermetallic alloy, a conductive metallic nitride material, a conductive metallic carbide material, and a conductive carbon-based material. Exemplary elemental metals that can be employed for the metallic cap layer 50L include transition metals. Exemplary conductive metallic nitride materials include TiN, TaN, MoN and WN. Exemplary conductive metallic carbide materials include TiC, TaC, and WC. Conductive carbon-based materials include amorphous carbon or diamond-like carbon doped with suitable dopant atoms such as nitrogen to increase the electrical conductivity. For example, the metallic cap layer 50L can consist essentially of W, TiN, TaN, MoN or WN. The metallic cap layer 50L can be formed by physical vapor deposition or chemical vapor deposition. The thickness of the metallic cap layer 50L can be in a range from 10 nm to 80 nm, such as from 20 nm to 50 nm, and/or from 30 nm to 40 nm, although lesser and greater thicknesses can also be employed.

Figure 7:
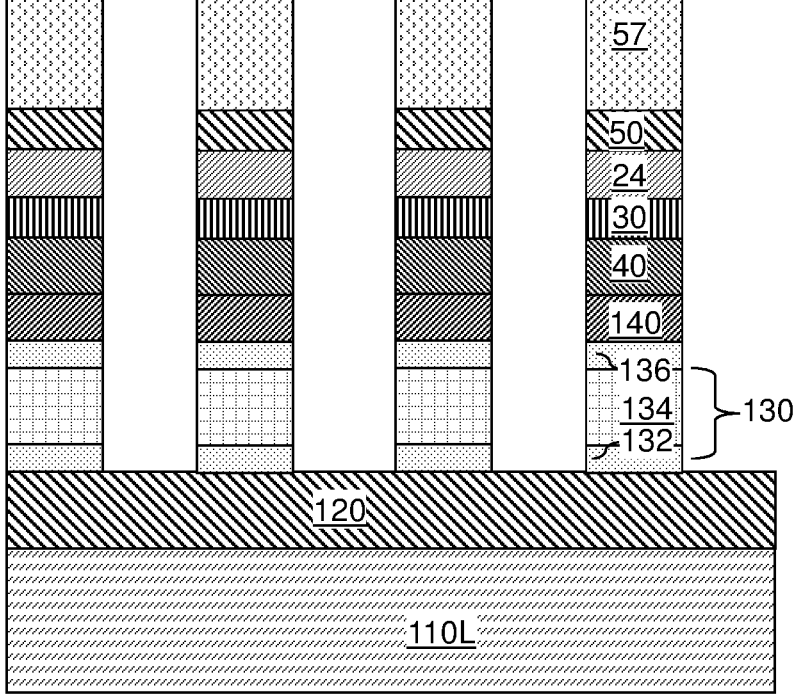
FIG. 7 is a vertical cross-sectional view of the first exemplary structure after formation of an array of memory pillar structures according to the first embodiment of the present disclosure.

Referring to FIG. 7, a photoresist layer can be applied over the metallic cap layer 50L, and can be lithographically patterned to form a two-dimensional array of discrete photoresist material portions 57. In one embodiment, the two-dimensional array of discrete photoresist material portions 57 can be formed as a two-dimensional periodic rectangular array. In one embodiment, the two-dimensional array of discrete photoresist material portions 57 may have a pitch along the second horizontal direction hd2 that is the same as the pitch of the first electrically conductive lines 120 along the second horizontal direction, and may have a pitch along the first horizontal direction hd1 that is the same as the pitch along the first horizontal direction hd1 of second electrically conductive lines to be subsequently formed.

An anisotropic etch process can be performed to transfer the pattern in the two-dimensional array of discrete photoresist material portions 57 through the layer stack including the metallic cap layer 50L, the distal single crystalline semiconductor layer 24L (if present), the single crystalline ferroelectric material layer 30L, the first metallic material layer 40L, the second metallic material layer 140L, and the selector-level layers 130L. Each patterned portion of the layer stack of the metallic cap layer 50L, the distal single crystalline semiconductor layer 24L, the single crystalline ferroelectric material layer 30L, the first metallic material layer 40L, the second metallic material layer 140L, and the selector-level layers 130L comprises a memory pillar structure (130, 140, 40, 30, 24, 50). Generally, at least one memory pillar structure (130, 140, 40, 30, 24, 50) can be formed by patterning the layer stack comprising the metallic cap layer 50L, the distal single crystalline semiconductor layer 24L, the single crystalline ferroelectric material layer 30L, the first metallic material layer 40L, the second metallic material layer 140L, and the selector-level layers 130L. In one embodiment, a two-dimensional periodic rectangular array of memory pillar structures (130, 140, 40, 30, 24, 50) can be formed.

Each memory pillar structure (130, 140, 40, 30, 24, 50) can include, from bottom to top, a selector element 130, a second metallic material plate 140, a first metallic material plate 40, a single crystalline ferroelectric material plate 30, an optional single crystalline semiconductor plate 24, and a metallic cap plate 50. Each selector element 130 is a patterned portion of the selector-level layers 130L. Each selector element 130 may include, from bottom to top, a lower electrode plate 132, a selector material plate 134, and an upper electrode plate 136. Each second metallic material plate 140 is a patterned portion of the second metallic material layer 140L. Each first metallic material plate 40 is a patterned portion of the first metallic material layer 40L. Each single crystalline ferroelectric material plate 30 is a patterned portion of the single crystalline ferroelectric material layer 30L. Each single crystalline semiconductor plate 24 (if present) is a patterned portion of the single crystalline semiconductor layer 24L. Each metallic cap plate 50 is a patterned portion of the metallic cap layer 50L.

Each memory pillar structure (130, 140, 40, 30, 24, 50) can have at least one sidewall that extends from the top surface of the respective memory pillar structure (130, 140, 40, 30, 24, 50) to the bottom surface of the memory pillar structure (130, 140, 40, 30, 24, 50). Each sidewall may be vertical, substantially vertical, or may have a taper angle in a range from 1 degree to 15 degrees. The discrete photoresist material portions 57 can be subsequently removed, for example, by ashing. The memory pillar structures (130, 140, 40, 30, 24, 50) can have horizontal cross-sectional shapes of a rectangle, a rounded rectangle, a circle, an ellipse, or any generally curvilinear two-dimensional closed shape.

Figure 8A:
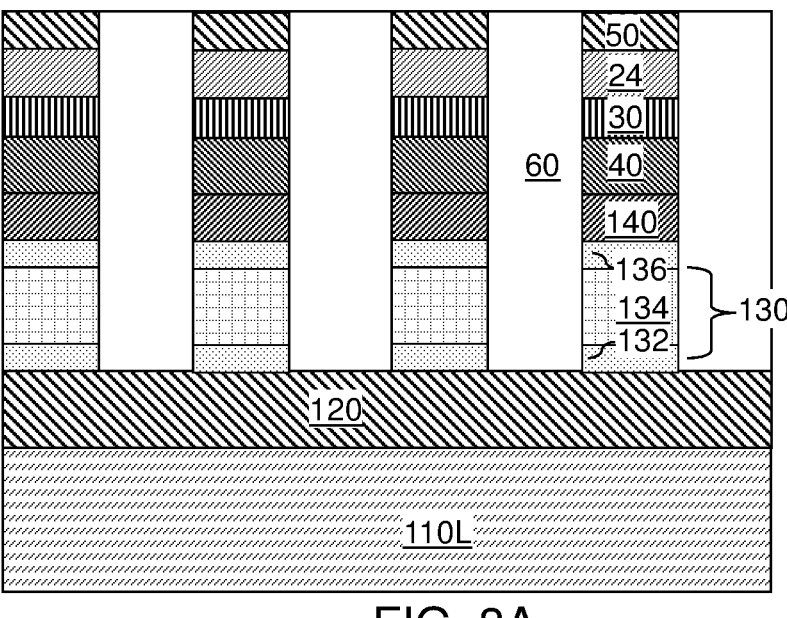
FIG. 8A is a vertical cross-sectional view along plane A-A' in FIG. 8B of the first exemplary structure after formation of a dielectric isolation structure according to the first embodiment of the present disclosure.
Figure 8B:
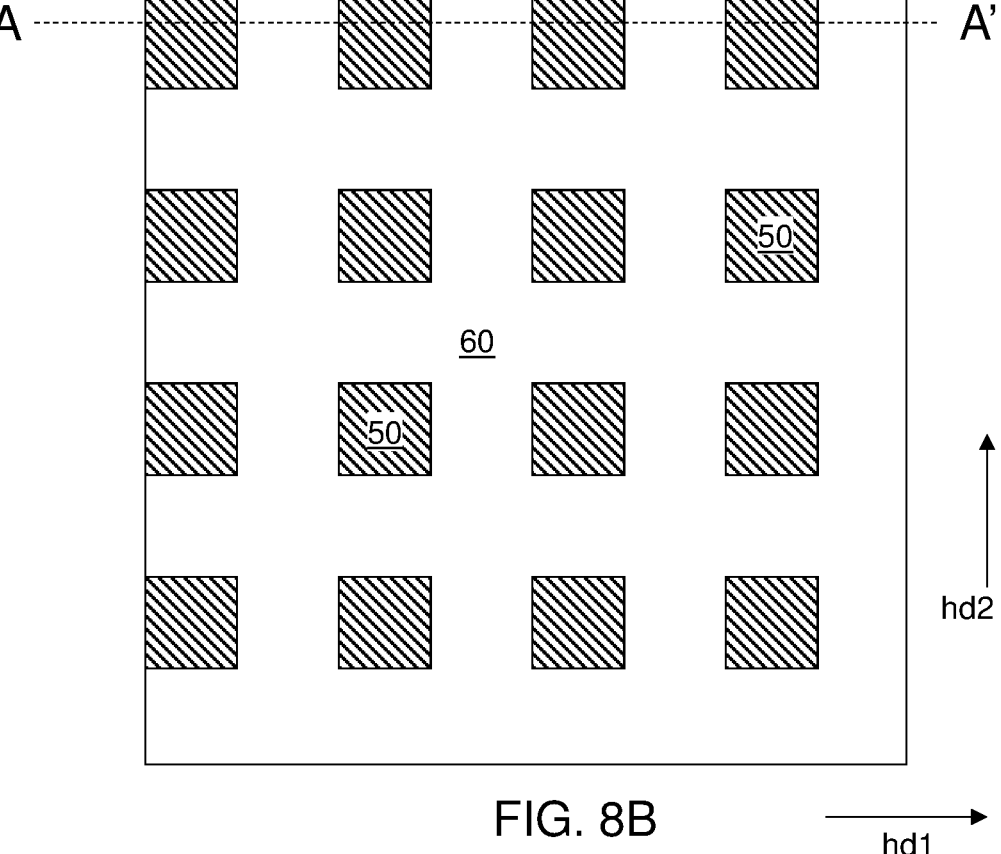
FIG. 8B is a top-down view of the first exemplary structure of FIG. 8A.

Referring to FIGS. 8A and 8B, an optional dielectric diffusion barrier liner (not shown) may be optionally formed on the physically exposed surfaces of the memory pillar structures (130, 140, 40, 30, 24, 50). A dielectric fill material such as undoped silicate glass, a doped silicate glass, or organosilicate glass. Portions of the dielectric fill material and the dielectric diffusion barrier liner that overlie the horizontal plane including the top surfaces of the memory pillar structures (130, 140, 40, 30, 24, 50) by a planarization process such as a chemical mechanical planarization process. The top surfaces of the metallic cap plates 50 can be employed as stopping surfaces for the planarization process. The remaining portions of the dielectric fill material and the dielectric diffusion barrier liner comprise a dielectric isolation structure 60. The dielectric isolation structure 60 can laterally surround the two-dimensional array of memory pillar structures (130, 140, 40, 30, 24, 50).

Figure 9A:
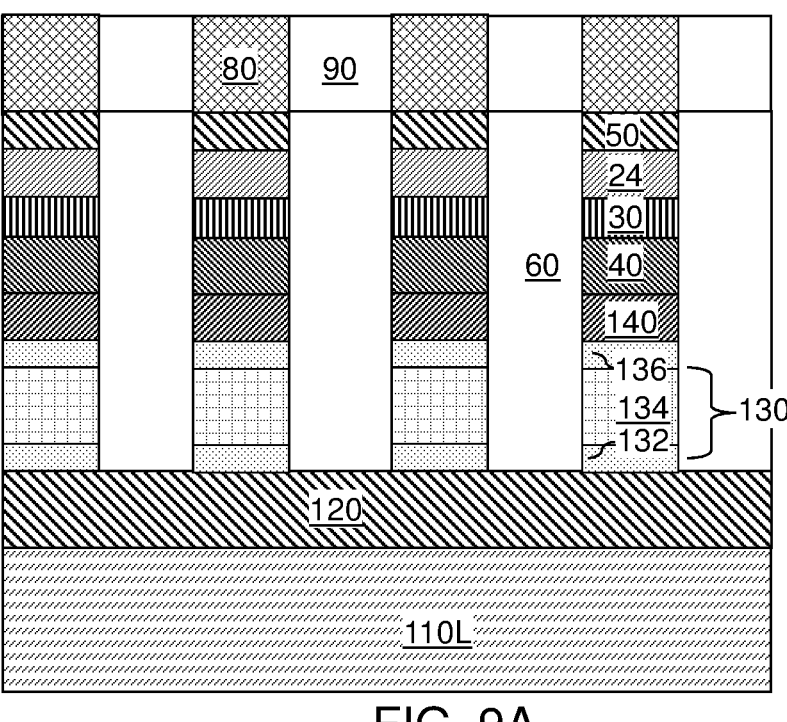
FIG. 9A is a vertical cross-sectional view along plane A-A' in FIG. 9B of the first exemplary structure after formation of second electrically conductive lines laterally spaced by second dielectric rails according to the first embodiment of the present disclosure.
Figure 9B:
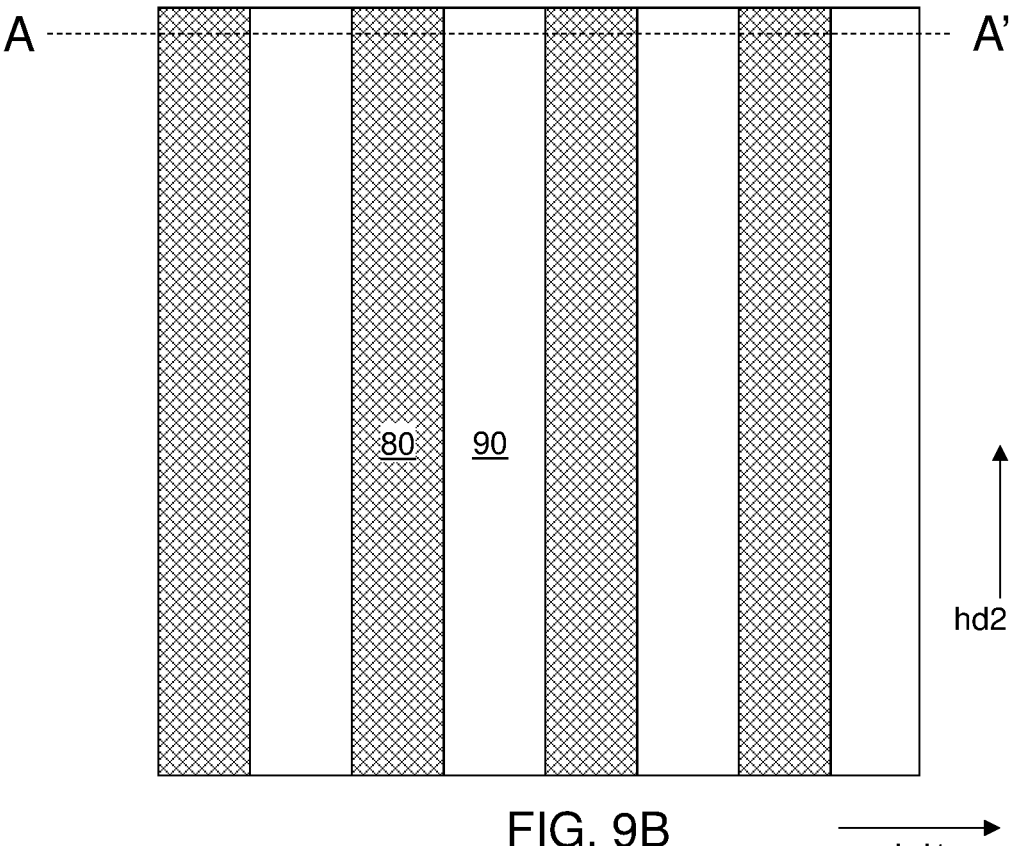
FIG. 9B is a top-down view of the first exemplary structure of FIG. 9A.

Referring to FIGS. 9A and 9B, a dielectric material layer can be deposited over the two-dimensional array of memory pillar structures (130, 140, 40, 30, 24, 50). The dielectric material layer includes a dielectric material such as silicon oxide, and can be formed by chemical vapor deposition. The thickness of the dielectric material layer may be in a range from 50 nm to 500 nm, although lesser and greater thicknesses can also be employed. A photoresist layer (not shown) can be applied over the dielectric material layer, and can be lithographically patterned to form a line and space pattern. Elongated openings laterally extending along the second horizontal direction hd2 and laterally spaced apart among one another along the first horizontal direction hd1 can be formed in the photoresist layer. The width of each opening along the first horizontal direction hd1 can be in a range from 10 nm to 50 nm, such as 15 nm to 25 nm, although lesser and greater widths can also be employed. The pitch of the line and space pattern may be in a range from 20 nm to 100 nm, such as from 30 nm to 50 nm, although lesser and greater pitches may also be employed. The pitch of the line and space pattern can be the same as the pitch of the two-dimensional array of memory pillar structures (130, 140, 40, 30, 24, 50) along the first horizontal direction hd1. The pattern in the photoresist layer can be transferred through the dielectric material layer by an anisotropic etch process. The photoresist layer can be employed as an etch mask during the anisotropic etch process. Optionally an additional hard mask layer (not shown) may be used in conjunction with the photoresist layer to define the line and space pattern. Second line trenches can be formed through the dielectric material layer. The photoresist layer and hard mask layer can be subsequently removed, for example, by ashing. Remaining portions of the dielectric material layer comprise second dielectric rails 90.

A metallic liner layer including a metallic barrier material can be deposited in the second line trenches and over the second dielectric rails 90. The metallic liner layer can include a conductive metallic barrier material such as a conductive metallic nitride material (e.g., TiN, TaN, MoN and/or WN) and/or a conductive metallic carbide material (e.g., TiC, TaC, and/or WC). The metallic liner layer can be deposited by chemical vapor deposition or physical vapor deposition. A metallic fill material layer can be deposited over the metallic liner layer. The metallic fill material layer includes a metallic material having high electrical resistivity. For example, the metallic fill material layer can include copper, tungsten, titanium, tantalum, molybdenum, ruthenium, cobalt, or a combination thereof.

Excess portions of the metallic fill material layer and the metallic liner layer can be removed from above the horizontal plane including the top surface of the second dielectric rails 90. Each remaining portion of the metallic fill material layer comprises a second metallic fill material portion. Each remaining portion of the metallic liner layer comprises a second metallic liner. Each contiguous combination of a second metallic liner and a second metallic fill material portion constitutes a second electrically conductive line 80. The second electrically conductive lines 80 laterally extend along the second horizontal direction hd2, and are laterally spaced apart along the first horizontal direction hd1.

Alternatively, the second electrically conductive lines 80 may be formed first by depositing one or more electrically conductive layers, followed by patterning the one or more electrically conductive layers by reactive ion etching (RIE) to form the lines 80. The second dielectric rails 90 are then formed between the second electrically conductive lines 80 by depositing the dielectric material layer between the second electrically conductive lines 80 and planarizing the dielectric material layer.

Referring to FIGS. 10A and 10B, an alternative configuration of the first exemplary structure can be derived from the first exemplary structure of FIGS. 9A and 9B by removing the distal single crystalline semiconductor layer 24L after the processing steps of FIG. 5 prior to deposition of the metallic cap layer 50L at the processing steps of FIG. 6. In this case, the metallic cap layer 50L can be formed directly on the top surface of the single crystalline ferroelectric material layer 30L. Thus, each memory pillar structure (130,

140, 40, 30, 24, 50) can include, and may consist of, a selector element 130, a second metallic material plate 140, a first metallic material plate 40, a single crystalline ferroelectric material plate 30, and a metallic cap plate 50.

Figure 11A:
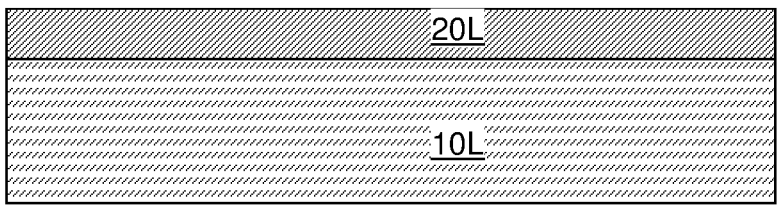
FIG. 11A is a vertical cross-sectional view of a first substrate after formation of a single crystalline semiconductor layer thereupon according to a second embodiment of the present disclosure.

In a second embodiment of the present disclosure, chemical or mechanical substrate removal is used instead of cleaving along the implanted layer 23. Referring to FIG. 11A, an exemplary structure according to a second embodiment of the present disclosure includes a first substrate 10L, which may be the same as the first substrate 10L of FIG. 1A. A single crystalline semiconductor layer 20L can be formed on a top surface of the first substrate 10L by an epitaxial semiconductor deposition process. The single crystalline semiconductor layer 20L can include a germanium-containing single crystalline semiconductor material. For example, the single crystalline semiconductor layer 20L can include germanium or a silicon-germanium alloy. In one embodiment, the single crystalline semiconductor layer 20L may include germanium at an atomic percentage in a range from 50% to 100%. The single crystalline semiconductor layer 20L can be formed by performing an epitaxial semiconductor deposition process. In one embodiment, the bottom portion of the single crystalline semiconductor layer 20L may have a vertically graded material composition such that the atomic concentration of germanium increases with a distance from the top surface of the first substrate 10L. In one embodiment, the top portion of the single crystalline semiconductor layer 20L may include germanium at an atomic percentage in a range from 50% to 100%, such as from 80% to 90%. In one embodiment, the top portion of the single crystalline semiconductor layer 20L may include germanium at an atomic percentage of 100%. The thickness of the single crystalline semiconductor layer 20L may be in a range from 25 nm to 300 nm, such as from 50 nm to 150 nm, although lesser and greater thicknesses may also be employed.

Figure 11B:
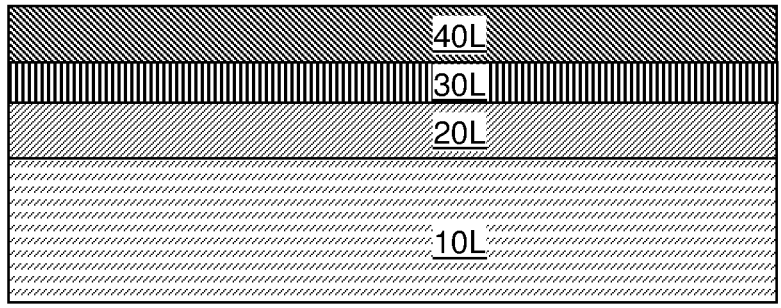
FIG. 11B is a vertical cross-sectional view of an assembly including the first substrate after formation of a single crystalline ferroelectric material layer and a first metallic material layer according to the second embodiment of the present disclosure.

Referring to FIG. 11B, a single crystalline ferroelectric material layer 30L can be epitaxially grown on the top surface of the single crystalline semiconductor layer 20L. The single crystalline ferroelectric material layer 30L includes a single crystalline ferroelectric material that is epitaxially aligned to the single crystalline semiconductor material of the single crystalline semiconductor layer 20L. In one embodiment, the single crystalline ferroelectric material layer 30L can include a transition metal oxide material, as described with respect to the first embodiment. A thermal anneal can be performed to improve crystallinity of the material of the single crystalline ferroelectric material layer 30L and to enhance ferroelectric properties (such as magnitude of electrical polarization) of the ferroelectric material of the single crystalline ferroelectric material layer 30L.

A first metallic material layer 40L can be formed by deposition of a first metallic material on the top surface of the single crystalline ferroelectric material layer 30L. The first metallic material layer 40L may include an elemental metal (such as W, Mo or Ru) and/or a conductive metallic compound material such as (TiN, TaN, or WN). The first metallic material layer 40L can be formed by chemical vapor deposition or by physical vapor deposition. The first metallic material layer 40L can have a thickness in a range from 5 nm to 50 nm, such as from 10 nm to 25 nm, although lesser and greater thicknesses may also be employed.

Figure 12:
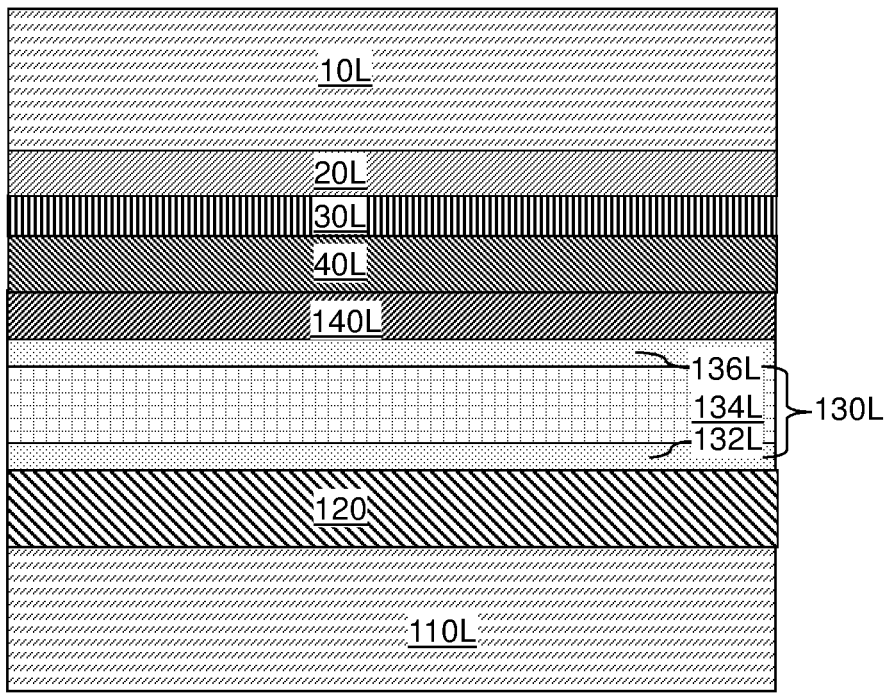
FIG. 12 is a vertical cross-sectional view of a second exemplary structure after attaching an assembly of a second substrate, first electrically conductive lines laterally spaced by first dielectric rails, a lower electrode layer, a selector material layer, an upper electrode layer, and a second metallic material layer according to the second embodiment of the present disclosure.

Referring to FIG. 12, the structure of FIG. 3 is provided, and the second metallic material layer 140L is bonded to the first metallic material layer 40L by performing a thermal anneal process.

Figure 13:
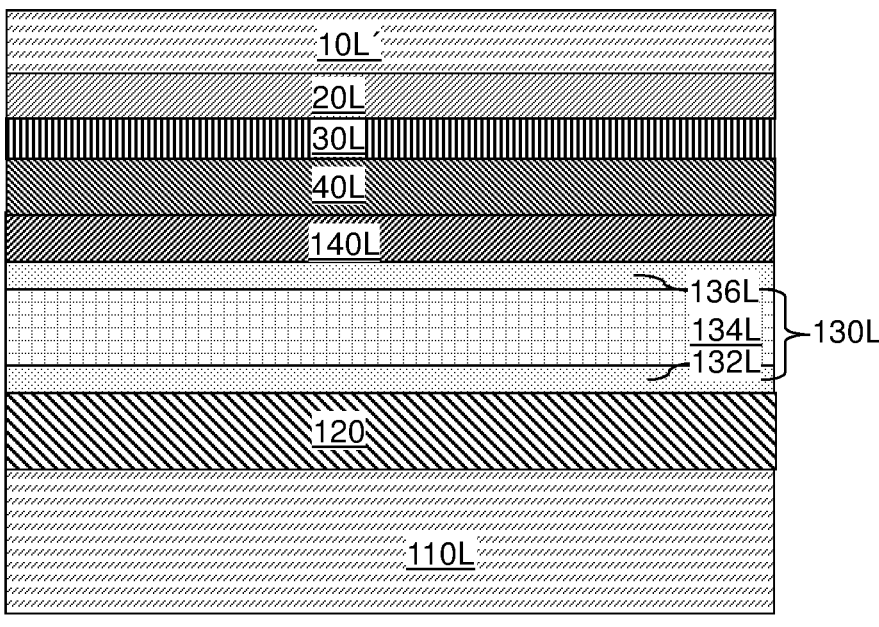
FIG. 13 is a vertical cross-sectional view of the second exemplary structure after thinning the first substrate according to the second embodiment of the present disclosure.

Referring to FIG. 13, the first substrate 10L can be thinned from the backside by performing a thinning process. The thinning process may comprise a grinding process, a wet etch process, a dry etch process, and/or a polishing process. The thickness of the first substrate 10L after thinning may be in a range from 100 nm to 5,000 nm.

Figure 14:
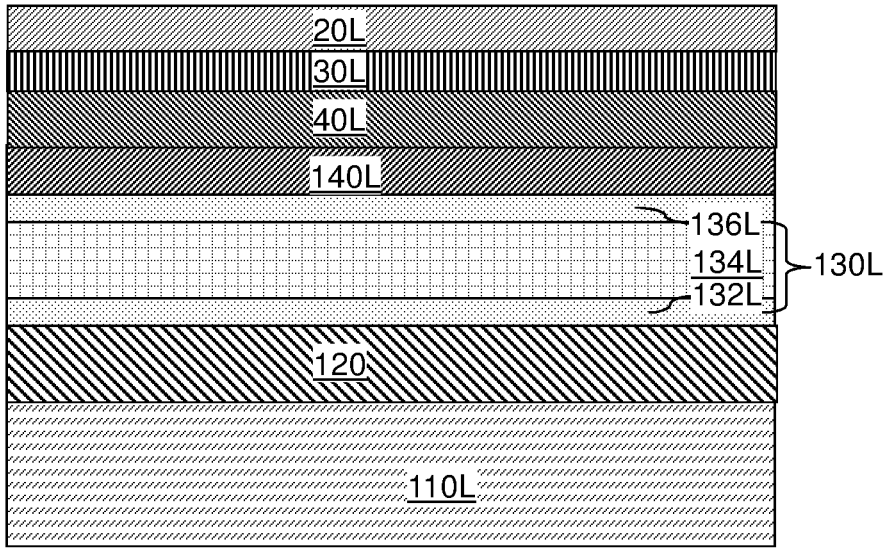
FIG. 14 is a vertical cross-sectional view of the second exemplary structure after removal of the thinned first substrate according to the second embodiment of the present disclosure.

Referring to FIG. 14, the remaining portion of the first substrate 10L may be removed selective to the single crystalline semiconductor layer 20L by an additional thinning process, which may include a chemical mechanical polishing process. The top surface of the single crystalline semiconductor layer 20L can be physically exposed.

Figure 15:
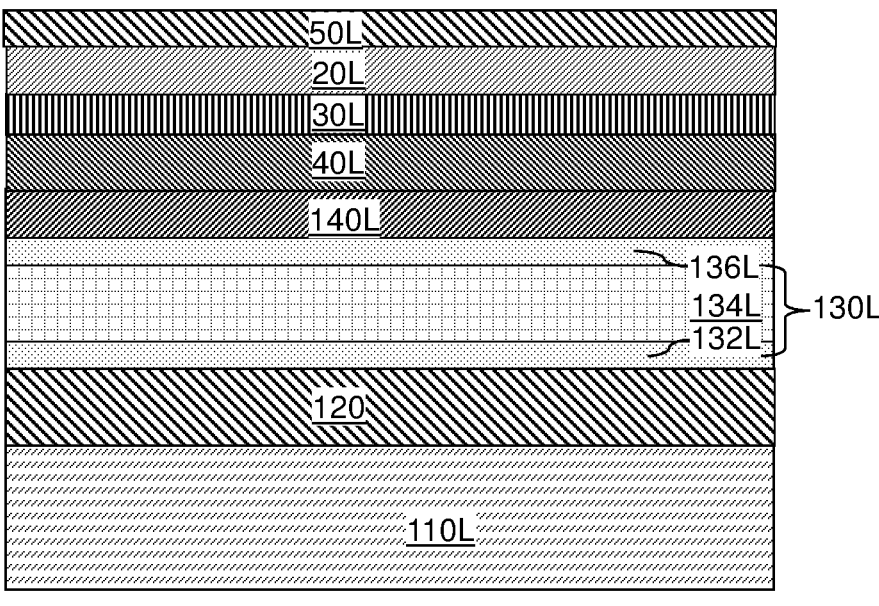
FIG. 15 is a vertical cross-sectional view of the second exemplary structure after formation of a metallic cap layer according to the second embodiment of the present disclosure.

Referring to FIG. 15, the processing steps of FIG. 6 can be performed to form a metallic cap layer 50L.

Figure 16:
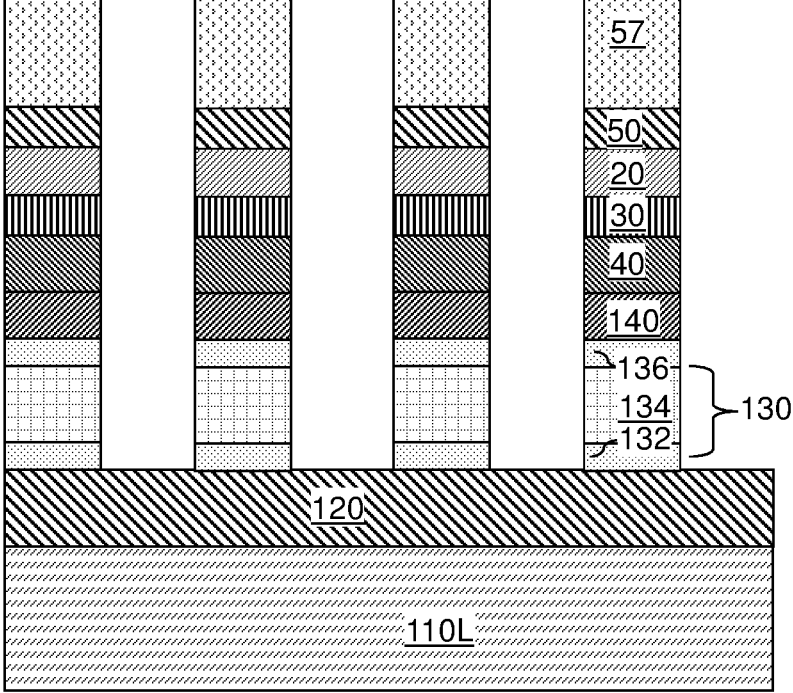
FIG. 16 is a vertical cross-sectional view of the second exemplary structure after formation of an array of memory pillar structures according to the second embodiment of the present disclosure.

Referring to FIG. 16, the processing steps of FIG. 7 can be performed to form a two-dimensional array of memory pillar structures (130, 140, 40, 30, 24, 50).

Figure 17A:
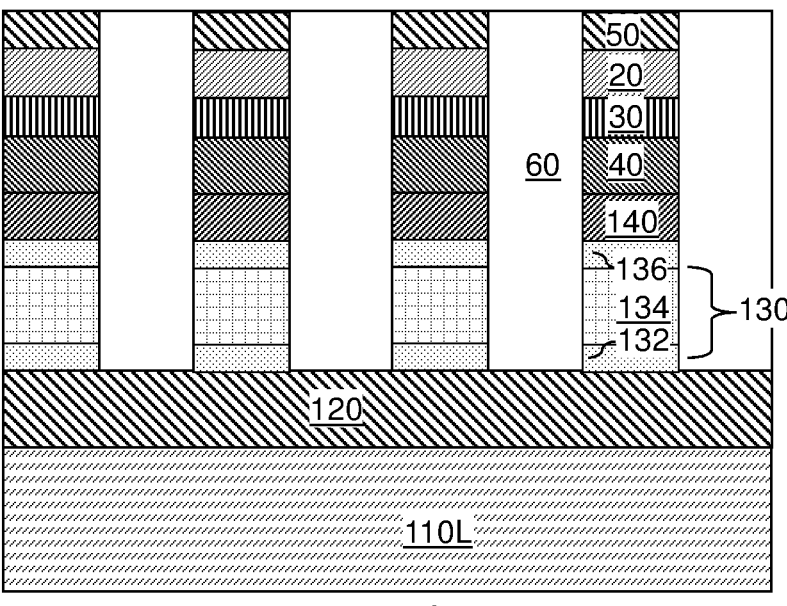
FIG. 17A is a vertical cross-sectional view of the second exemplary structure after formation of a dielectric isolation structure according to the second embodiment of the present disclosure.
Figure 17B:
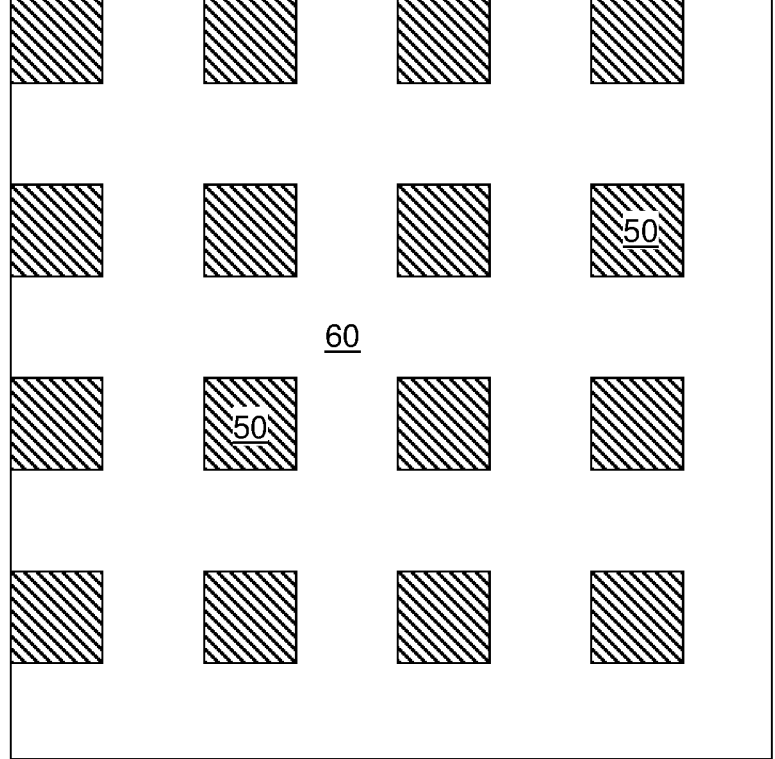
FIG. 17B is a top-down view of the second exemplary structure of FIG. 17A.

Referring to FIGS. 17A and 17B, the processing steps of FIGS. 8A and 8B can be performed to form a dielectric isolation structure 60.

Figure 18A:
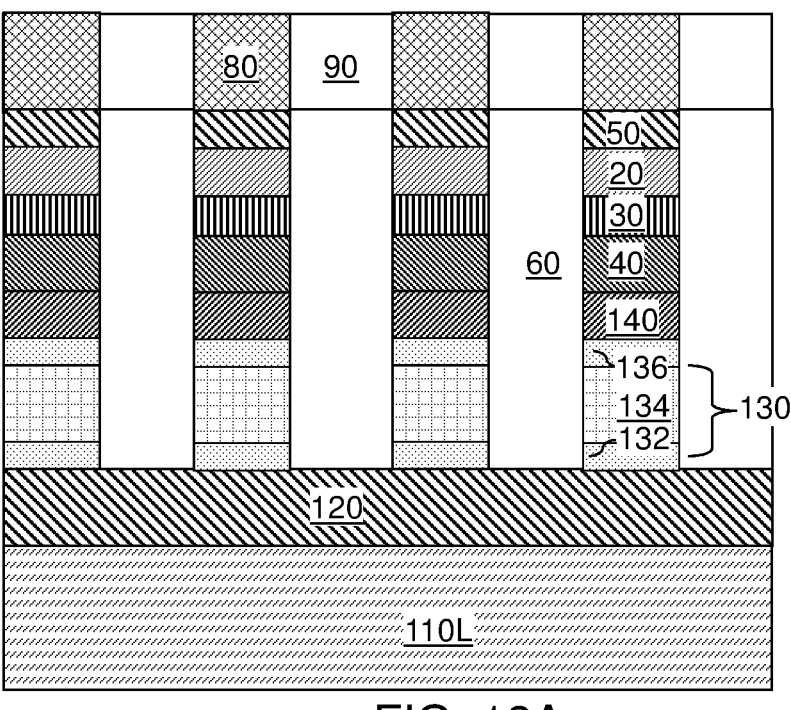
FIG. 18A is a vertical cross-sectional view of the second exemplary structure after formation of second electrically conductive lines laterally spaced by second dielectric rails according to the second embodiment of the present disclosure.
Figure 18B:
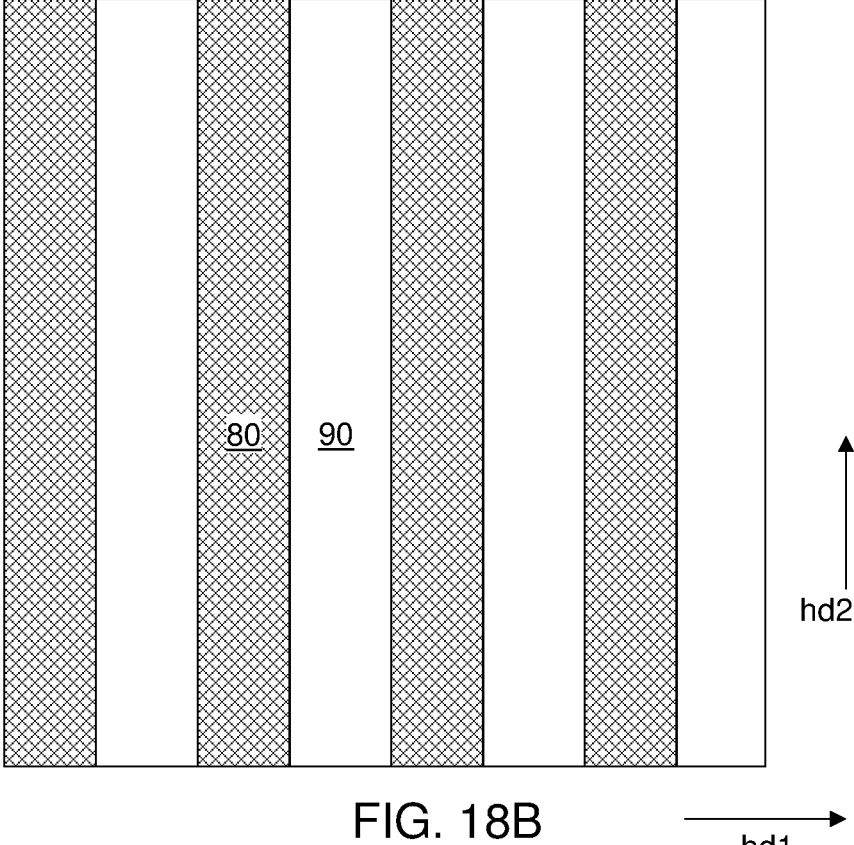
FIG. 18B is a top-down view of the second exemplary structure of FIG. 18A.

Referring to FIGS. 18A and 18B, the processing steps of FIGS. 9A and 9B can be performed to form second electrically conductive lines 80 and second dielectric rails 90.

Figure 19:
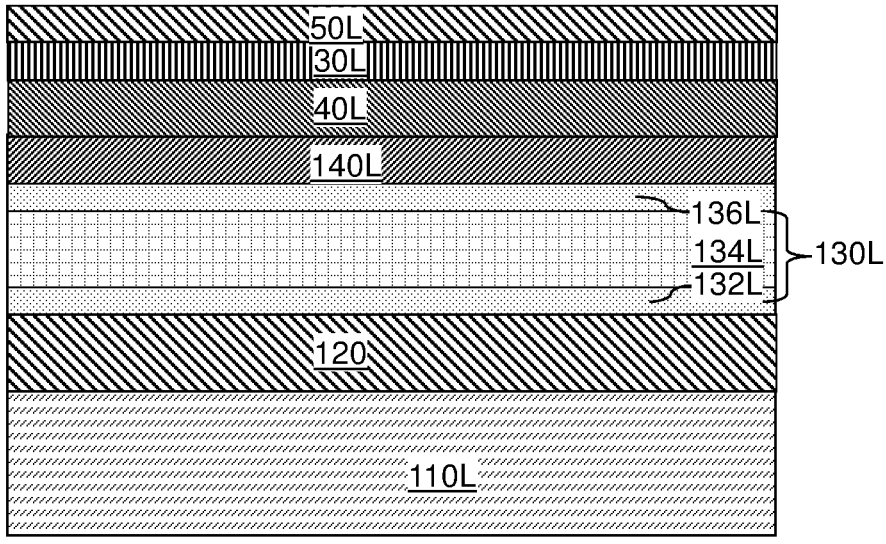
FIG. 19 is a vertical cross-sectional view of an alternative configuration of the second exemplary structure after removal of the single crystalline semiconductor layer according to the second embodiment of the present disclosure.

Referring to FIG. 19, an alternative configuration of the second exemplary structure can be derived from the second exemplary structure of FIG. 14 by removing the single crystalline semiconductor layer 20L selective to the material of the single crystalline ferroelectric material layer 30L. The metallic cap layer 50L can be deposited directly on the top surface of the single crystalline ferroelectric material layer 30L.

Figure 20A:
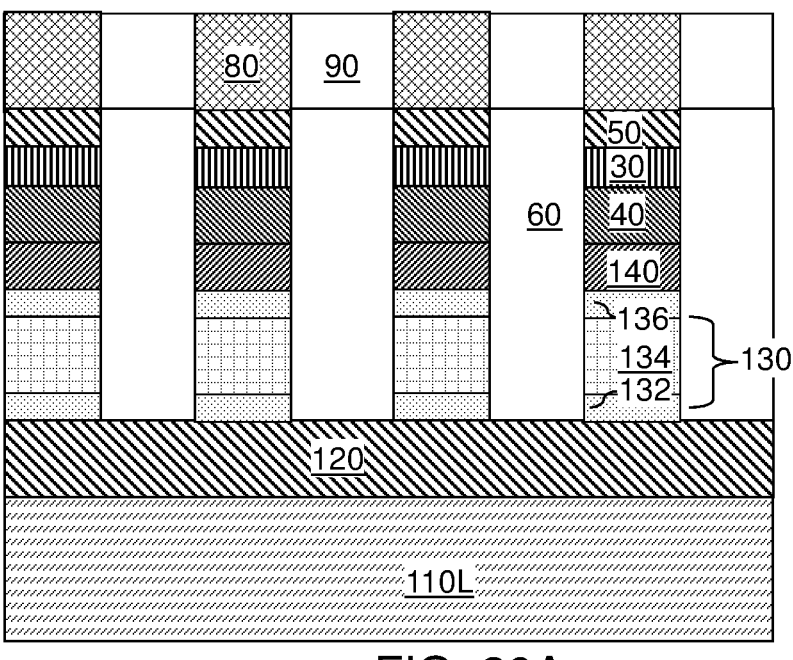
FIG. 20A is a vertical cross-sectional view of the alternative configuration of the second exemplary structure after formation of second electrically conductive lines laterally spaced by second dielectric rails according to the second embodiment of the present disclosure.
Figure 20B:
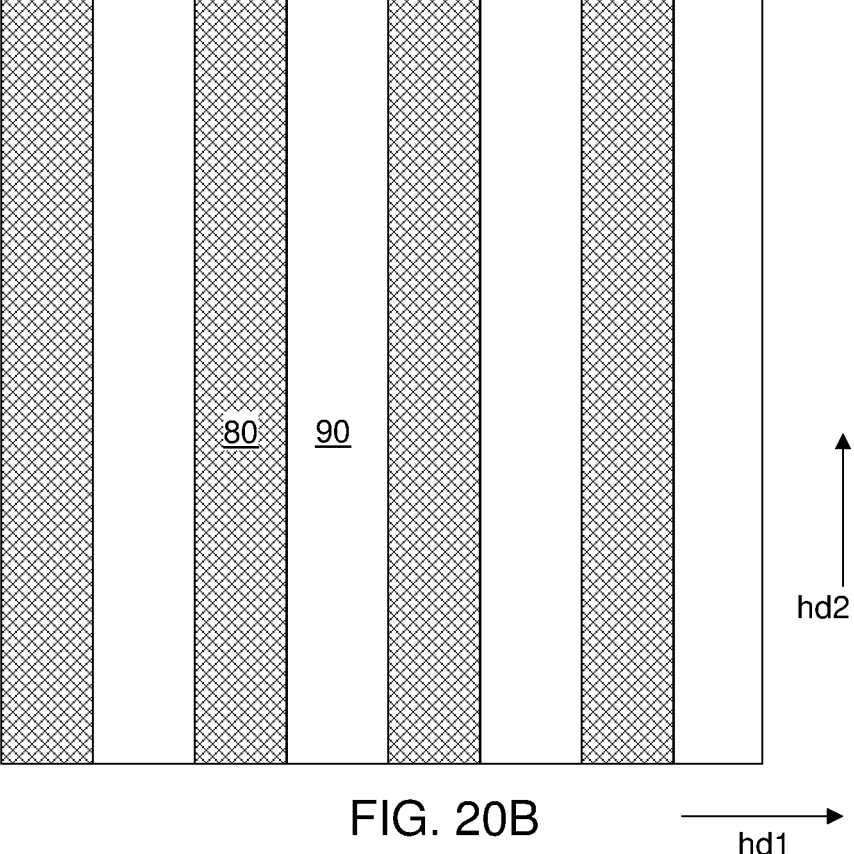
FIG. 20B is a top-down view of the second exemplary structure of FIG. 20A.

Referring to FIGS. 20A and 20B, the processing steps of FIGS. 16, 17A and 17B, and 18A and 18B can be performed to provide an alternative configuration of the second exemplary structure.

As shown in FIGS. 9A, 10A, 18A and 20A, a memory cell of a ferroelectric tunnel junction memory device according to the first and second embodiments is formed in each memory pillar structure. The memory cell of the ferroelectric tunnel junction memory device includes a ferroelectric tunnel barrier layer which comprises the single crystalline ferroelectric material plate 30 located between lower and upper electrodes, which comprise the first metallic material plate 40 and the metallic cap plate 50, respectively. The single crystalline semiconductor plate 24 (if present, as shown in FIG. 9A) may comprise a portion of the upper electrode. The memory cell of the ferroelectric tunnel junction memory device may also include the selector element (e.g., steering element) 130. Each selector element 130 may include, from bottom to top, a lower electrode comprising the lower electrode plate 132, an upper electrode comprising the upper electrode plate 136 and a selector material (e.g., OTS or diode) comprising the selector material plate 134 located between the lower electrode 132 and the upper electrode 136. The conductive lines (120, 80) may comprise a respective bit line and word line of the memory cell.

The memory cell displays modulation in tunneling electrical resistance depending on the direction of polarization of the electric dipole moments in the ferroelectric tunnel barrier layer 30. The direction of polarization of the electric dipole moments in the portion of the ferroelectric tunnel barrier layer 30 can be programmed by applying a programming voltage across the ferroelectric tunneling memory element. The magnitude of the programming voltage can be selected such that the selector element 130 turns on under an external bias voltage having a magnitude of the programming voltage, and does not turn on under an external bias voltage of less than the magnitude of the programming voltage (e.g., one half of the magnitude of the programming voltage). The programming voltage applied to the bit line relative to the word line can have a magnitude that is sufficient to turn on the selector element 130, and can be positive or negative depending on the target direction of polarization of the electric dipole moments in the programmed portion of the ferroelectric tunnel barrier layer 30.

The sensing of the direction of the electric dipole moments in the portion of the ferroelectric tunnel barrier layer 30 between a selected bit line and a selected word line can be effected by applying a sensing voltage between the selected bit line and the selected word line. The magnitude of the sensing voltage can be selected such that the selector element 130 turns on under an external bias voltage having a magnitude of the sensing voltage, and does not turn on under an external bias voltage less than the magnitude of the sensing voltage (e.g., one half of the magnitude of the sensing voltage). Further, the magnitude of the sensing voltage is lower than the magnitude of the programming voltage, and is insufficient to program a portion of the ferroelectric tunnel barrier layer 30. In one embodiment, the magnitude of the sensing voltage can be about 50 mV~200 mV higher than the turn-on voltage for the selector element 130. The selected portion of the ferroelectric tunnel barrier layer 30 provides modulation of electrical resistance depending on the direction of the polarization of the electric dipole moments. Thus, a selected portion of a ferroelectric tunnel barrier layer 30 between a selected bit line and a selected word line in an array can be sensed without disturbing unselected memory cells.

Referring to FIGS. 21A and 21B, electrostatic potential energy band profiles are illustrated for a ferroelectric tunnel junction devices of the first and second embodiments. The devices include a first conductor, a tunneling ferroelectric dielectric, and a second conductor for two different polarization directions of the tunneling ferroelectric dielectric. The first conductor and the second conductor can be different, and the magnitude and the lateral extent of the distortion in the conduction band due to the dipole moment P in the ferroelectric tunnel barrier can be asymmetric. The asymmetric band modulations induced in the ferroelectric tunnel junction can change the tunneling electrical resistance of the ferroelectric tunnel junction depending on the direction of the electric dipole moment in the ferroelectric tunnel barrier. Generally, polarization reversal of a ferroelectric tunnel junction can modulate a tunnel transmission coefficient induced by two different average barrier heights. Thus, electrostatic potential energy band profiles for the two different polarization states of the ferroelectric tunnel barrier provide two different electrical resistance states, which can be employed to program and store a data bit. The ratio of the conductance in the low electrical resistance state to the conductance in the high resistance state can be in a range from 10 to 1,000, such as from 30 to 300, although lesser and greater ratios may also be employed. The polarization state of the ferroelectric tunnel barrier exhibits a hysteresis curve as a function of an external voltage bias across the first conductor and the second conductor, and is capable of storing a data bit. The programmable resistance states of a ferroelectric tunnel junction is used in various ferroelectric memory devices of the first and second embodiments of the present disclosure.

Referring to all drawings and according to the first and second embodiments of the present disclosure, a memory device comprises a first electrically conductive line 120 laterally extending along a first horizontal direction hd1, a memory pillar structure (130, 140, 40, 30, optionally 24, 50) overlying and contacting the first electrically conductive line 120, wherein the memory pillar structure comprises a single crystalline ferroelectric material plate 30 in which an entirety of a ferroelectric material is single crystalline, and a second electrically conductive line 80 laterally extending along a second horizontal direction hd2 and overlying and contacting the memory pillar structure.

In one embodiment, the memory pillar structure (130, 140, 40, 30, optionally 24, 50) comprises a first metallic material plate 40 contacting a bottom surface of the single crystalline ferroelectric material plate 30. In one embodiment, the memory pillar structure (130, 140, 40, 30, optionally 24, 50) further comprises a selector material plate 134 underlying the first metallic material plate 40. A bonding interface is located between the selector material plate 134 and the single crystalline ferroelectric material plate 30. The bonding interface may be located between the first metallic material plate 40 and the second metallic material layer 140.

In one embodiment, the memory device comprises: a lower electrode plate 132 contacting a bottom surface of the selector material plate 134 and comprising a first non-metallic conductive material; and an upper electrode plate 136 contacting a top surface of the selector material plate 134 and comprising a second non-metallic conductive material. In one embodiment, the selector plate comprises an ovonic threshold switch material. In one embodiment, each of the first non-metallic conductive material and the second non-metallic conductive material is selected from amorphous carbon, amorphous boron-doped carbon, amorphous nitrogen-doped carbon, amorphous silicon, amorphous germanium, alloys thereof, or layer stacks thereof.

In one embodiment, the memory pillar structure (130, 140, 40, 30, optionally 24, 50) comprises a second metallic material plate 140 contacting a bottom surface of the first metallic material plate 40 and bonded to the first metallic material plate 40. In one embodiment, the ferroelectric material of the single crystalline ferroelectric material plate 30 comprises doped or undoped hafnium oxide having an orthorhombic phase.

In one embodiment, the memory pillar structure (130, 140, 40, 30, optionally 24, 50) comprises a semiconductor plate (such as a single crystalline semiconductor plate 24) contacting a top surface of the single crystalline ferroelectric material plate 30. In one embodiment, the semiconductor plate comprises a single crystalline semiconductor material. In one embodiment, the single crystalline semiconductor material of the semiconductor plate is epitaxially aligned to the ferroelectric material of the single crystalline ferroelectric material plate 30. In one embodiment, the semiconductor plate comprises single crystalline germanium or silicon germanium.

In one embodiment, the memory pillar structure (130, 140, 40, 30, optionally 24, 50) comprises a metallic cap plate 50 overlying the single crystalline ferroelectric material plate 30 and contacting the second electrically conductive line 80. In one embodiment, the memory device comprises a ferroelectric tunnel junction memory device.

The first and second embodiments of the present disclosure provide a single crystalline ferroelectric tunnel barrier layer in a ferroelectric tunnel junction (FTJ) memory device which provides superior ferroelectric properties due to the single crystalline structure. Furthermore, an easy to deposit single crystal semiconductor layer can be used as an epitaxial template for a hafnium oxide based single crystalline ferroelectric tunnel barrier layer instead of a more difficult to deposit perovskite template layer.

In a third embodiment of the present disclosure, the memory material layer comprises a phase change memory material layer rather than a ferroelectric tunnel barrier layer, and the memory device comprises a phase change memory (PCM) device, such as a phase change random access memory ("PCRAM" or "PRAM") device rather than a FTJ memory device. The phase change memory material layer may be damaged by the reactive ion etch (RIE) used to pattern thick overlying word or bit lines. Therefore, in the third embodiment, the phase change memory material layer is formed over a first set of patterned lines (e.g., word lines or bit lines) located over a first substrate. The first set of patterned lines are patterned by RIE prior to deposition of the phase change memory material layer. The second set of patterned lines (e.g., the other ones of the word lines or bit lines) are formed over a second substrate followed by bonding the second set of patterned lines to a layer stack containing the phase change memory material layer. In the third embodiment, the phase change memory material layer is not exposed to an extended reactive etch process which etches the thick conductive lines. This reduces or prevents damage of the phase change memory material layer.

Figure 22A:
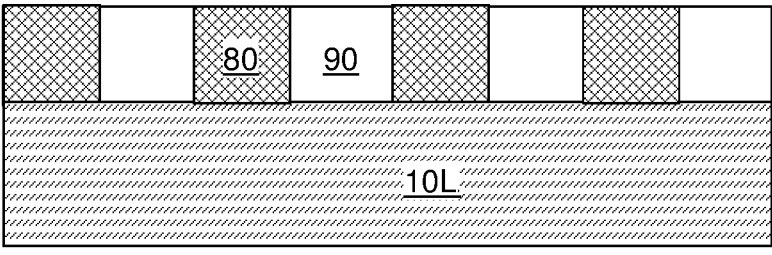
FIGS. 22A, 23, 24, 25A, 26 and 27 are vertical cross-sectional views of steps in a method of forming a third exemplary structure according to the third embodiment of the present disclosure.
Figure 22B:
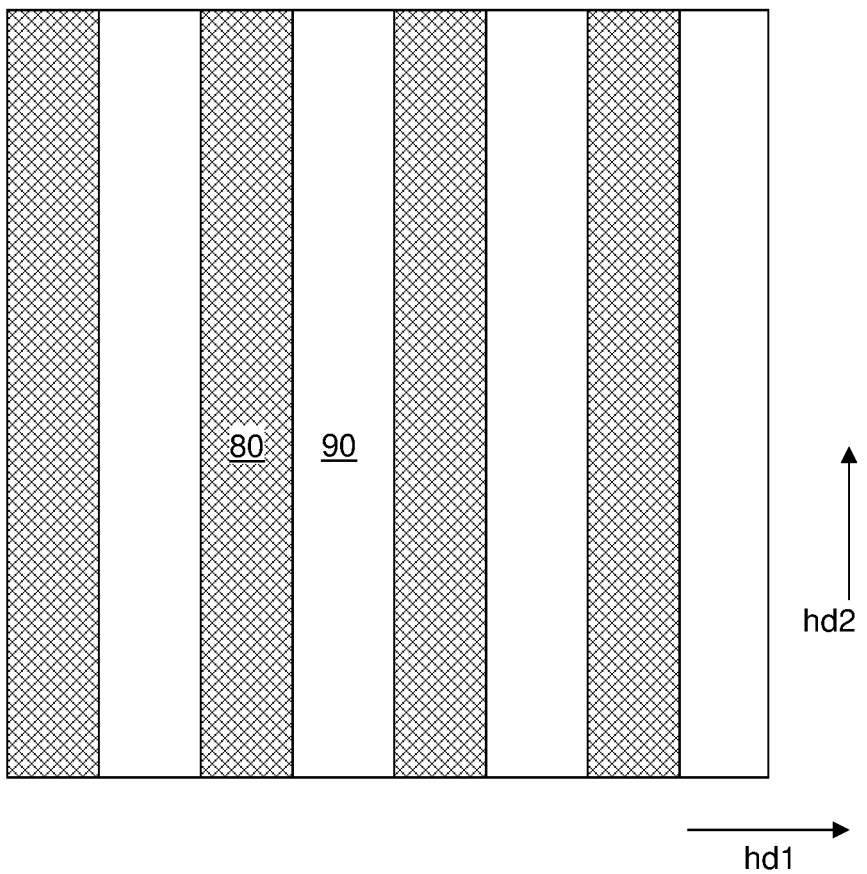
FIGS. 22B and 25B are top-down views of the third exemplary structure of FIGS. 22A and 25A, respectively.

Referring to FIGS. 22A and 22B, the second electrically conductive lines 80 and the second dielectric material rails 90 are formed over the first substrate 10L. The second electrically conductive lines 80 may be formed by depositing one or more electrically conductive layers described in the prior embodiments, followed by patterning the one or more electrically conductive layers by reactive ion etching (RIE) to form the lines 80. The second dielectric rails 90 are then formed between the second electrically conductive lines 80 by depositing the dielectric material layer between the second electrically conductive lines 80 and planarizing the dielectric material layer.

Figure 23:
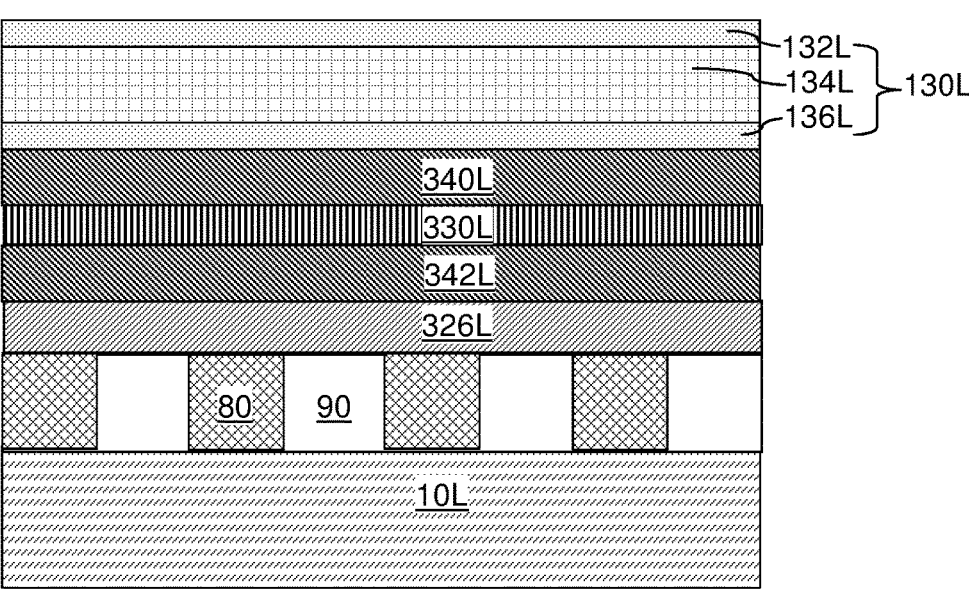

Referring to FIG. 23, a layer stack is formed over the second electrically conductive lines 80 and the second dielectric material rails 90 located over the first substrate 10L. The layer stack includes a non-metallic conductive material layer 326L. Exemplary non-metallic conductive materials that can be employed for layer 326L include amorphous carbon, amorphous boron-doped carbon, or amorphous nitrogen-doped carbon. The non-metallic conductive material layer 326L thickness in a range from 10 nm to 50 nm, such as from 20 nm to 30 nm, although lesser and greater thicknesses may also be employed.

A relatively thin second metallic material layer 342L can be formed by deposition of a second metallic material on the top surface of the non-metallic conductive material layer 326L. The second metallic material layer 342L may include an elemental metal, such as W or Ru, and/or a conductive metallic compound material, such as TiN, TaN, or WN. The second metallic material layer 342L can be formed by chemical vapor deposition or by physical vapor deposition. The second metallic material layer 342L can have a thickness in a range from 1 nm to 5 nm, such as from 2 nm to 3 nm, although lesser and greater thicknesses may also be employed.

A memory material layer comprising a phase change memory material layer 330L is formed on the second metallic material layer 342. As used herein, a "phase change memory material" refers to a material having at least two different phases providing different resistivity. The at least two different phases can be provided, for example, by controlling the rate of cooling from a heated state to provide an amorphous state having a higher resistivity and a polycrystalline state having a lower resistivity. In this case, the higher resistivity state of the phase change memory material can be achieved by faster quenching of the phase change memory material after heating to an amorphous state, and the lower resistivity state of the phase change memory material can be achieved by slower cooling of the phase change memory material after heating to the amorphous state.

Exemplary phase change memory materials include, but are not limited to, germanium antimony telluride compounds such as $Ge_2Sb_2Te_5$ (GST), germanium antimony compounds, indium germanium telluride compounds, aluminum selenium telluride compounds, indium selenium telluride compounds, and aluminum indium selenium telluride compounds. These compounds (e.g., compound semiconductor material) may be doped (e.g., nitrogen doped GST) or undoped. Thus, the resistive memory material layer can include, and/or can consist essentially of, a material selected from a germanium antimony telluride compound, a germanium antimony compound, an indium germanium telluride compound, an aluminum selenium telluride compound, an indium selenium telluride compound, or an aluminum indium selenium telluride compound. In this case, the thickness of the at least one memory material layer 15L can be in a range from 10 nm to 60 nm, such as from 20 nm to 50 nm and/or from 25 nm to 35 nm, although lesser and greater thicknesses can also be employed.

A relatively thin first metallic material layer 340L can be formed by deposition of a first metallic material on the top surface of the phase change memory material layer 330L. The first metallic material layer 340L may include an elemental metal, such as W or Ru, and/or a conductive metallic compound material, such as TiN, TaN, or WN. The first metallic material layer 340L can be formed by chemical vapor deposition or by physical vapor deposition. The first metallic material layer 340L can have a thickness in a range from 1 nm to 5 nm, such as from 2 nm to 3 nm, although lesser and greater thicknesses may also be employed.

The stack of the selector-level layers 130L is formed over the first metallic material layer 340L. The selector-level layers 130L include the same layers as in the first embodiment (i.e., the lower electrode layer 132L, the selector material layer 134L, and the upper electrode layer 136L stacked up-side down compared to the first and second embodiments), and will not be described in more detail with respect to this third embodiment.

Figure 24:
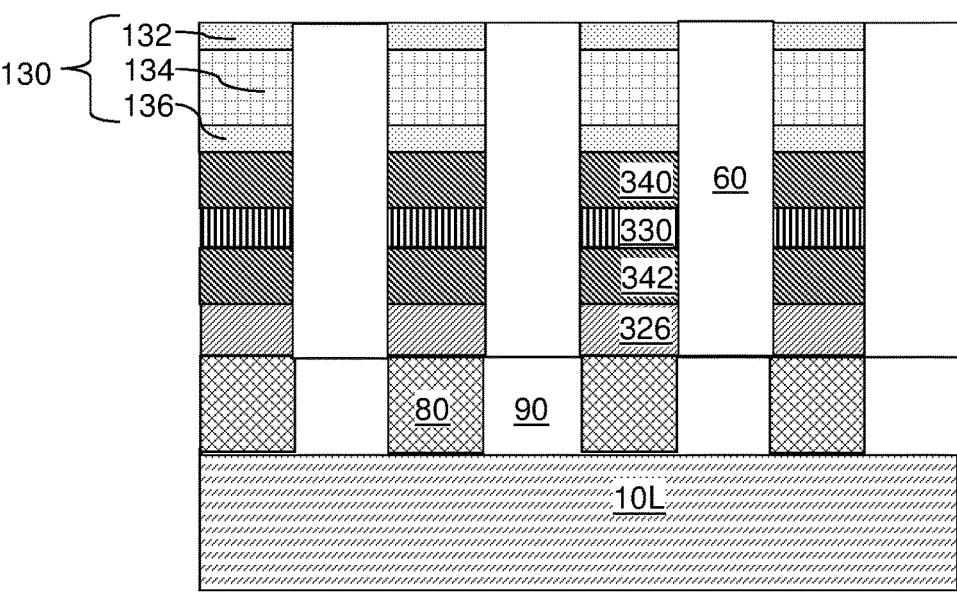

Referring to FIG. 24, the above described layers (326L, 342L, 330L, 340L and 130L) are then patterned into memory pillar structures (326, 342, 330, 340 and 130) each of which contains a respective PRAM memory cell (330, 340, 342). Any suitable patterning method, such as photolithography and etching may be used to form the memory pillar structures, as described above with respect to the first and second embodiments. The etching process used to etch the memory pillar structures may be selected such that it does not significantly damage the phase change memory material layer 130L. The dielectric isolation structure 60 is then formed such that it laterally surrounds the two-dimensional array of memory pillar structures (326, 342, 330, 340 and 130).

Each memory pillar structure (326, 342, 330, 340 and 130) comprises a phase change memory material plate 330 located between first and second electrode plates (340, 342) of the PRAM memory cell (330, 340, 342). A non-metallic conductive material plate 326 is located between the second electrode 342 and the second electrically conductive lines 80 (i.e., word lines or bit lines). A selector element 130 is located above the first electrode plate 340. The selector element includes a selector material plate 134 located between first and second electrode plates (132, 136) of the selector element 130.

Figure 25A:
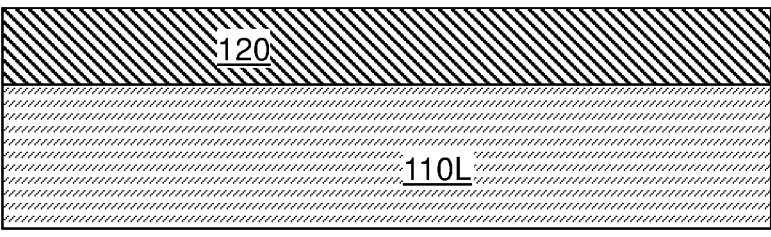
Figure 25B:
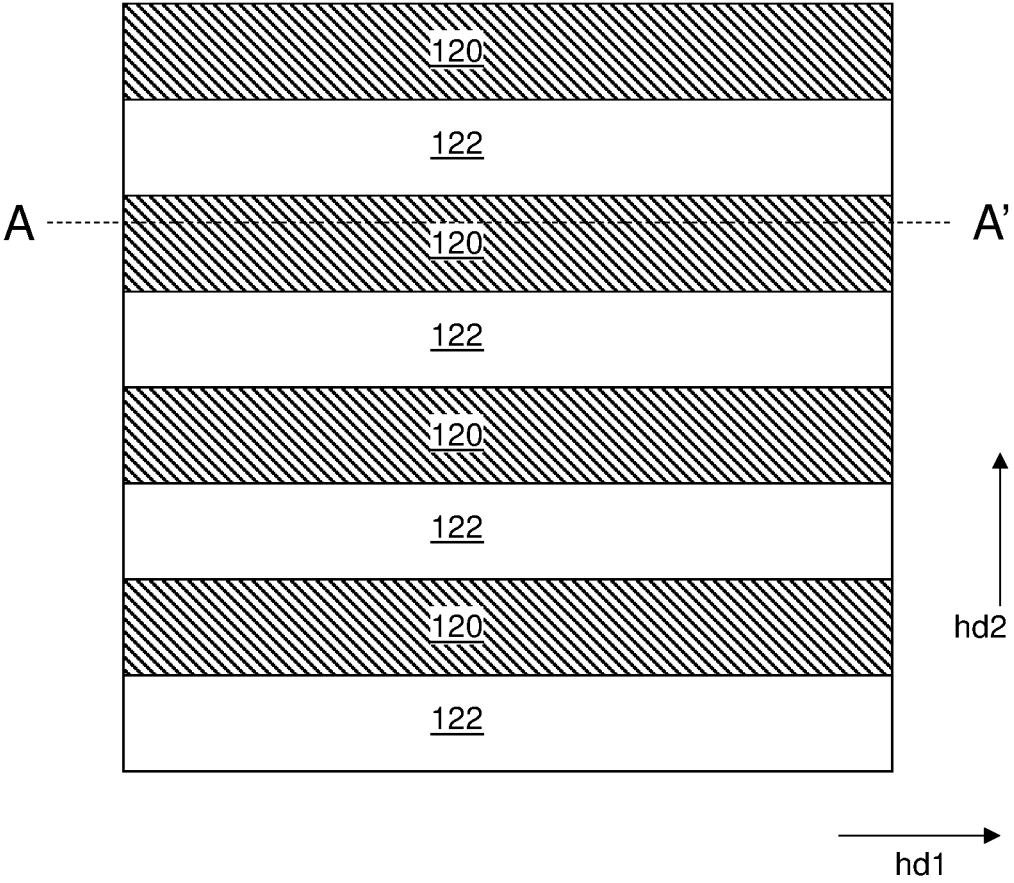

Referring to FIGS. 25A and 25B, the first electrically conductive lines 120 may be formed by depositing one or more electrically conductive layers over the second substrate 110L, followed by patterning the one or more electrically conductive layers by reactive ion etching (RIE) to form the lines 120. The first dielectric rails 122 are then formed between the first electrically conductive lines 120 by depositing the dielectric material layer between the first electrically conductive lines 120 and planarizing the dielectric material layer.

Figure 26:
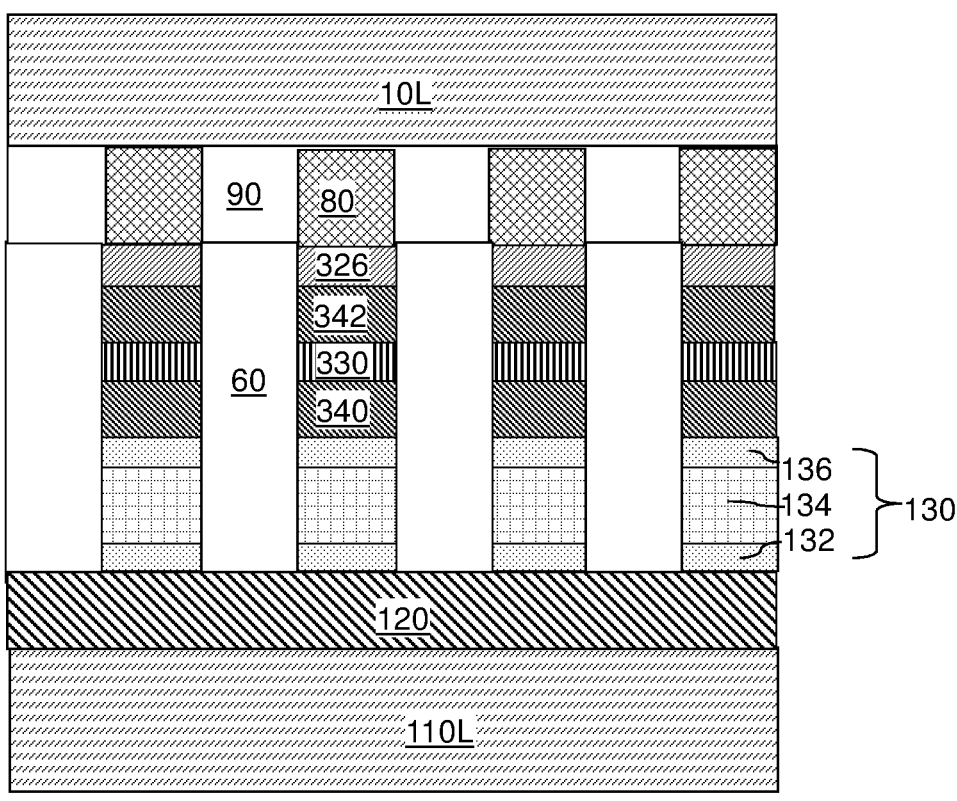

Referring to FIG. 26, the first electrically conductive lines 120 and the first dielectric rails 122 located over the second substrate 110L are bonded to the dielectric isolation structure 60 and the array of memory pillar structures (326, 342, 330, 340 and 130) located over the first substrate 10L. Any suitable bonding may be used, such as metal to metal bonding, dielectric to dielectric bonding, or a combination thereof (i.e., hybrid bonding) may be used.

Figure 27:
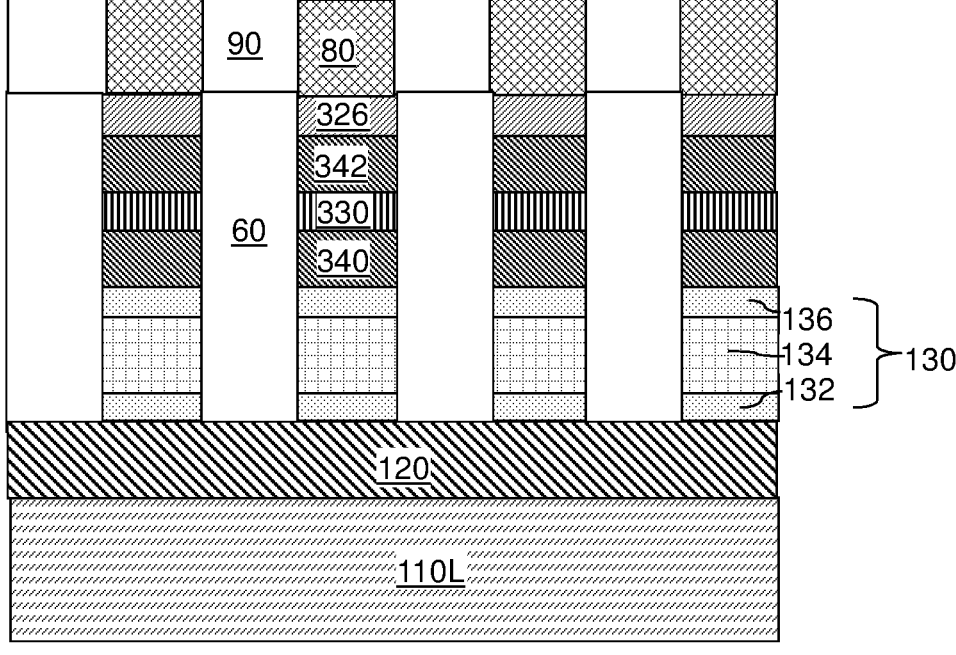

Referring to FIG. 27, the first substrate 10L may optionally be removed from the second electrically conductive lines 80 and reused to form additional memory devices. The first substrate may be removed by any suitable method. For example, the first substrate 10L may be removed by implanting hydrogen or deuterium into the bottom of the first substrate to form an implanted layer followed by annealing the first substrate to cleave the first substrate along the implanted layer, similar to the method described in the first embodiment. Alternatively, the first substrate 10L may be removed by grinding and polishing, as described in the second embodiment. Alternatively, a release layer (e.g., silicon oxide or silicon nitride layer) may be formed between the first substrate 10L and the second electrically conductive lines 80, followed by selectively etching the release layer to remove the first substrate 10L.

In a fourth embodiment of the present disclosure, the memory device comprises a magnetoresistive random access memory ("MRAM") device rather than a FTJ memory device. Each memory cell of the MRAM device may contain a magnetic tunnel junction (MTJ). In one embodiment, the MRAM device may comprised a spin-transfer torque (STT) type MRAM device.

The MTJ may be damaged by the reactive ion etch (RIE) used to pattern thick overlying word or bit lines. Therefore, in the fourth embodiment, the MTJ is formed over a first set of patterned lines (e.g., word lines or bit lines) located over a first substrate. The first set of patterned lines are patterned by RIE prior to deposition of the MTJ. The second set of patterned lines (e.g., the other ones of the word lines or bit lines) are formed over a second substrate followed by bonding the second set of patterned lines to a layer stack containing the MTJ. In the fourth embodiment, the MTJ is not exposed to an extended reactive etch process which etches thick conductive lines. This reduces or prevents damage of the MTJ.

Figure 28A:
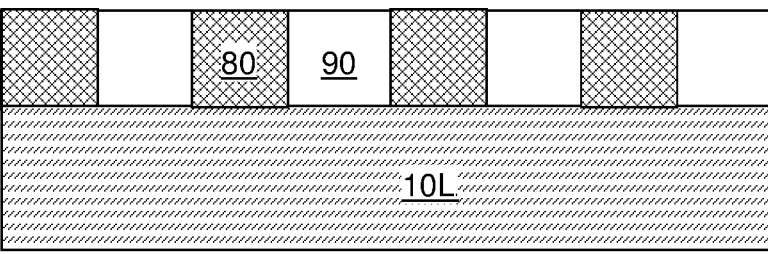
FIGS. 28A, 29, 30, 31A, 32 and 33 are vertical cross-sectional views of steps in a method of forming a fourth exemplary structure according to the fourth embodiment of the present disclosure.
Figure 28B:
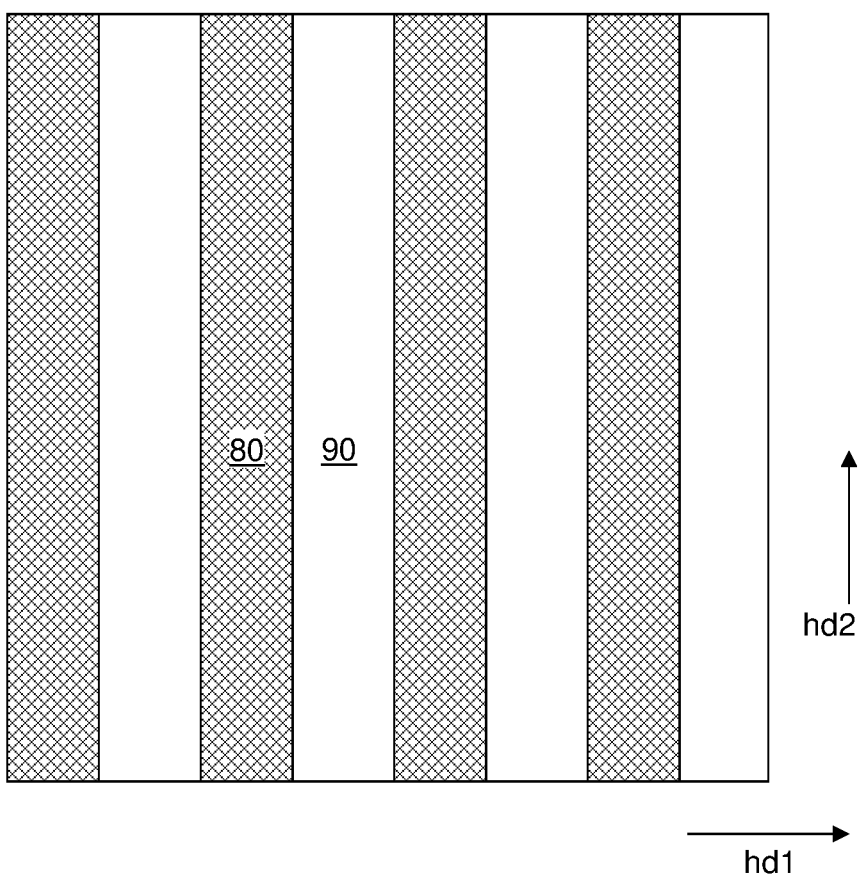
FIGS. 28B and 31B are top-down views of the fourth exemplary structure of FIGS. 28A and 31A, respectively.

Referring to FIGS. 28A and 28B, the second electrically conductive lines 80 and the second dielectric material rails 90 are formed over the first substrate 10L. The second electrically conductive lines 80 may be formed by depositing one or more electrically conductive layers described in the prior embodiments, followed by patterning the one or more electrically conductive layers by reactive ion etching (RIE) to form the lines 80. The second dielectric rails 90 are then formed between the second electrically conductive lines 80 by depositing the dielectric material layer between the second electrically conductive lines 80 and planarizing the dielectric material layer.

Figure 29:
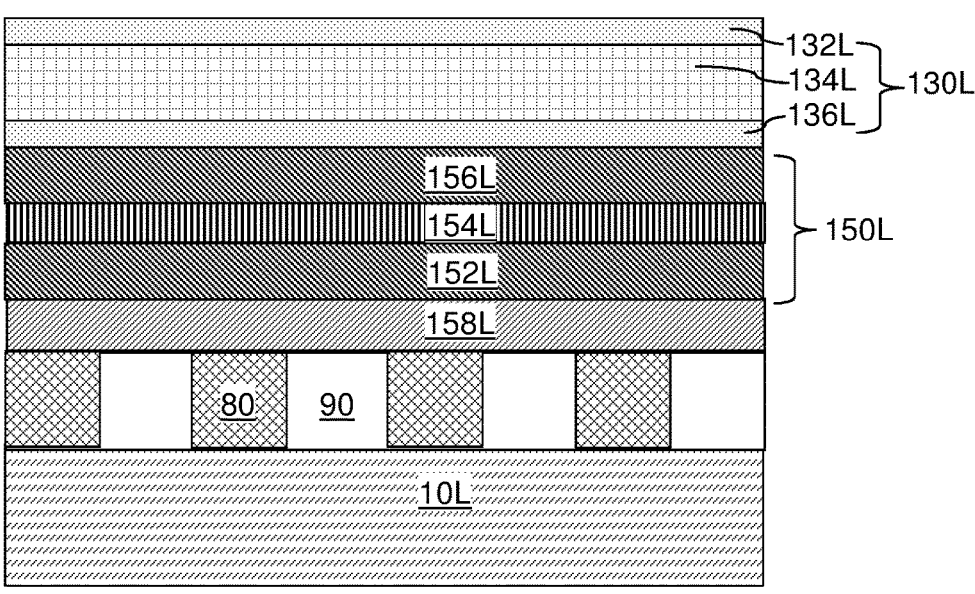

Referring to FIG. 29, a layer stack including an optional metallic cap layer 158L and a MTJ stack 150L is formed over the second electrically conductive lines 80 and the second dielectric material rails 90 located over the first substrate 10L. The stack includes, from bottom to top or from top to bottom, the metallic cap layer 158L, a reference layer 152L (which is also referred to as a magnetic pinned layer), a tunnel barrier layer 154L, and a free layer 156L, which together form an MTJ stack 150L of the STT MRAM memory cell. The thickness of the MTJ can be in a range from 10 nm to 40 nm, such as 20 nm to 30 nm.

The metallic cap layer 158L includes a nonmagnetic metallic material such as at least one nonmagnetic transition metal or a nonmagnetic transition metal alloy. For example, the metallic cap layer 158L may include, and or may consist essentially of, Ti, V, Cr, Mn, Zr, Nb, Mo, Tc, Ru, Rh, Hf, Ta, W, Re, Os, Ir, alloys thereof, or a conductive metallic nitride (e.g., TaN) or a conductive metallic carbide thereof. The metallic cap layer 158L maybe deposited by physical vapor deposition or chemical vapor deposition. The thickness of the metallic cap layer 158L may be in a range from 1 nm to 20 nm, such as from 2 nm to 10 nm, although lesser and greater thicknesses can also be employed.

The reference layer 152L can have a fixed magnetization direction which can be a horizontal direction or a vertical direction. The reference layer 152L can be formed as single ferromagnetic material layer or multiple ferromagnetic material layers that are magnetically coupled among one another to provide a same magnetization direction throughout. The reference layer 152L may include a Co/Ni multilayer structure or a Co/Pt multilayer structure. In one embodiment, the reference layer 152L can additionally include a thin non-magnetic layer comprised of tantalum or tungsten having a thickness in a range from 0.2 nm to 0.5 nm and a thin CoFeB layer having a thickness in a range from 0.5 nm to 3 nm. The thickness of the reference layer 152L can be in a range from 2 nm to 5 nm.

Optionally, the reference layer 152L may be provided in a synthetic antiferromagnet (SAF) structure that includes a hard layer (not expressly shown), an antiferromagnetic coupling layer (e.g., a Ru layer, not expressly shown), and the reference layer 152L. In case the reference layer 152L is provided as a component of an SAF structure, the magnetization of the hard layer and the magnetization of the magnetic pinned layer can be antiferromagnetically coupled through the antiferromagnetic coupling layer.

The tunnel barrier layer 154L can include a tunnel barrier dielectric material such as magnesium oxide or aluminum oxide. The tunnel barrier layer 154L can have a thickness in a range from 0.6 nm to 2 nm, such as from 0.8 nm to 1.2 nm. The tunnel barrier layer 154L contacts the reference layer 152L, and provides spin-sensitive tunneling of electrical currents between the reference layer 152L and the free layer 156L. In other words, the amount of electrical current that passes through the tunnel barrier layer 154L depends on the relative alignment of magnetization between the reference layer 152L and the free layer 156L, i.e., whether the magnetization directions are parallel or antiparallel to each other.

The free layer 156L can be formed as single ferromagnetic material layer or multiple ferromagnetic material layers that are magnetically coupled among one another to provide a same magnetization direction throughout. The thickness of the free layer 156L is less than 2 nm, and preferably less than 1.5 nm, such as from 0.8 nm to 1.5 nm.

For example, the free layer 156L can include a CoFeB layer and/or a CoFe layer. The free layer 156L can be programmed by flowing electrical current along a vertical direction either upward or downward. Additional layers (not shown) may be included in the MTJ 150.

The stack of the selector-level layers 130L is formed over the MTJ stack 150L. The selector-level layers 130L include the same layers as in the first embodiment (i.e., the lower electrode layer 132L, the selector material layer 134L, and the upper electrode layer 136L stacked up-side down compared to the first and second embodiments), and will not be described in more detail with respect to this fourth embodiment. The order of deposition of the metallic cap layer 158L and the stack of the selector-level layers 130L may be reversed, such that the stack of the selector-level layers 130L is formed between the MTJ stack 150L and the first substrate 10L, while the metallic cap layer 158L is formed over the MTJ stack 150L.

Figure 30:
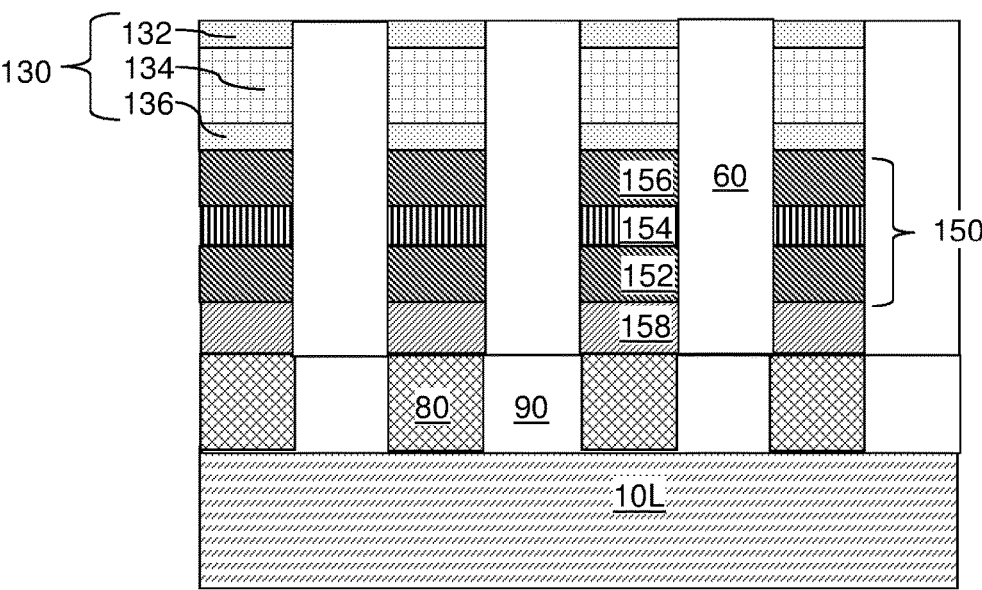

Referring to FIG. 30, the above described layers (158L, 152L, 154L, 156L, and 130L) are then patterned into memory pillar structures (158, 152, 154, 156, and 130). Any suitable patterning method may be used. For example, photolithography and etching may be used to pattern the stack of the selector-level layers 130L, while ion beam milling may be used to pattern the MTJ stack 150L and the metallic cap layer 158L to form the MTJ 150 and a metallic cap plate 158. The dielectric isolation structure 60 is then formed such that it laterally surrounds the two-dimensional array of memory pillar structures (158, 152, 154, 156, and 130).

Each memory pillar structure (158, 152, 154, 156, and 130) comprises a MRAM memory cell containing the MTJ 150 in which the tunnel barrier plate 154 located between reference layer plate 152 and the free layer plate 156. The metallic cap plate 158 is located on one side of the MTJ 150. A selector element 130 is located above or below the MTJ 150. The selector element includes a selector material plate 134 located between first and second electrode plates (132, 136) of the selector element 130.

Figure 31A:
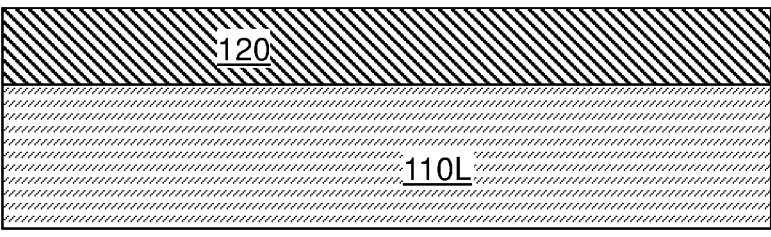
Figure 31B:
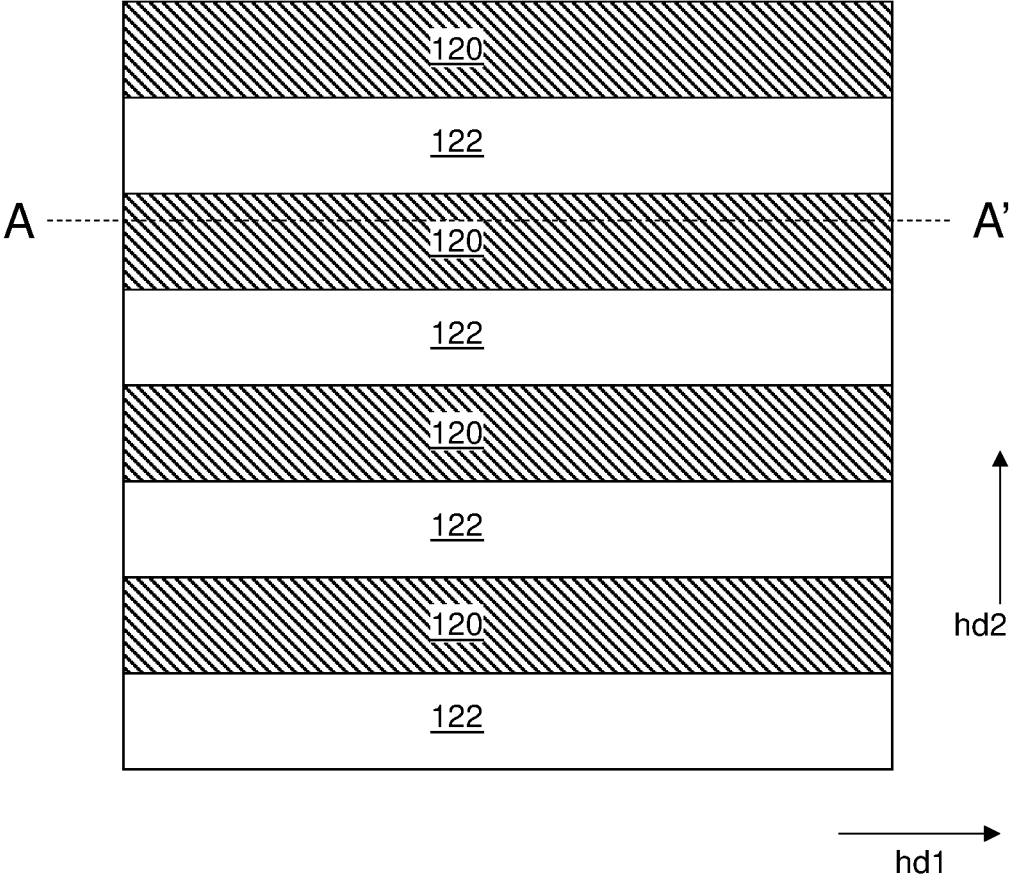

Referring to FIGS. 31A and 31B, the first electrically conductive lines 120 may be formed by depositing one or more electrically conductive layers over the second substrate 110L, followed by patterning the one or more electrically conductive layers by reactive ion etching (RIE) to form the lines 120. The first dielectric rails 122 are then formed between the first electrically conductive lines 120 by depositing the dielectric material layer between the first electrically conductive lines 120 and planarizing the dielectric material layer.

Figure 32:
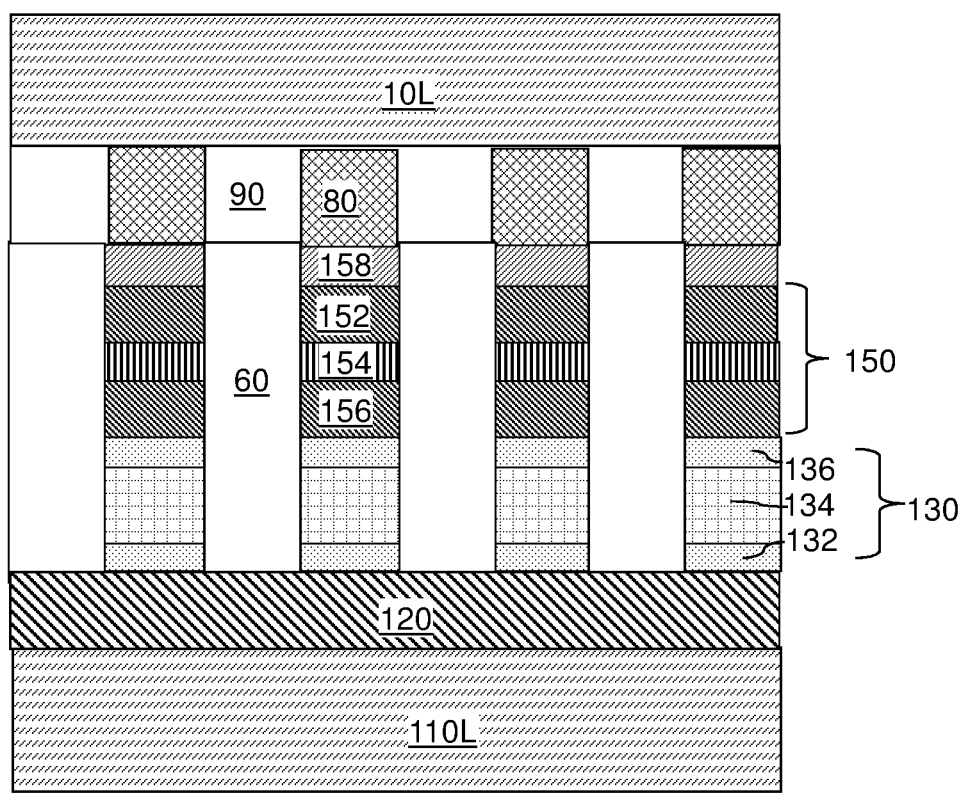

Referring to FIG. 32, the first electrically conductive lines 120 and the first dielectric rails 122 located over the second substrate 110L are bonded to dielectric isolation structure 60 and the array of memory pillar structures (158, 152, 154, 156, and 130) located over the first substrate 10L. Any suitable bonding may be used, such as metal to metal bonding, dielectric to dielectric bonding, or a combination thereof (i.e., hybrid bonding) may be used.

Figure 33:
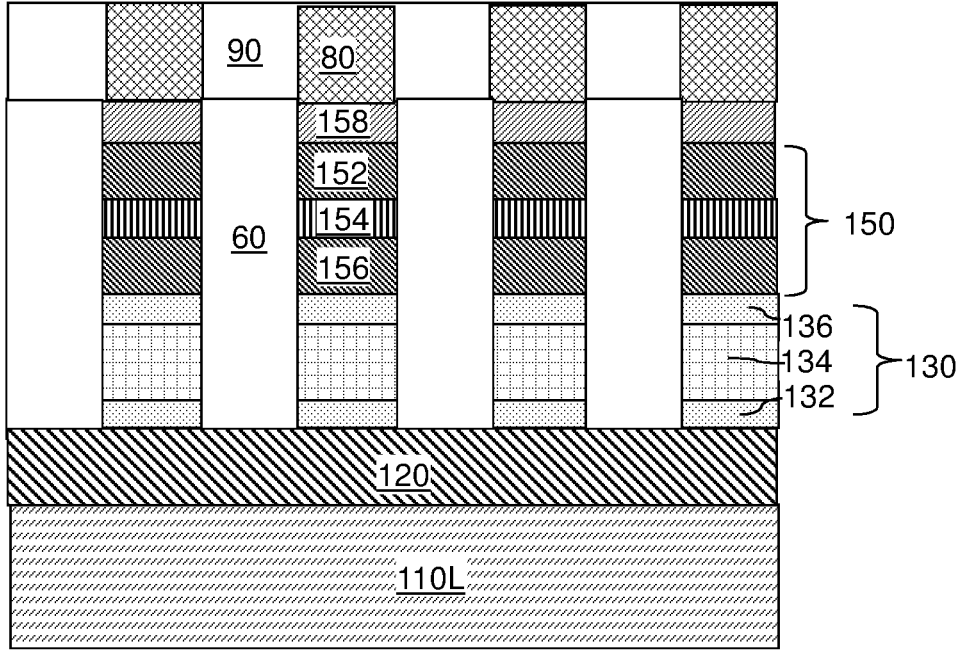

Referring to FIG. 33, the first substrate 10L may optionally be removed from the second electrically conductive lines 80 and reused to form additional memory devices. The first substrate may be removed by any suitable method. For example, the first substrate 10L may be removed by implanting hydrogen or deuterium into the bottom of the first substrate to form an implanted layer followed by annealing the first substrate to cleave the first substrate along the implanted layer, similar to the method described in the first embodiment. Alternatively, the first substrate 10L may be removed by grinding and polishing, as described in the second embodiment. Alternatively, a release layer (e.g., silicon oxide or silicon nitride layer) may be formed between the first substrate 10L and the second electrically conductive lines 80, followed by selectively etching the release layer to remove the first substrate 10L.

Figure 34:
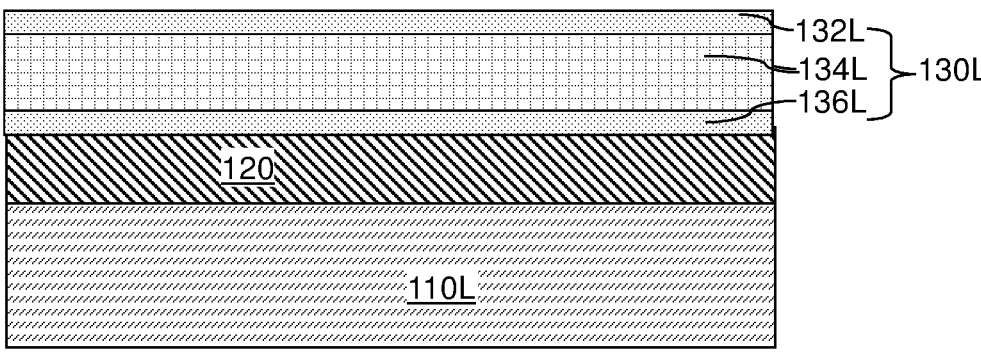
FIGS. 34, 35, 36, 37, 38 and 39 are vertical cross-sectional views of steps in a method of forming an alternative configuration of the fourth exemplary structure according to an alternative aspect of the fourth embodiment of the present disclosure.
Figure 35:
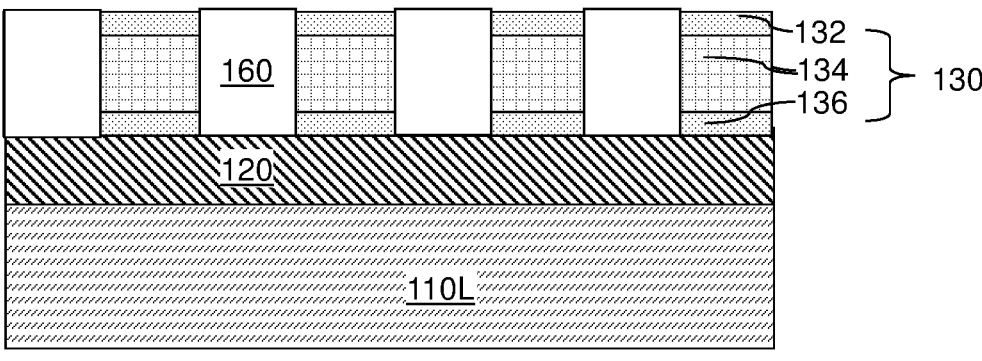

In a first alternative aspect of the fourth embodiment shown in FIG. 34, the stack of the selector-level layers 130L are formed over the first electrically conductive lines 120 located over the second substrate 110L instead of being formed over the MTJ stack 150L located over the first substrate 10L. If desired, the stack of the selector-level layers 130L may be patterned (e.g., by photolithography and etching) into selector elements 130 while located over the second substrate 100L, as shown in FIG. 35. A dielectric isolation structure 160 is then formed to surround the selector elements 130.

Figure 36:
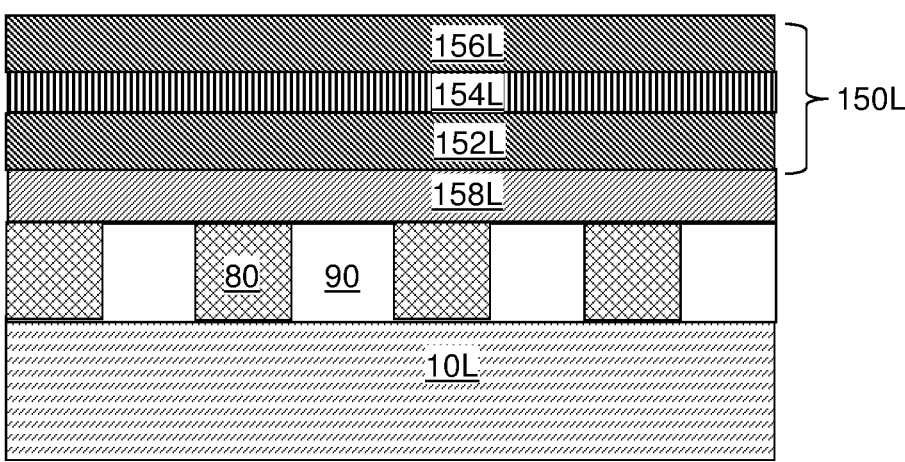
Figure 37:
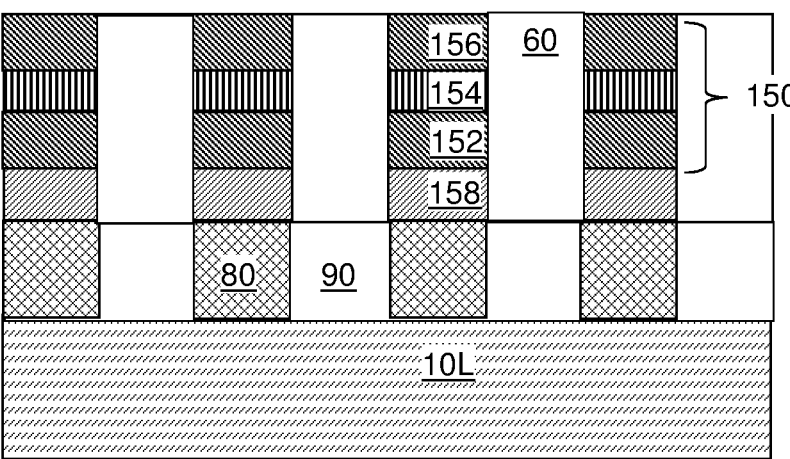

In this alternative aspect, the MTJ stack 150L and the optional metallic cap layer 158L are formed over the second electrically conductive lines 80 located over the first substrate 10L, as shown in FIG. 36. The MTJ stack 150L and the metallic cap layer 158L are patterned (e.g., by ion beam milling) while they are located over the first substrate 10L, as shown in FIG. 37 and as described above with respect to FIG. 24. A dielectric isolation structure 60 is then formed to surround the MTJ 150 pillars.

Figure 38:
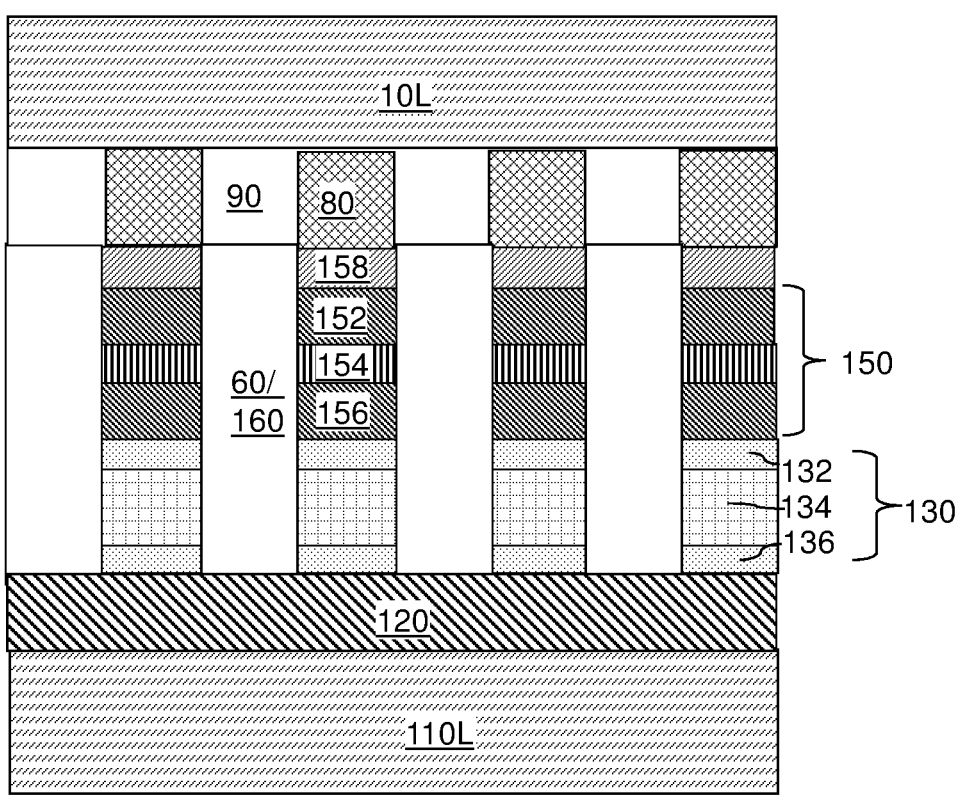

Then, as shown in FIG. 38, a second assembly comprising the stack of the selector-level layers 130L, the first electrically conductive lines 120 and the second substrate 110L is bonded to the first assembly containing the second electrically conductive lines 80, at least a portion of a memory cell (e.g., the MTJ 150) and the first substrate 10L. The MTJ 150 is located between the word lines and the bit lines after the bonding.

Figure 39:
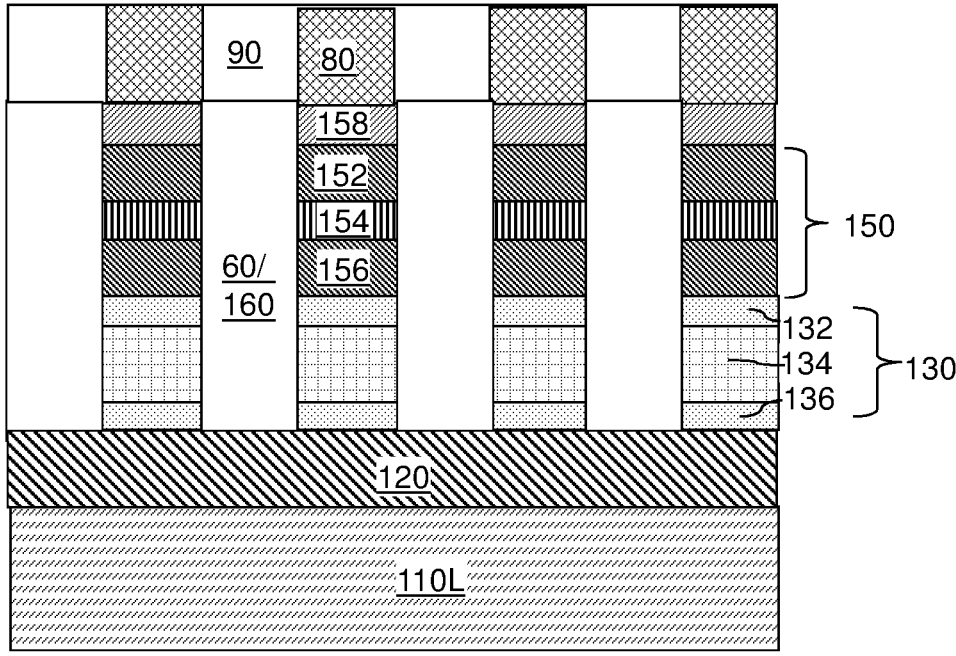

Finally, as shown in FIG. 39, the first substrate 10L is then removed. Each respective MTJ 150 forms a memory cell located in the same memory pillar structure (130, 150, 158) as its respective selector element 130.

In other alternative aspects of the fourth embodiment, the stack of the selector-level layers 130L may be patterned (e.g., by photolithography and etching) into selector elements 130 after the bonding step. In these other alternative aspects of the fourth embodiment, the MTJ stack 150L may be patterned into the MTJ 150 before or after the bonding step. Thus, the MTJ 150 is not damaged during high temperature deposition of the stack of the selector-level layers 130L and vice-versa. Furthermore, the selector element 130 is not damaged during ion beam milling of the MTJ stack 150L if the MTJ stack 150L is patterned over a different substrate from the substrate supporting the stack of the selector-level layers 130L.

Figure 40:
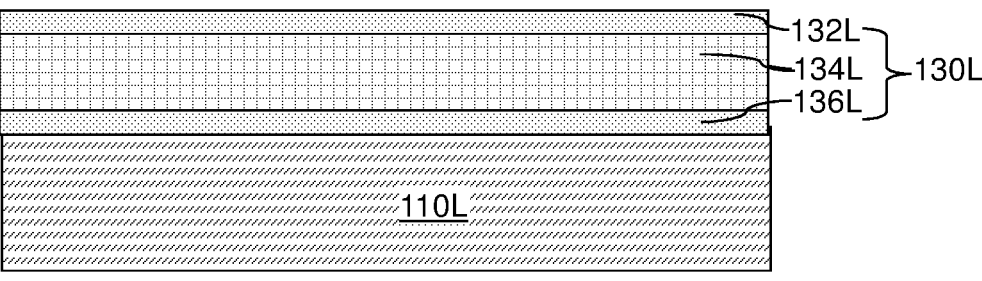
FIGS. 40, 41, 42, 43 and 44 are vertical cross-sectional views of steps in methods of forming other alternative configurations of the fourth exemplary structure according to other alternative aspects of the fourth embodiment of the present disclosure.
Figure 41:
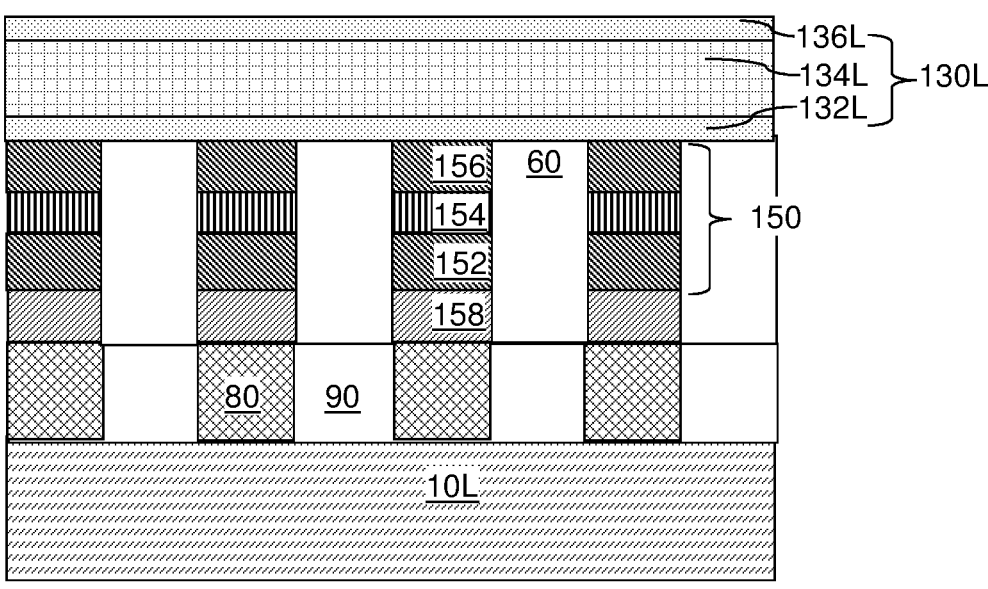
Figure 42:
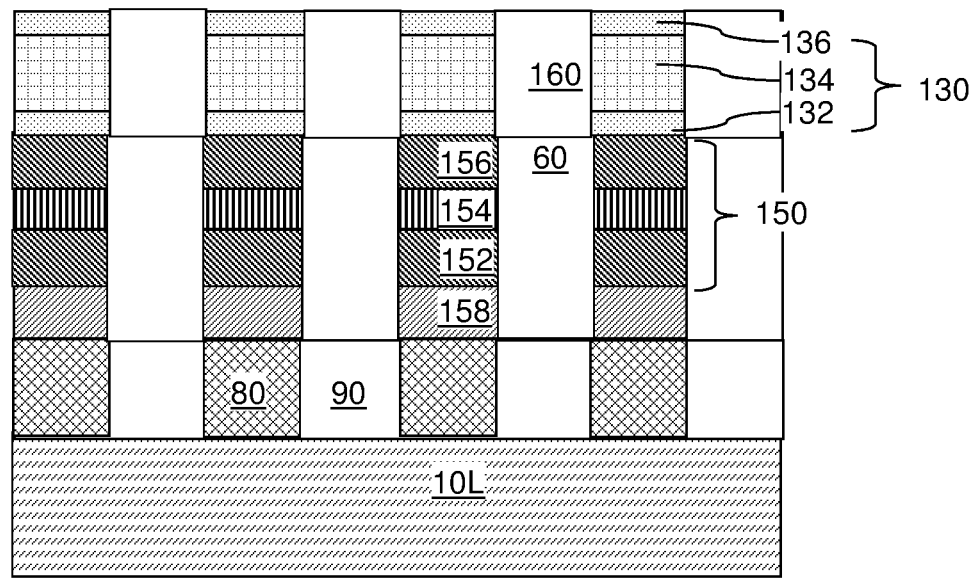

For example, the MTJ stack 150L may be patterned into the MTJ 150 before the bonding step, as shown in FIG. 37. The unpatterned stack of the selector-level layers 130L is provided over the second substrate 110L, as shown in FIG. 40. In this alternative aspect, the first electrically conductive lines 120 may be omitted from the second substrate 110L. The unpatterned stack of the selector-level layers 130L is then bonded to the MTJ 150 located over the first substrate 10L, as shown in FIG. 41. The second substrate 110L may be removed from the bonded assembly and the stack of the selector-level layers 130L is patterned (e.g., by photolithography and etching) into selector elements 130 after the bonding step. The dielectric isolation structure 160 is then formed to surround the selector elements 130, as shown in FIG. 42. The first electrically conductive lines 120 are then formed over the selector element 130, as described above.

Figure 43:
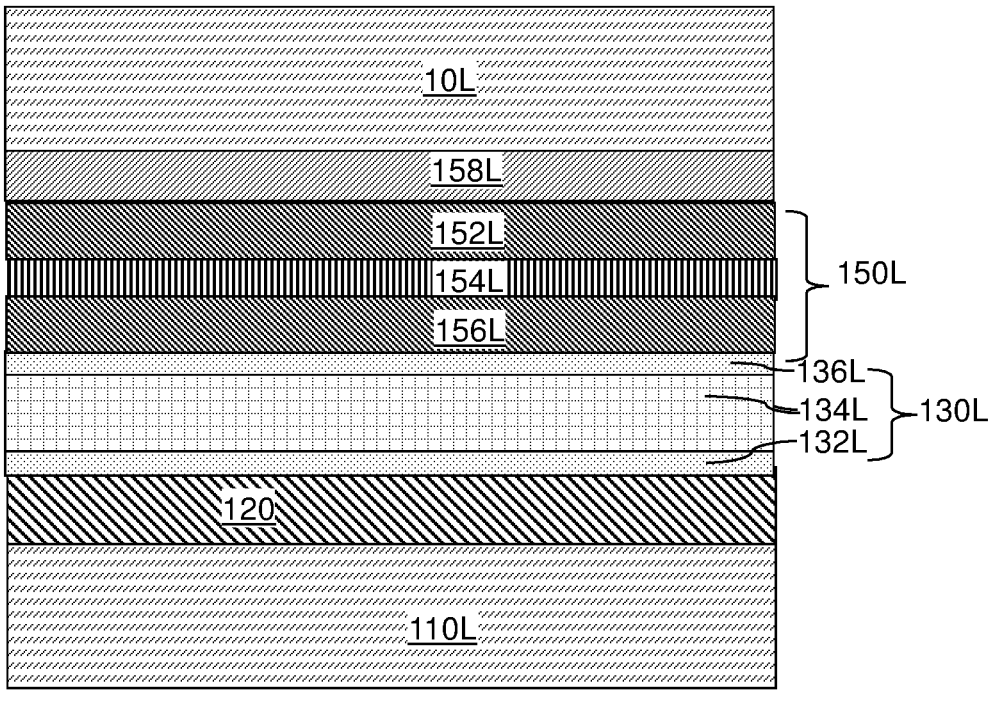
Figure 44:
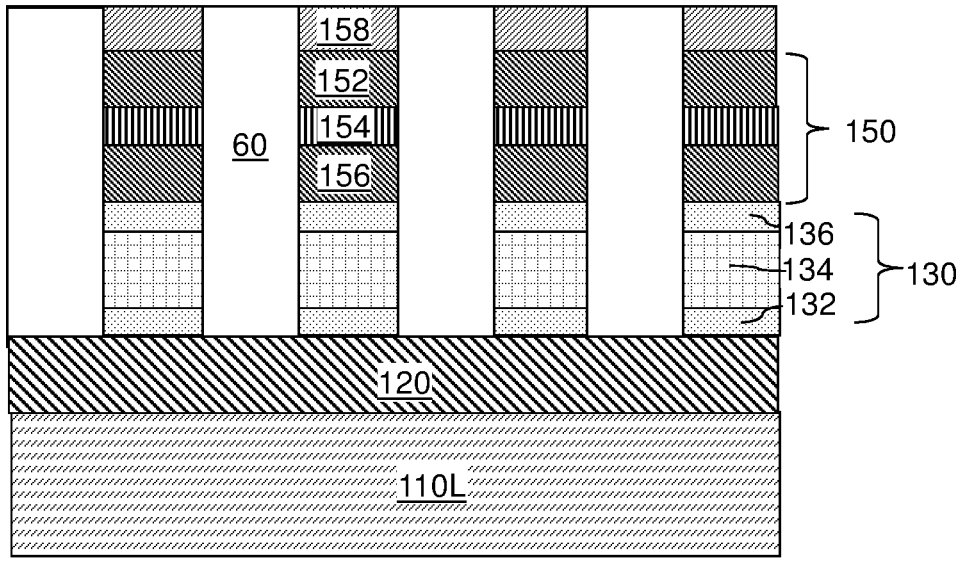

Alternatively, the MTJ stack 150L located over the first substrate 10L is bonded to the unpatterned stack of the selector-level layers 130L located over the first electrically conductive lines 120 over the first substrate 10L, as shown in FIG. 43. In this embodiment, the second electrically conductive lines 80 may be omitted from above the first substrate 10L. As shown in FIG. 44, the first substrate 10L may be removed from the bonded assembly. The MTJ stack 150L is patterned (e.g., by ion beam milling) into MTJs 150 and the stack of the selector-level layers 130L is patterned (e.g., by photolithography and etching) into selector elements 130 after the bonding step. If the MTJ stack 150L is patterned into the MTJs 150 after the bonding step, then the patterning of the stack of the selector-level layers 130L and the MTJ stack 150L may be carried out consecutively during a common patterning step using different etching or milling steps for each set of layers. The second electrically conductive lines 80 are then formed over the MTJ 150 as described above, to form the structure shown in FIG. 33.

The third and fourth embodiments provide a method of forming a memory device, such as a PCM or MRAM device, which comprises providing a first assembly comprising a first substrate 10L containing first electrically conductive lines comprising word lines or bit lines (e.g., 120 or 80), forming at least a portion of a memory cell (330, 150) over the first electrically conductive lines, providing a second assembly comprising a second substrate 110L containing second electrically conductive lines comprising other ones of word lines or bit lines (e.g., 80 or 120); and bonding the first assembly to the second assembly such that the memory cell is located between the first electrically conductive lines and the second electrically conductive lines. One of the first electrically conductive lines comprises a word line or bit line of the memory cell and one of the second electrically conductive lines comprises the other one of the word line or bit line of the memory cell.

The memory cell may be located in a memory pillar structure, which may also include a selector element 130 of the memory cell (330, 150) located in the memory pillar structure. The selector element 130 may comprise an ovonic threshold switch plate.

In the third embodiment illustrated in FIGS. 22-27, the memory device comprises the phase change memory (PCM) device, and the memory cell comprises a phase change memory cell comprising a phase change memory material plate 330. As discussed above, the method of the third embodiment includes forming selector-level layers 130L over a phase change material layer 330L located over electrically conductive lines 80 and the first substrate 10L, and patterning the selector-level layers 130L to form the selector element 130, and patterning the phase change material layer 30L to form the phase change material plate 330 prior to bonding the first assembly to the second assembly in which the selector element 130 is located between the electrically conductive lines 120 and the phase change material plate 330.

In the fourth embodiment, the memory device comprises a magnetoresistive random access memory (MRAM) device, and the memory cell comprises an MRAM memory cell comprising a magnetic tunnel junction (MTJ) 150 containing a tunnel barrier plate 154 located between a ferromagnetic reference plate 152 and a ferromagnetic free plate 156. As discussed above, the method of the fourth embodiment illustrated in FIGS. 28A-33 includes forming a MTJ stack 150L comprising a tunnel barrier layer 154L located between a ferromagnetic reference layer 152L and a ferromagnetic free layer 156L located over the electrically conductive lines 90 and the first substrate 10, forming selector-level layers 130L over the MTJ stack 150L, and patterning the selector-level layers and the MTJ stack to form the selector element 130 and the MTJ 150. The step of bonding the first assembly to the second assembly occurs after forming the selector element and the MTJ.

As discussed above, an alternative method of the fourth embodiment illustrated in FIGS. 34-39 includes forming a MTJ stack 150L comprising a tunnel barrier layer 154L located between a ferromagnetic reference layer 152L and a ferromagnetic free layer 156L located over electrically conductive lines 80 and the first substrate 10L, patterning the MTJ stack to form the MTJ 150, forming selector-level layers 130L over the electrically conductive lines 120 located over the second substrate 110L, and patterning the selector-level layers to form the selector element 130. The step of bonding the first assembly to the second assembly occurs after forming the selector element 130 and forming the MTJ 150 such that the selector element is bonded to the MTJ.

According to the first, second and fourth embodiments, a method of forming a memory device, such as the FTJ or MRAM device, comprises providing a first assembly comprising at least a portion of a memory cell (30, 150) located over a first substrate 10L, providing a second assembly comprising at least a portion of a selector element 130 located over a second substrate 110L, and bonding the first assembly to the second assembly such that the memory cell is bonded to its respective selector element.

The memory cell and the selector element may be located in a memory pillar structure, and the selector element may comprise an ovonic threshold switch plate, as described above. The method may also include removing at least one of the first substrate 10L or the second substrate 110L after the step of bonding the second layer stack to the first layer stack.

In the first and second embodiments illustrated in FIGS. 1A to 21B, the memory device comprises a ferroelectric tunnel junction (FTJ) memory device and the memory cell comprises a ferroelectric material layer 30 located between first and second electrodes (40, 50).

In the fourth embodiment, the memory device comprises a magnetoresistive random access memory (MRAM) device and the memory cell comprises an MRAM memory cell comprising a magnetic tunnel junction (MTJ) 150 containing a tunnel barrier plate 154 located between a ferromagnetic reference plate 152 and a ferromagnetic free plate 156.

The method of one alternative aspect of the fourth embodiment illustrated in FIGS. 34 to 39 includes forming a MTJ stack 150L comprising a tunnel barrier layer 154L located between a ferromagnetic reference layer 152L and a ferromagnetic free layer 156L located over the first substrate 10L, patterning the MTJ stack 150L to form the MTJ 150 over the first substrate 10L, forming selector-level layers 130L over the second substrate 110L, and pattering the selector-level layers 130L to form the selector element 130 over the second substrate 110L. The step of bonding the first assembly to the second assembly occurs after forming the selector element 130 and forming the MTJ 150 such that the selector element is bonded to the MTJ.

The method of another alternative aspect of the fourth embodiment illustrated in FIGS. 40 to 42 includes forming a MTJ stack 150L comprising a tunnel barrier layer 154L located between a ferromagnetic reference layer 152L and a ferromagnetic free layer 156L located over the first substrate 10L, patterning the MTJ stack 150L to form the MTJ 150, forming selector-level layers 130L over the second substrate 110L, removing the second substrate 110L, and pattering the selector-level layers 130L to form the selector element 130 after removing the second substrate 110L. The step of bonding the first assembly to the second assembly occurs after forming MTJ 150 and before patterning the selector-level layers 130L such that the selector-level layers 130L are bonded to the MTJ 150.

The method of yet another alternative aspect of the fourth embodiment illustrated in FIGS. 43 to 44 includes forming a MTJ stack 150L comprising a tunnel barrier layer 154L located between a ferromagnetic reference layer 152L and a ferromagnetic free layer 156L located over the first substrate 10L, removing the first substrate 10L, forming selector-level layers 130L over the second substrate 110L, patterning the MTJ stack 150L to form the MTJ 150 and pattering the selector-level layers 130L to form the selector element 130 after removing the first substrate 10L. The step of bonding the first assembly to the second assembly occurs before patterning the MTJ stack 150L and before patterning the selector-level layers 130L such that the selector-level layers 130L are bonded to the MTJ stack 150L.

The stacked and bonded memory device of any embodiment of the present disclosure may be repeated multiple times in the vertical direction to obtain a stacked memory device with multiple memory cell levels between multiple word line levels and bit line levels. For example, a second memory cell level (130, 140, 40, 30, 24, 50) may be formed by bonding over the second lines 80 followed by providing additional first lines 120 over the second memory cell level. Three or more memory levels may also be formed by continuing the bonding process.

Figure 45A:
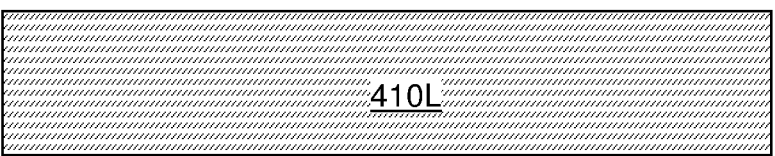
FIGS. 45A-45D are sequential vertical cross-sectional views of a first substrate during formation of a single crystalline semiconductor layer, a single crystalline ferroelectric material layer, and a first metallic material layer over a first substrate according to a fifth embodiment of the present disclosure.

Referring to FIG. 45A, a first substrate 410L for forming a fifth exemplary structure according to a fifth embodiment of the present disclosure is illustrated. Generally, the first substrate 410L can have a single crystalline semiconductor layer therein or thereupon. In one embodiment, the first substrate 410L which can be a single crystalline substrate on which a single crystalline semiconductor material can be subsequently grown. In one embodiment, the first substrate 410L may comprise an optically transparent single crystalline substrate. For example, the first substrate 410L may be a commercially available single crystalline sapphire substrate including and/or consisting of, a single crystalline sapphire wafer, such as a c-plane sapphire wafer having a top surface with a (0001) lattice plane orientation. Alternatively, the first substrate 410L may comprise a silicon substrate, such as a (111) silicon wafer having a top surface with a (111) lattice plane orientation.

Figure 45B:
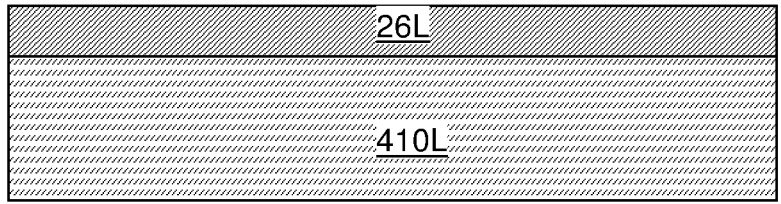

Referring to FIG. 45B, a single crystalline semiconductor layer 26L can be formed upon a top surface of the first substrate 410L by an epitaxial semiconductor deposition process. The single crystalline semiconductor layer 26L can include a single crystalline semiconductor material that can be grown by an epitaxial semiconductor deposition process. For example, the single crystalline semiconductor layer 26L can include, and/or can consist of, a single crystalline III-V compound semiconductor layer including a single crystalline III-V compound semiconductor material such as GaN, InN, AlN, GaAs, InAs, AlAs, GaP, InP, AsP, GaInN, GaInAs, AlGaN, AlGaAs, etc. In one embodiment, the single crystalline semiconductor layer 26L can include, and/or can consist of, a single crystalline GaN layer or a single crystalline AlN layer. In another embodiment, single crystalline semiconductor layer 26L includes the single crystalline AlN seed layer located on the first substrate 410L, and a single crystalline GaN layer located on the single crystalline AlN layer. In another embodiment, single crystalline semiconductor layer 26L includes a graded AlGaN layer in which the concentration of aluminum increases with increasing distance from the first substrate 410L.

Generally, the singe crystalline semiconductor material of the single crystalline semiconductor layer 26L can be epitaxially aligned to the single crystalline structure of the single crystalline material of the first substrate 410L. If the first substrate 410L comprises a single crystalline sapphire substrate and if the single crystalline semiconductor layer 26L comprises a single crystalline III-V compound semiconductor layer, then the single crystalline III-V compound semiconductor layer can be epitaxially aligned to the single crystalline structure of the single crystalline sapphire substrate. The thickness of the single crystalline semiconductor layer 26L may be in a range from 500 nm to 1,000 nm, such as from 100 nm to 500 nm, although lesser and greater thicknesses may also be employed.

Figures 45C, 45D:
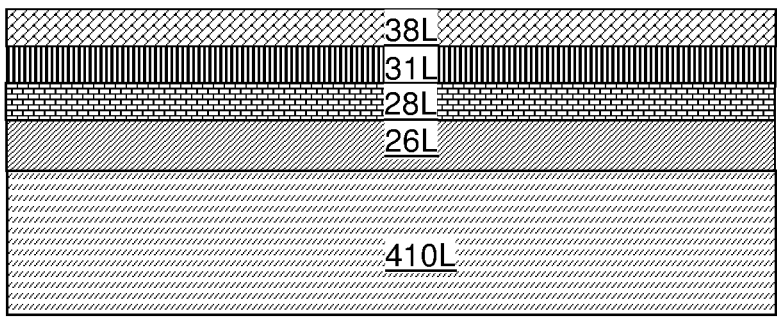

Referring to FIG. 45C, a first single crystalline metal layer 28L can be optionally formed by epitaxial growth of a first metal from physically exposed surfaces of the single crystalline semiconductor layer 26L. The first metal can have a lattice mismatch of less than 5%, such as less than 3%, with respective to the lattice constant of the single crystalline semiconductor material of the single crystalline semiconductor layer 26L to facilitate epitaxial alignment between the single crystalline structure of the first single crystalline metal layer 28L with the single crystalline structure of the single crystalline semiconductor layer 26L. In one embodiment, the first metal may be tungsten, molybdenum, or platinum. The thickness of the first single crystalline metal layer 28L may be in a range from 10 nm to 200 nm, such as from 20 nm to 100 nm, although lesser and greater thicknesses may also be employed. If present, the first single crystalline metal layer 28L may facilitate epitaxial growth of a single crystalline ferroelectric material layer 31L thereupon, and may improve the crystalline quality of the single crystalline ferroelectric material layer 31L.

A single crystalline ferroelectric material layer 31L can be epitaxially grown from the top surface of the first single crystalline metal layer 28L, or, in case the first single crystalline metal layer 28L is omitted, from the top surface of the single crystalline semiconductor layer 26L. The single crystalline ferroelectric material layer 31L may include any ferroelectric material that can be grown as a single crystalline ferroelectric material from the top surface of the first single crystalline metal layer 28L, or, in case the first single crystalline metal layer 28L is omitted, from the top surface of the single crystalline semiconductor layer 26L. Generally, the single crystalline ferroelectric material layer 31L can be epitaxially grown over the single crystalline semiconductor layer 26L with epitaxial alignment with the singe crystalline structure of the single crystalline semiconductor layer 26L.

In one embodiment, the single crystalline ferroelectric material layer 31L includes, and/or consists essentially of, a single crystalline ferroelectric material having a Wurtzite crystalline structure. In one embodiment, the single crystalline ferroelectric material comprises, and/or consists essentially of, at least one material selected from $Al_{1-x}Sc_xN$ where $0.25<x<0.45$, $Al_{1-y}B_yN$ where $0.02 \le x \le 0.15$, MgS, MgSe, AlN, GaN, $MgSiN_2$, $MgGeN_2$, $MgSnN_2$, $ZnSiN_2$, $ZnGeN_2$, $ZnSnN_2$, $MnGeN_2$, $LiSi_2N_3$, $LiGe_2N_3$, $Zn_2TaN_3$, $Zn_2NbN_3$, $Zn_2SbN_3$, $Mg_2SbN_3$, $Zn_3MoN_4$, $Zn_3WN_4$, $Mg_3MoN_4$, or $Mg_3WN_4$. Preferably, the single crystalline ferroelectric material comprises, and/or consists essentially of $Al_{1-x}Sc_xN$, where $0.25<x<0.45$, such as $0.3 \le x \le 0.35$. The single crystalline ferroelectric material layer 31L may be deposited by atomic layer deposition (ALD), molecular beam deposition, or physical vapor deposition, such as sputtering. In one embodiment, the thickness of the single crystalline ferroelectric material layer 31L may be in a range from 5 nm to 100 nm, such as from 10 nm to 50 nm, although lesser and greater thicknesses may also be employed.

A second single crystalline metal layer 38L can be optionally formed by epitaxial growth of a second metal from physically exposed surfaces of the single crystalline ferroelectric material layer 31L. The second metal can have a lattice mismatch of less than 5%, such as less than 3%, with respective to the lattice constant of the single crystalline ferroelectric material of the single crystalline ferroelectric material layer 31L to facilitate epitaxial alignment between the single crystalline structure of the second single crystalline metal layer 38L with the single crystalline structure of the single crystalline ferroelectric material layer 31L. In one embodiment, the second metal may be tungsten, molybdenum, or platinum. The thickness of the second single crystalline metal layer 38L may be in a range from 10 nm to 300 nm, such as from 30 nm to 100 nm, although lesser and greater thicknesses may also be employed. If present, the second single crystalline metal layer 38L may protect the single crystalline ferroelectric material layer 31L from degradation of single-crystallinity by avoiding direct contact with any non-single crystalline metallic material.

Referring to FIG. 45D, a first metallic material layer 40L can be formed on the second single crystalline metal layer 38L, or, in case a second single crystalline metal layer 38L is omitted, on the single crystalline ferroelectric material layer 31L. The first metallic material layer 40L may include any suitable bonding metallic material, such an elemental metal, such as W, Cu or Ru, and/or a conductive metallic compound material such as MoN, TiN, TaN or WN. The first metallic material layer 40L can be formed by chemical vapor deposition or by physical vapor deposition. The first metallic material layer 40L can have a thickness in a range from 5 nm to 50 nm, such as from 10 nm to 25 nm, although lesser and greater thicknesses may also be employed.

A first layer stack (26L, 28L, 31L, 38L, 40L) comprising the single crystalline ferroelectric material layer 31L and the first metallic material layer 40L is formed. The first layer stack (26L, 28L, 31L, 38L, 40L) may comprise, from bottom to top, the single crystalline semiconductor material layer 26L, the optional first single crystalline metal layer 28L, the single crystalline ferroelectric material layer 31L, the optional second single crystalline metal layer 38L, and the first metallic material layer 40L.

Figure 2B:
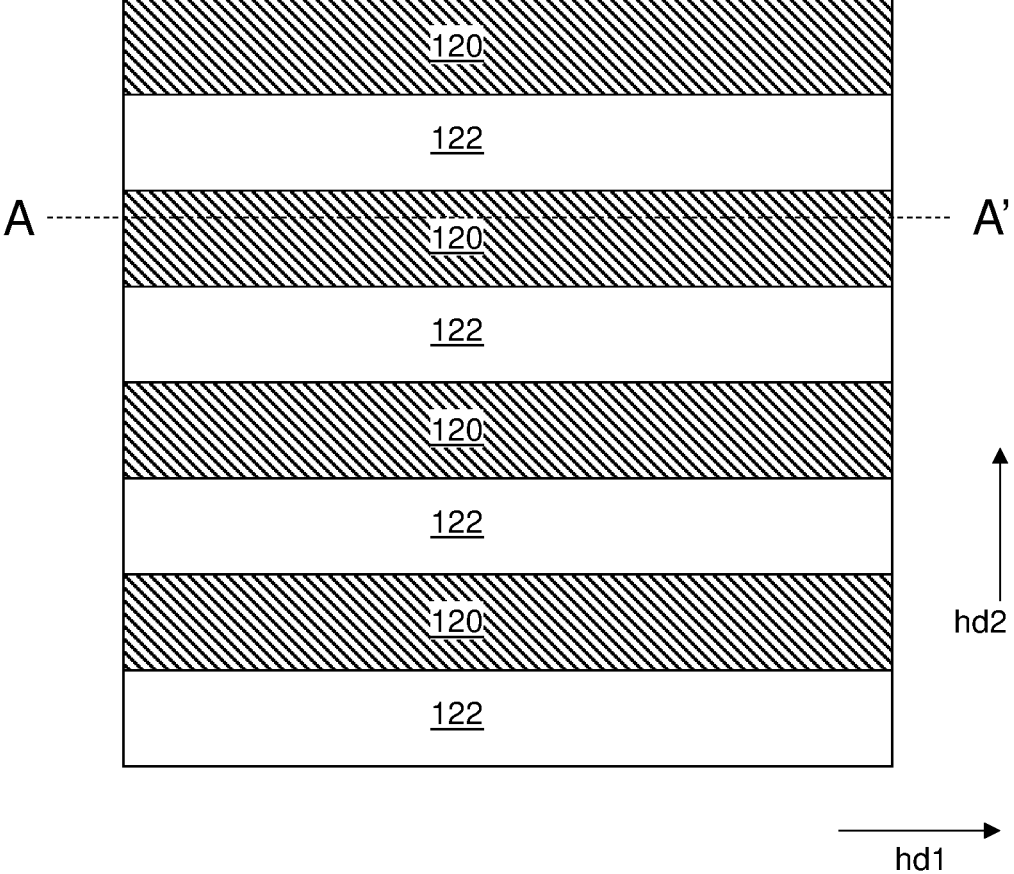
FIG. 2B is a top-down view of the structure of FIG. 2A.
Figure 46A:
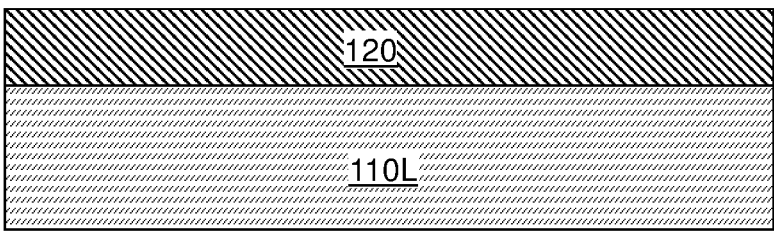
FIG. 46A is a vertical cross-sectional view a second substrate after formation of fifth electrically conductive lines laterally spaced by first dielectric rails thereupon according to a fifth embodiment of the present disclosure.
Figure 46B:
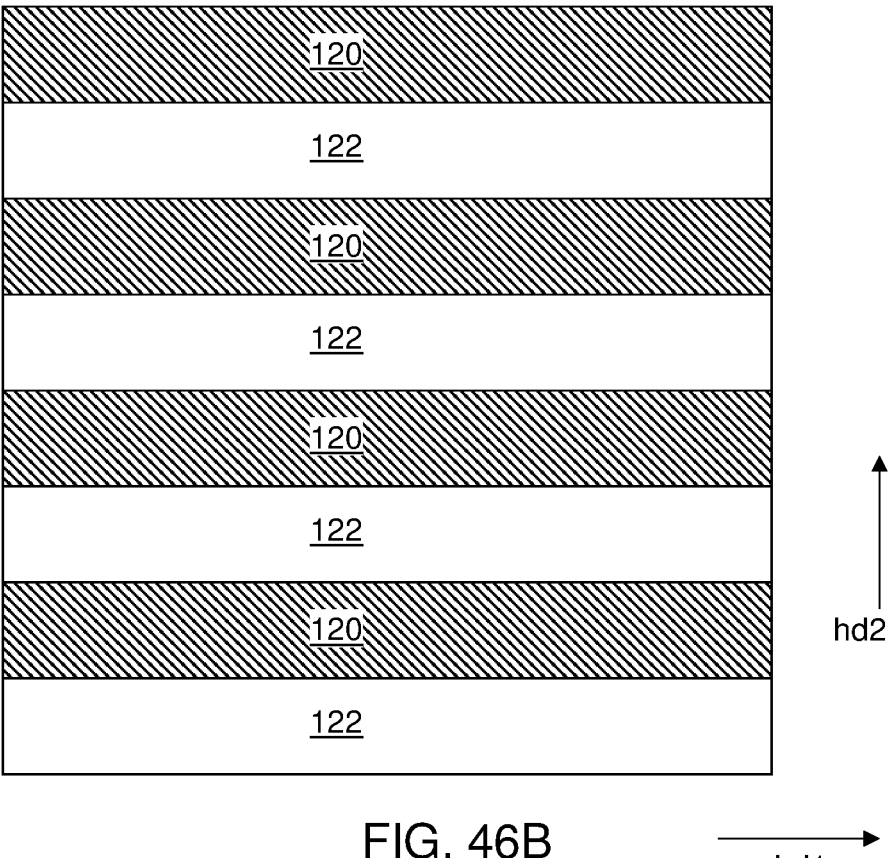
FIG. 46B is a top-down view of the structure of FIG. 46A.

Referring to FIGS. 46A and 46B, the processing steps of FIGS. 2A and 2B can be performed to form first electrically conductive lines 120 laterally spaced by first dielectric rails 122 over a second substrate 110L.

Figure 47:
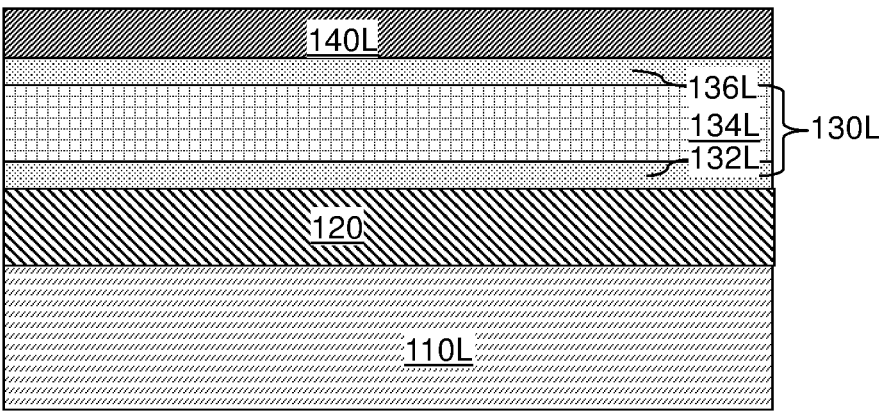
FIG. 47 is a vertical cross-sectional view of the second substrate after formation of a lower electrode layer, a selector material layer, an upper electrode layer, and a second metallic material layer thereupon according to the fifth embodiment of the present disclosure.

Referring to FIG. 47, a second layer stack including a non-Ohmic material layer and a second metallic material layer 140L can be formed over the first electrically conductive lines 120 and the first dielectric rails 122. The non-Ohmic material layer includes a non-Ohmic material, such as a selector material, for example an ovonic threshold switch (OTS) material. In one embodiment, the processing steps of FIG. 3 can be performed to form the selector-level layers 130L comprising layers 132L, 134L and 136L below the a second metallic material layer 140L. In this case, a second layer stack (132L, 134L, 136L, 140L) can include, from bottom to top, a lower electrode layer 132L, a selector material layer 134L, an upper electrode layer 136L, and a second metallic material layer 140L. The second layer stack is located over the first electrically conductive lines 120 and the first dielectric rails 122.

Figure 48:
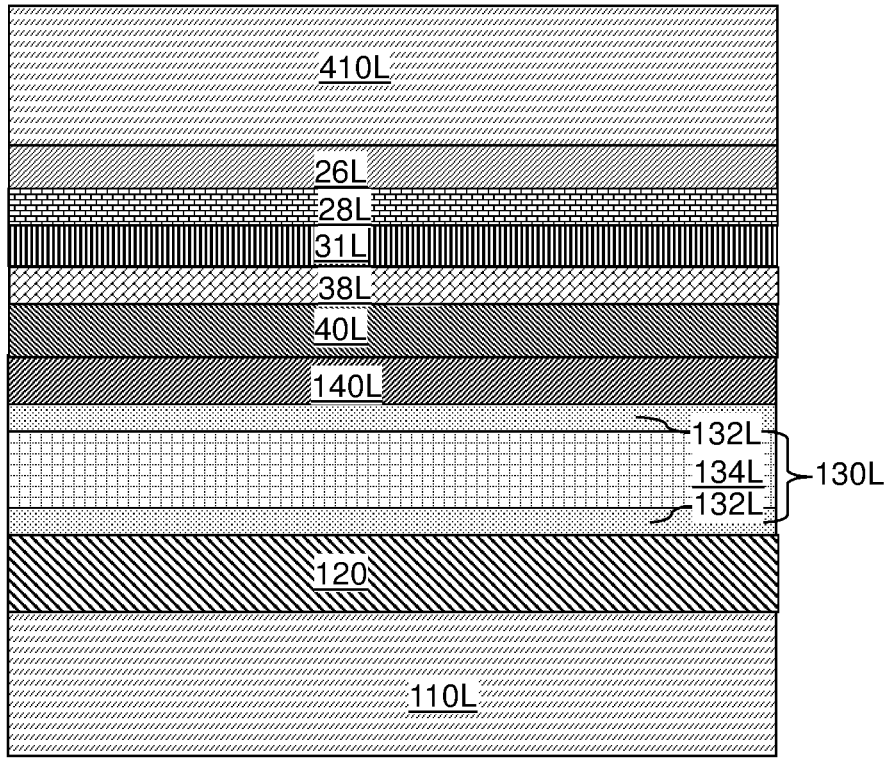
FIG. 48 is a vertical cross-sectional view of a fifth exemplary structure after bonding the second metallic material layer to the first metallic material layer according to the fifth embodiment of the present disclosure.

Referring to FIG. 48, the processing steps of FIG. 4 can be performed to bond the second metallic material layer 140L and the first metallic material layer 40L. In one embodiment, the second layer stack (132L, 134L, 136L, 140L) can be bonded to the first layer stack (26L, 28L, 31L, 38L, 40L) by inducing metal-to-metal bonding between the second metallic material layer 140L and the first metallic material layer 40L. An assembly of the first substrate 410L, the first layer stack (26L, 28L, 31L, 38L, 40L), the second layer stack (132L, 134L, 136L, 140L), the first electrically conductive lines 120 and the first dielectric rails 122, and the second substrate 110L can be formed.

Figure 49:
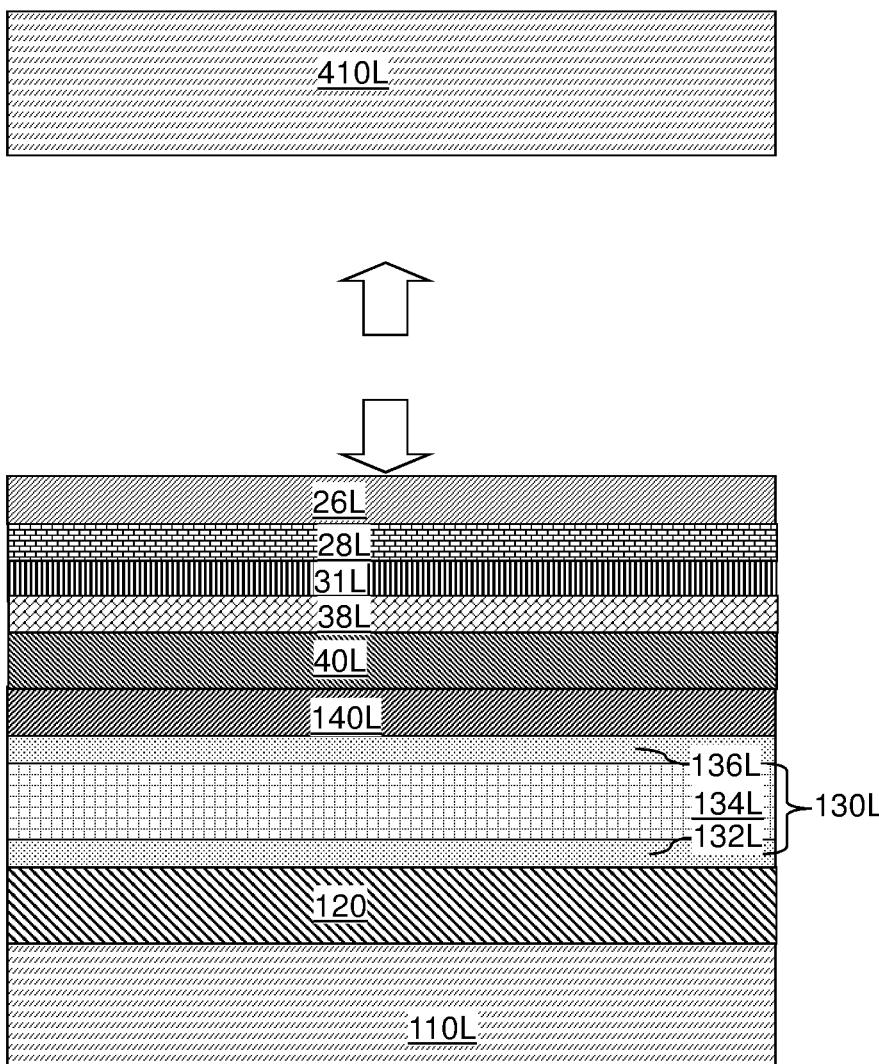
FIG. 49 is a vertical cross-sectional view of the fifth exemplary structure after detaching the first substrate by laser irradiation according to the fifth embodiment of the present disclosure.

Referring to FIG. 49, a laser beam can be irradiated through the optically transparent single crystalline material of the first substrate 410L onto the single crystalline semiconductor layer 26L. Surface portions of the single crystalline semiconductor layer 26L in proximity to the first substrate 410L can be ablated by the laser irradiation in a laser lift-off process. In an illustrative example, the first substrate 410L may comprise a single crystalline sapphire substrate, and the single crystalline semiconductor layer 26L may comprise a single crystalline III-V compound semiconductor layer. In this case, the single crystalline III-V compound semiconductor layer can be heated by irradiating a laser beam through the single crystalline sapphire substrate onto the single crystalline III-V compound semiconductor layer. The single crystalline sapphire substrate can be detached from the single crystalline III-V compound semiconductor layer. The wavelength of the laser beam can be selected to optimize absorption of the laser energy at a surface portion of the single crystalline semiconductor layer 26L. For example, if the single crystalline semiconductor layer 26L comprises a single crystalline III-V compound semiconductor material such as GaN, then the wavelength of the laser beam may be in a range from 100 nm to 600 nm, although shorter and longer wavelengths may also be employed. The detached first substrate 410L may be reused to form additional layer stacks using the steps illustrated in FIGS. 45A-45D.

Figure 50:
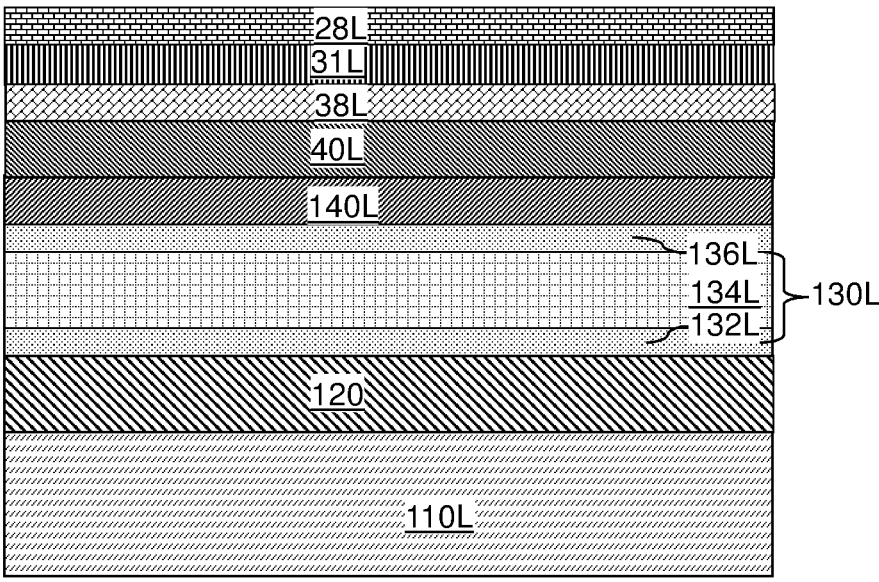
FIG. 50 is a vertical cross-sectional view of the fifth exemplary structure after removal of the single crystalline semiconductor layer according to the fifth embodiment of the present disclosure.

Referring to FIG. 50, remaining portions of the single crystalline semiconductor layer 26L can be removed, for example, by performing a selective etch process that etches the semiconductor material of the single crystalline semiconductor layer 26L selective to the material of the first single crystalline metal layer 28L or, in case the first single crystalline metal layer 28L is omitted, selective to the material of the single crystalline ferroelectric material layer 31L. The selective etch process may comprise an atomic layer etch process, a wet etch process, or a reactive ion etch process. The chemistry of the selective etch process can be selected so that collateral etching of the first single crystalline metal layer 28L (or the single crystalline ferroelectric material layer 31L) is reduced or avoided. Alternatively, the remaining portions of the single crystalline semiconductor layer 26L may be retained in the final device.

Figure 51:
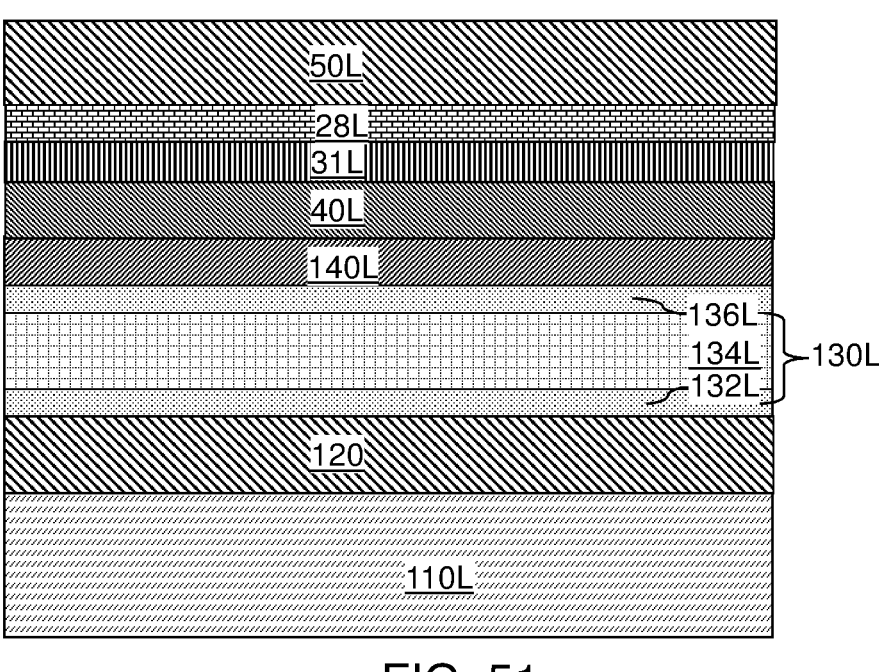
FIG. 51 is a vertical cross-sectional view of the fifth exemplary structure after formation of a metallic cap layer according to the fifth embodiment of the present disclosure.

Referring to FIG. 51, the processing steps of FIG. 6 can be performed to form a metallic cap layer 50L.

Figure 52:
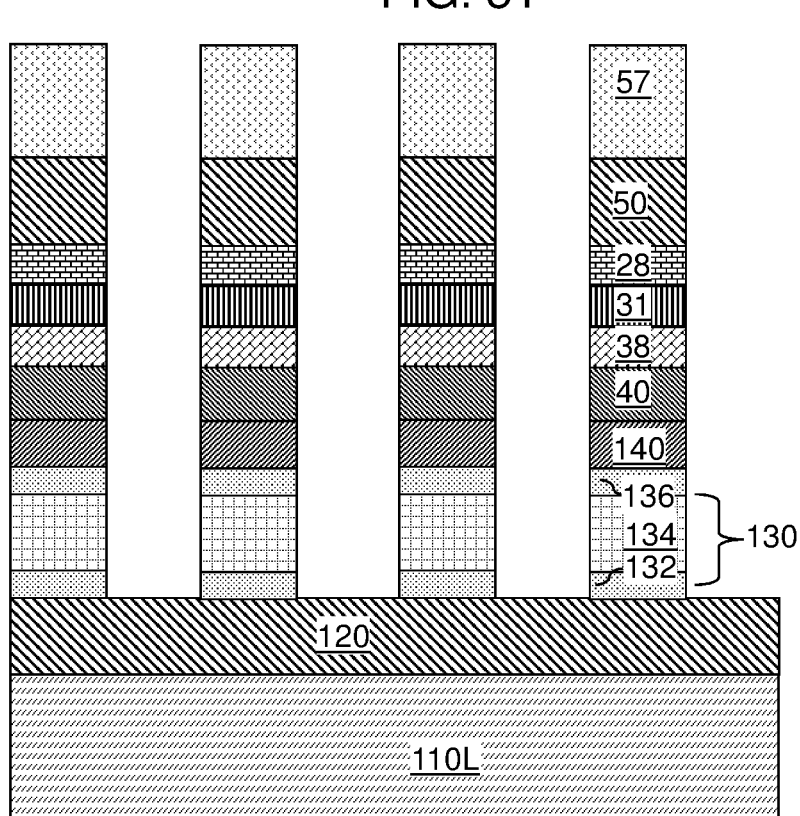
FIG. 52 is a vertical cross-sectional view of the fifth exemplary structure after formation of an array of memory pillar structures according to the fifth embodiment of the present disclosure.

Referring to FIG. 52, an array of discrete photoresist material portions 57 can be formed above the metallic cap layer 50L. In one embodiment, the array of discrete photoresist material portions 57 may be formed as a two-dimensional periodic array. The processing steps of FIG. 7 can be performed with any needed modifications to divide the layer stack including the metallic cap layer 50L, the optional remaining portions of the single crystalline semiconductor layer 26L (if any are left), the optional first single crystalline metal layer 28L, the single crystalline ferroelectric material layer 31L, the optional second single crystalline metal layer 38L, the first metallic material layer 40L, the second metallic material layer 140L, the upper electrode layer 136, the selector material layer 134L, and the lower electrode layer 132L. The etch chemistry of the anisotropic process employed at the processing steps of FIG. 7 can be modified to etch the optional first single crystalline metal layer 28L, the single crystalline ferroelectric material layer 31L, and the optional second single crystalline metal layer 38L in lieu of the combination of the distal single crystalline semiconductor layer 24L and the single crystalline ferroelectric material layer 30L.

Each patterned portion of the layer stack of the metallic cap layer 50L, the optional first single crystalline metal layer 28L, the single crystalline ferroelectric material layer 31L, the optional second single crystalline metal layer 38L, the first metallic material layer 40L, the second metallic material layer 140L, and the selector-level layers 130L comprises a memory pillar structure (130, 140, 40, 38, 31, 28, 50). Generally, at least one memory pillar structure (130, 140, 40, 38, 31, 28, 50) can be formed by patterning the layer stack of the metallic cap layer 50L, the optional first single crystalline metal layer 28L, the single crystalline ferroelectric material layer 31L, the optional second single crystalline metal layer 38L, the first metallic material layer 40L, the second metallic material layer 140L, and the selector-level layers 130L. In one embodiment, a two-dimensional periodic rectangular array of memory pillar structures (130, 140, 40, 38, 31, 28, 50) can be formed.

Each memory pillar structure (130, 140, 40, 38, 31, 28, 50) can include, from bottom to top, a selector element 130, a second metallic material plate 140, a first metallic material plate 40, an optional second single crystalline metal plate 38, a ferroelectric material plate 31, an optional first single crystalline metal plate 28, an optional single crystalline semiconductor plate (which comprises a patterned remaining portion of the single crystalline semiconductor layer 26L if present, and which is not shown in FIG. 52), and a metallic cap plate 50. Each selector element 130 is a patterned portion of the selector-level layers 130L. Each selector element 130 may include, from bottom to top, a lower electrode plate 132, a selector material plate 134, and an upper electrode plate 136. Each second metallic material plate 140 is a patterned portion of the second metallic material layer 140L. Each first metallic material plate 40 is a patterned portion of the first metallic material layer 40L. Each second single crystalline metal plate 38 is a patterned portion of the second single crystalline metal layer 38L. Each ferroelectric material plate 31 is a patterned portion of the single crystalline ferroelectric material layer 31L. Each first single crystalline metal plate 28 is a patterned portion of the first single crystalline metal layer 28L. Each single crystalline semiconductor plate (if present) is a patterned portion of the single crystalline semiconductor layer 26L. Each metallic cap plate 50 is a patterned portion of the metallic cap layer 50L.

Each memory pillar structure (130, 140, 40, 38, 31, 28, 50) can have at least one sidewall that extends from the top surface of the respective memory pillar structure (130, 140, 40, 38, 31, 28, 50) to the bottom surface of the memory pillar structure (130, 140, 40, 38, 31, 28, 50). Each sidewall may be vertical, substantially vertical, or may have a taper angle in a range from 1 degree to 15 degrees. The discrete photoresist material portions 57 can be subsequently removed, for example, by ashing. The memory pillar structures (130, 140, 40, 38, 31, 28, 50) can have horizontal cross-sectional shapes of a rectangle, a rounded rectangle, a circle, an ellipse, or any generally curvilinear two-dimensional closed shape.

Figure 53A:
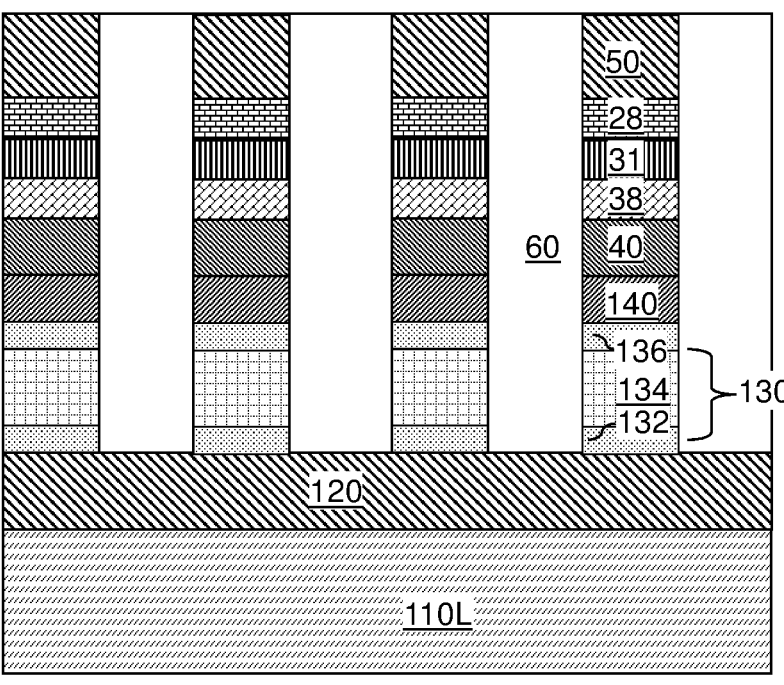
FIG. 53A is a vertical cross-sectional view of the fifth exemplary structure after formation of a dielectric isolation structure according to the fifth embodiment of the present disclosure.
Figure 53B:
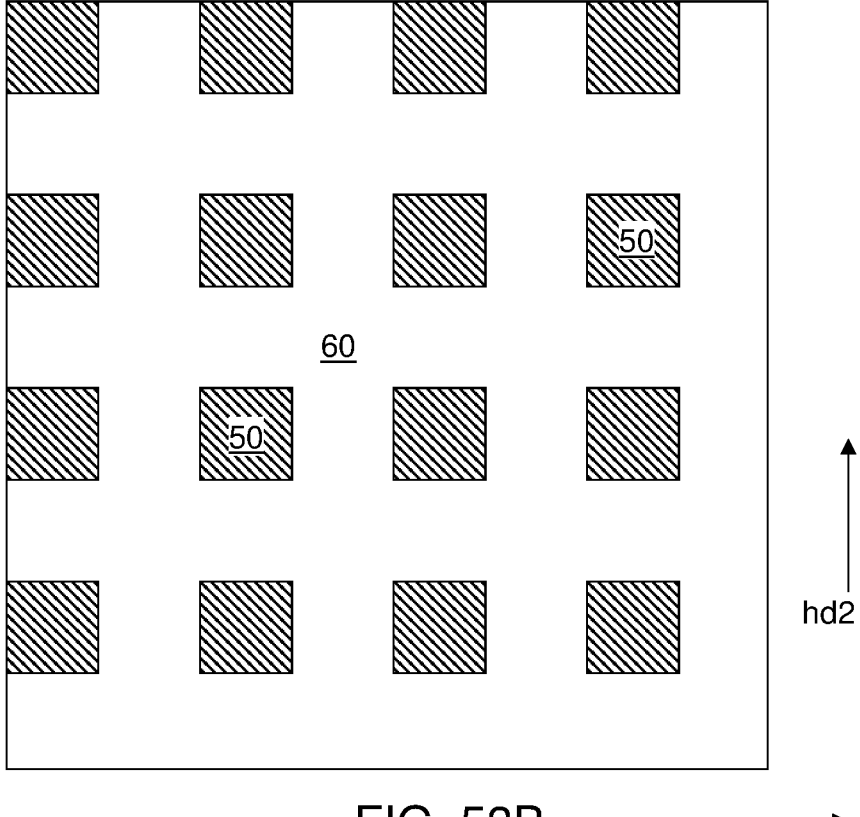
FIG. 53B is a top-down view of the fifth exemplary structure of FIG. 53A.

Referring to FIGS. 53A and 53B, the processing steps of FIGS. 8A and 8B can be performed with any needed changes to form a dielectric isolation structure 60. The top surface of the dielectric isolation structure 60 may be coplanar with the top surfaces of the memory pillar structures (130, 140, 40, 38, 31, 28, 50).

Figure 54A:
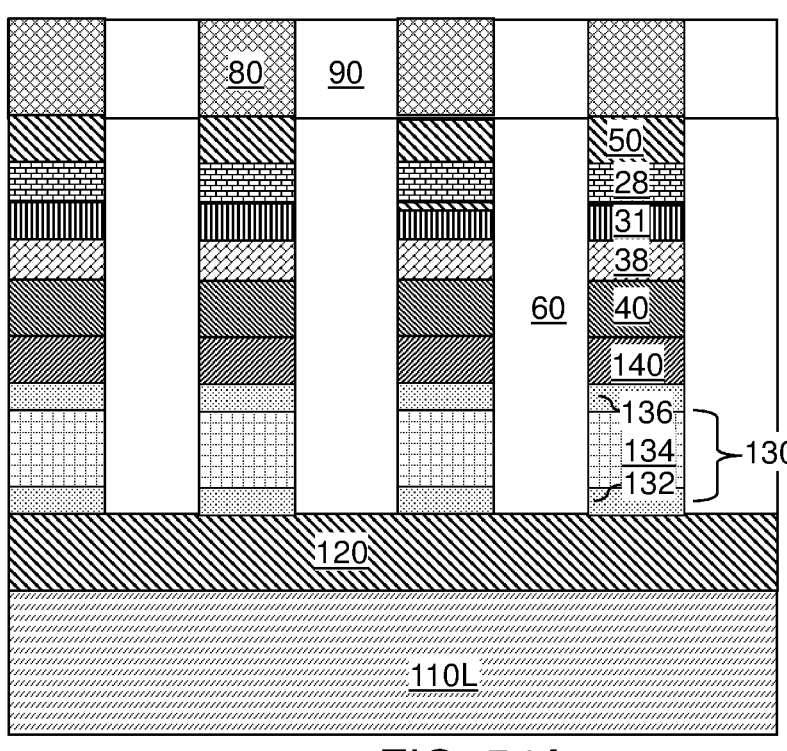
FIG. 54A is a vertical cross-sectional view of the fifth exemplary structure after formation of second electrically conductive lines laterally spaced by second dielectric rails according to the fifth embodiment of the present disclosure.
Figure 54B:
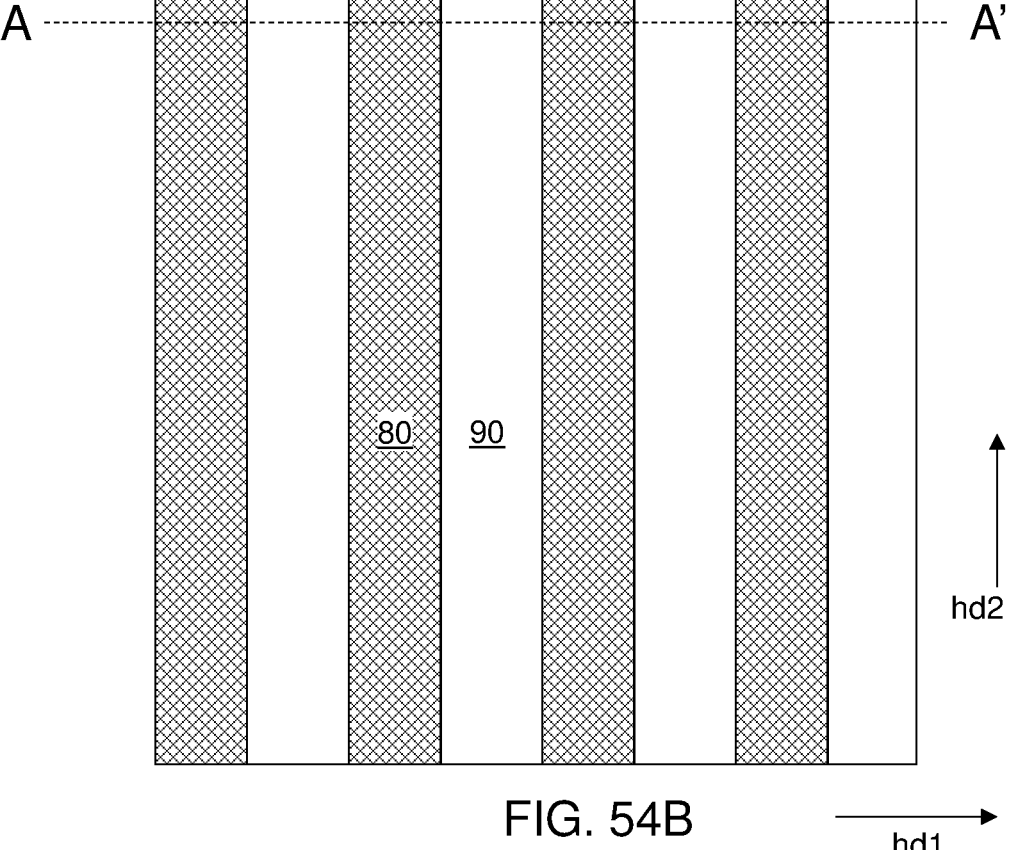
FIG. 54B is a top-down view of the fifth exemplary structure of FIG. 54A.

Referring to FIGS. 54A and 54B, second electrically conductive lines 80 and second dielectric rails 90 can be formed above the two-dimensional array of memory pillar structures (130, 140, 40, 38, 31, 28, 50) and the dielectric isolation structure 60 to provide the fifth exemplary structure. For example, the processing steps of FIGS. 9A and 9B can be performed to form the second electrically conductive lines 80 and the second dielectric rails 90.

Figure 54C:
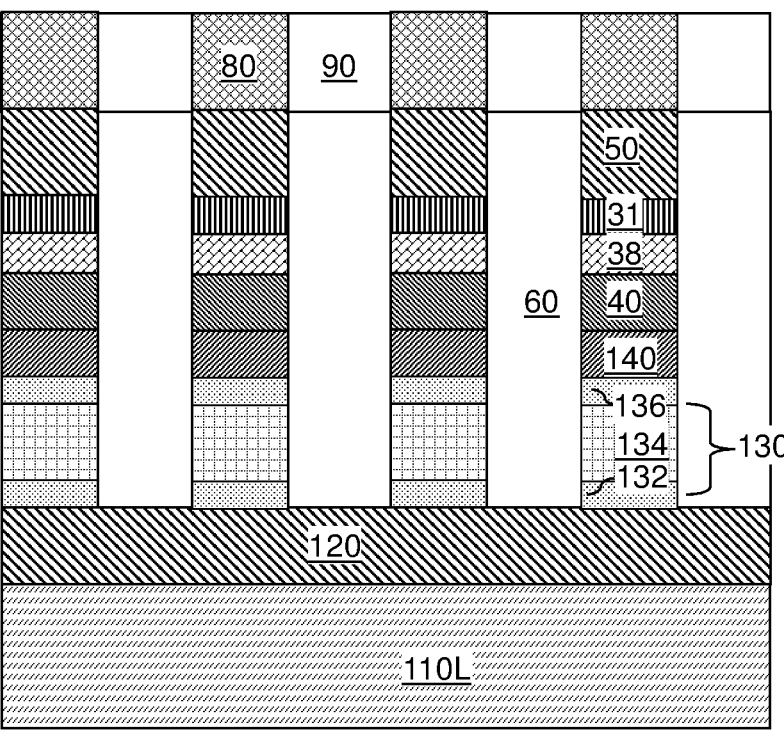
FIG. 54C is a vertical cross-sectional view of a first alternative configuration of the fifth exemplary structure.

Referring to FIG. 54C, a first alternative configuration of the fifth exemplary structure is illustrated, which can be derived from the fifth exemplary structure of FIGS. 54A and 54B by omitting formation of the first single crystalline metal layer 28L, and thus, omitting the first single crystalline metal plates 28.

Figure 54D:
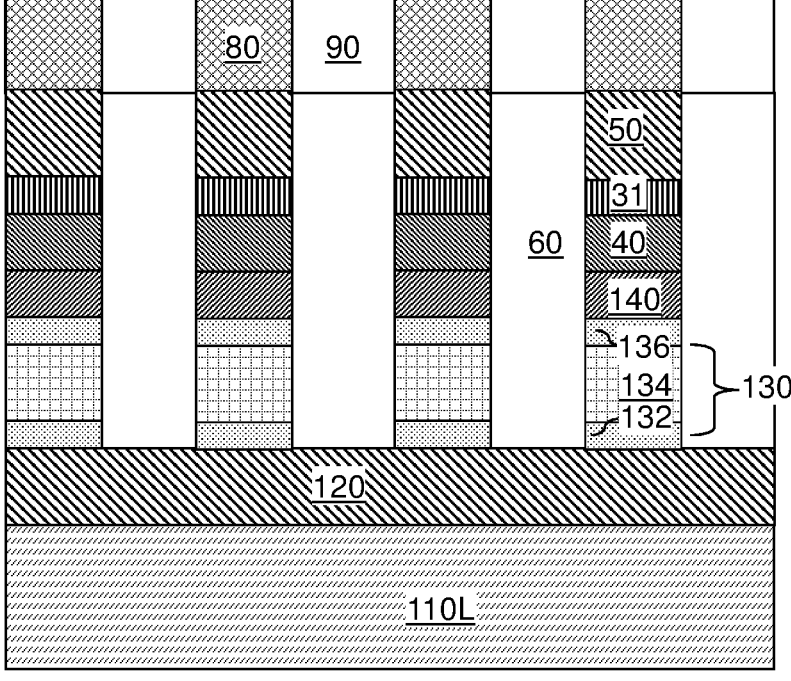
FIG. 54D is a vertical cross-sectional view of a second alternative configuration of the fifth exemplary structure.

Referring to FIG. 54D, a second alternative configuration of the fifth exemplary structure is illustrated, which can be derived from the first alternative configuration of the fifth exemplary structure of FIG. 54C by omitting formation of the second single crystalline metal layer 38L, and thus, omitting the second single crystalline metal plates 38.

Figure 55A:
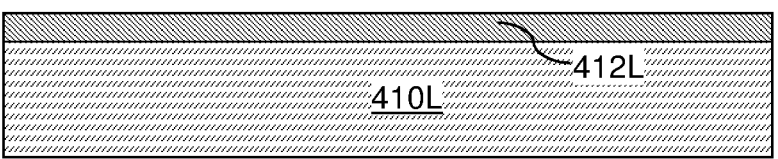
FIGS. 55A-55E are sequential vertical cross-sectional views of a first substrate during formation of a single crystalline semiconductor layer, a single crystalline ferroelectric material layer, a tunnel barrier layer, and a first metallic material layer over a first substrate according to a sixth embodiment of the present disclosure.

Referring to FIG. 55A, a first substrate 410L for forming a sixth exemplary structure is illustrated. The first substrate 410L may be the same as the first substrate illustrated in FIG. 45A. An epitaxial seed semiconductor layer 412L may be optionally grown on the top surface of the first substrate 410L. If employed, the epitaxial seed semiconductor layer 412L can reduce threading dislocations and the lattice mismatch between the single crystalline material of the first substrate 410L and the single crystalline semiconductor layer to be subsequently formed. In an illustrative example, if the first substrate 410L comprises a single crystalline sapphire substrate and if the single crystalline semiconductor layer to be subsequently formed comprises a single crystalline gallium nitride layer, the optional epitaxial seed semiconductor layer 412L may comprise a single crystalline aluminum nitride layer having a thickness in a range from 100 nm to 1,000 nm, although lesser and greater thicknesses may also be employed.

Figure 55B:
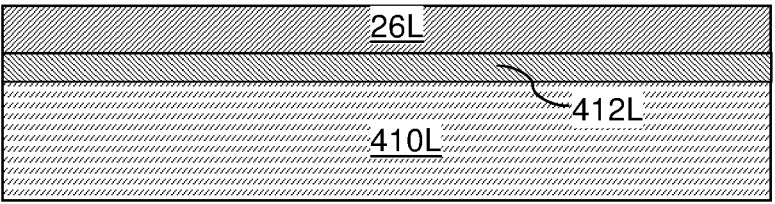

Referring to FIG. 55B, the processing steps of FIG. 45B can be performed to form a single crystalline semiconductor layer 26L.

Figure 55C:
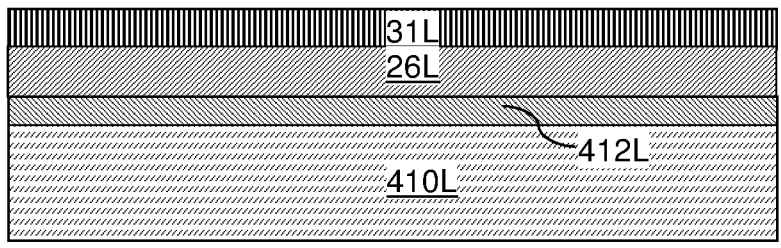

Referring to FIG. 55C, the processing steps of FIG. 45C can be performed to form an optional first single crystalline metal layer (not illustrated), a single crystalline ferroelectric material layer 31L, and an optional second single crystalline metal layer (not illustrated).

Figure 55D:
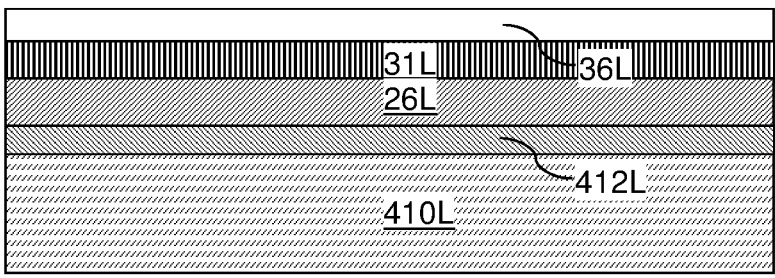

Referring to FIG. 55D, a tunnel barrier layer 36L can be formed over the single crystalline ferroelectric material layer 31L. The tunnel barrier layer 36L is a non-Ohmic material layer providing non-linear switching characteristics. Thus, the tunnel barrier layer 36L functions as the selector material layer in this embodiment. The tunnel barrier layer 36L includes a tunnel barrier layer that can provide a switching property depending on the magnitude of the voltage applied thereacross. In other words, the tunnelling dielectric layer 36L includes a material that becomes effectively conductive above a threshold voltage, and provides electrical isolation below the threshold voltage.

In one embodiment, the tunnel barrier layer 36L includes, and/or consists essentially of, magnesium oxide, aluminum oxide or a spinel material. As used herein, a "spinel" refers to a dielectric compound having a formula of $M_xQ_yO_z$, in which $0.95<x<1.05$, $1.95<y<2.05$ and $3.95<z<4.05$ and M and Q are different metals. In one embodiment, x=1, y=2 and z=4. Exemplary spinels include $MgAl_2O_4$, $ZnAl_2O_4$, $SiMg_2O_4$, $SiZn_2O_4$, $MgGa_2O_4$, doped derivatives therefrom in which a fraction of at least one metallic element is replaced with another metallic element while preserving the crystalline structure, and oxygen-deficient derivatives thereof. The tunnel barrier layer 36L may be single crystalline or polycrystalline. For example, the tunnel barrier layer 36L may comprise (111) MgO having top surface with a (111) lattice plane orientation. The tunnel barrier layer 36L may be deposited, for example, by physical vapor deposition. The thickness of the tunnel barrier layer 36L may be in a range from 0.3 nm to 3 nm, such as from 0.6 nm to 1.5 nm, although lesser and greater thicknesses may also be employed.

Figure 55E:
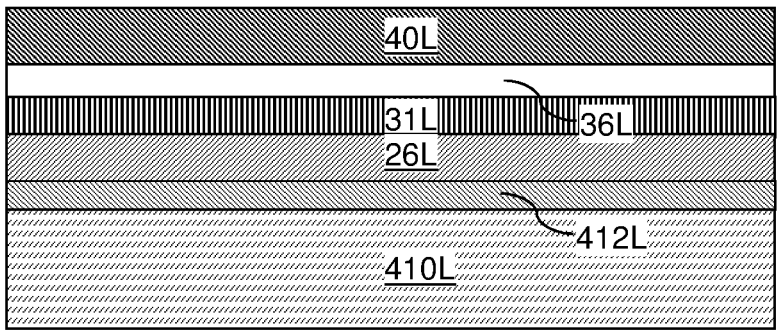

Referring to FIG. 55E, the processing steps of FIG. 45D can be performed to form the above described first metallic material layer 40L. A first layer stack including the single crystalline semiconductor layer 26L, an optional first single crystalline metal layer (not shown), the single crystalline ferroelectric material layer 31L, an optional second single crystalline metal layer (not shown), the tunnel barrier layer 36L, and the first metallic material layer 40L can be formed over the first substrate 410L.

Figure 56A:
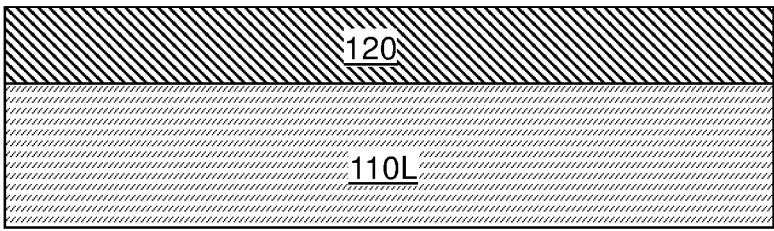
FIG. 56A is a vertical cross-sectional view a second substrate after formation of sixth electrically conductive lines laterally spaced by first dielectric rails thereupon according to a sixth embodiment of the present disclosure.
Figure 56B:
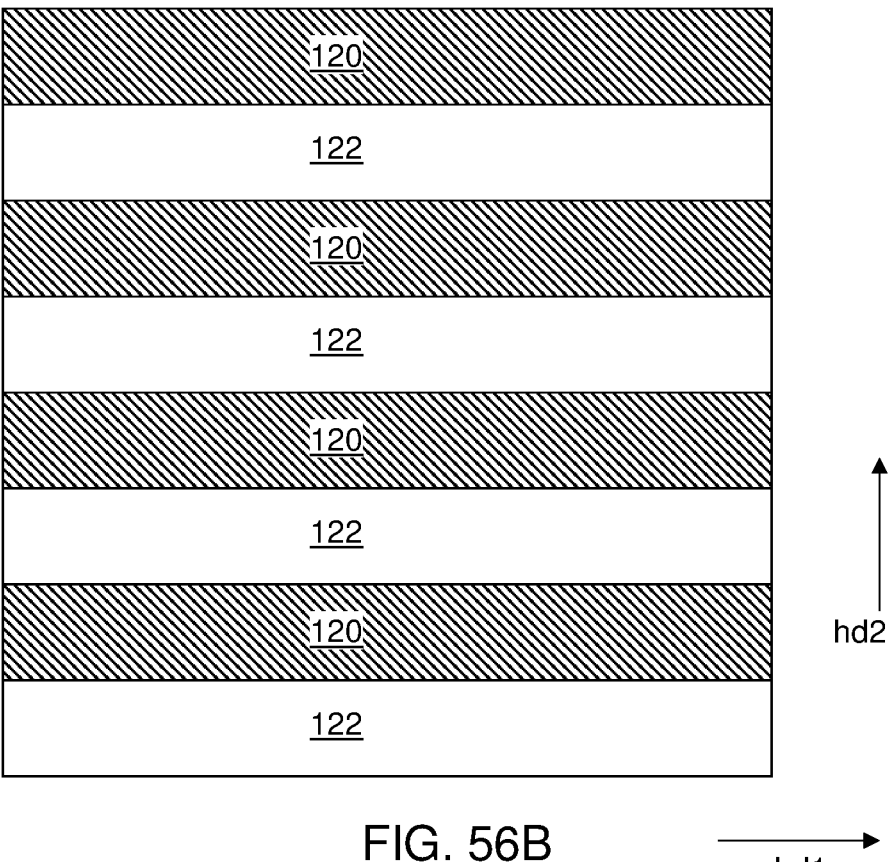
FIG. 56B is a top-down view of the structure of FIG. 56A.

Referring to FIGS. 56A and 56B, the processing steps of FIGS. 2A and 2B can be performed to form first electrically conductive lines 120 laterally spaced by first dielectric rails 122 over a second substrate 110L.

Figure 57:
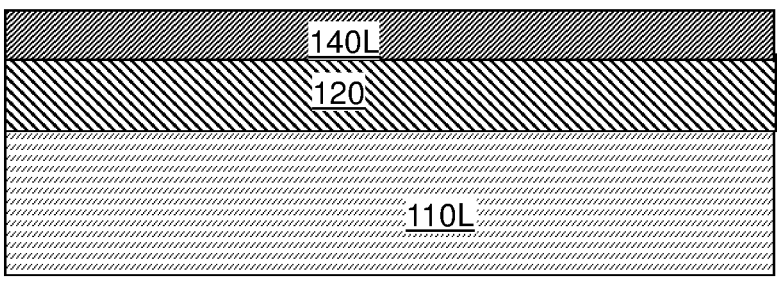
FIG. 57 is a vertical cross-sectional view of the second substrate after formation of a second metallic material layer thereupon according to the sixth embodiment of the present disclosure.

Referring to FIG. 57, a second metallic material layer 140L can be formed over the first electrically conductive lines 120 and the first dielectric rails 122.

Figure 58:
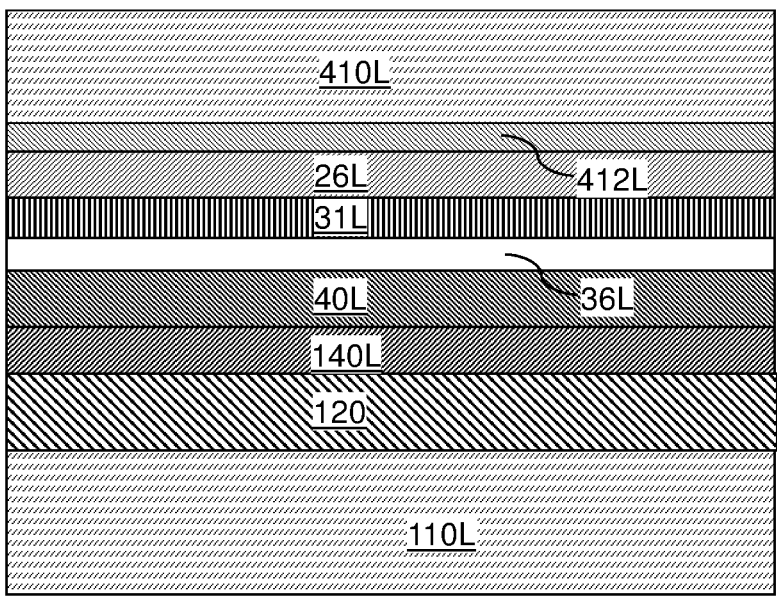
FIG. 58 is a vertical cross-sectional view of a sixth exemplary structure after bonding the second metallic material layer to the first metallic material layer according to the sixth embodiment of the present disclosure.

Referring to FIG. 58, the processing steps of FIG. 5 can be performed to bond the second metallic material layer 140L and the first metallic material layer 40L. In one embodiment, the second metallic material layer 140L can be bonded to the first layer stack (26L, 31L, 36L, 40L) by inducing metal-to-metal bonding between the second metallic material layer 140L and the first metallic material layer 40L. An assembly of the first substrate 410L, the first layer stack (26L, 31L, 36L, 40L), the second metallic material layer 140L, the first electrically conductive lines 120 and the first dielectric rails 122, and the second substrate 110L can be formed.

Referring to FIG. 59, a laser beam can be irradiated through the optically transparent single crystalline material of the first substrate 410L onto the single crystalline semiconductor layer 26L. Surface portions of the single crystalline semiconductor layer 26L in proximity to the first substrate 410L, or surface potions of the optional epitaxial seed semiconductor layer 412L in proximity to the first substrate 410L, can be ablated by the laser irradiation. In an illustrative example, the first substrate 410L may comprise a single crystalline sapphire substrate, and the single crystalline semiconductor layer 26L and the optional epitaxial seed semiconductor layer 412L may comprise a respective single crystalline III-V compound semiconductor layer. In this case, a single crystalline III-V compound semiconductor layer of the single crystalline semiconductor layer 26L or the optional epitaxial seed semiconductor layer 412L can be heated by irradiating a laser beam through the single crystalline sapphire substrate onto the single crystalline III-V compound semiconductor layer. The single crystalline sapphire substrate can be detached from the single crystalline III-V compound semiconductor layer. The wavelength of the laser beam can be selected to optimize absorption of the laser energy at a surface portion of the single crystalline semiconductor layer 26L or the optional epitaxial seed semiconductor layer 412L. For example, if the single crystalline semiconductor layer 26L comprises a single crystalline III-V compound semiconductor material, such as GaN, then the wavelength of the laser beam may be in a range from 100 nm to 600 nm, although shorter and longer wavelength may also be employed.

Figure 60:
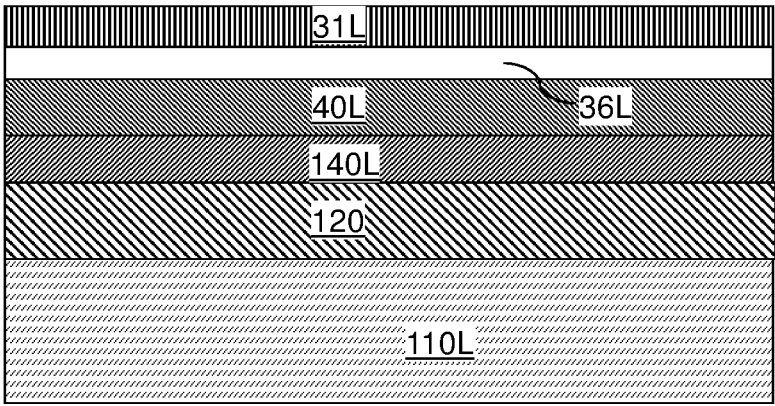
FIG. 60 is a vertical cross-sectional view of the sixth exemplary structure after removal of the single crystalline semiconductor layer according to the sixth embodiment of the present disclosure.

Referring to FIG. 60, remaining portions of the single crystalline semiconductor layer 26L and the optional epitaxial seed semiconductor layer 412L can be removed, for example, by performing a selective etch process that etches the semiconductor material of the single crystalline semiconductor layer 26L (and the semiconductor material of the optional epitaxial seed semiconductor layer 412L) selective to the material of the single crystalline ferroelectric material layer 31L (or selective to the material of the first single crystalline metal layer in case the first single crystalline metal layer is present), as described above. Alternatively, the remaining portions of the single crystalline semiconductor layer 26L and/or the semiconductor material of the optional epitaxial seed semiconductor layer 412L may be retained in the final device.

Figure 61:
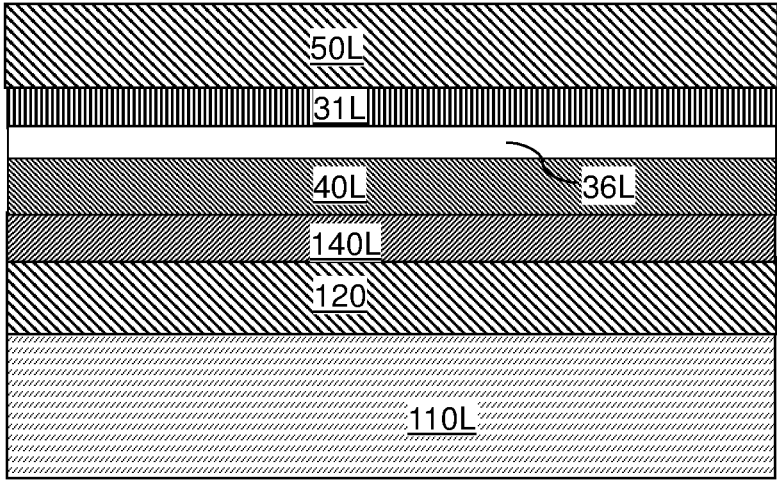
FIG. 61 is a vertical cross-sectional view of the sixth exemplary structure after formation of a metallic cap layer according to the sixth embodiment of the present disclosure.

Referring to FIG. 61, the processing steps of FIG. 6 can be performed to form a metallic cap layer 50L.

Figure 62:
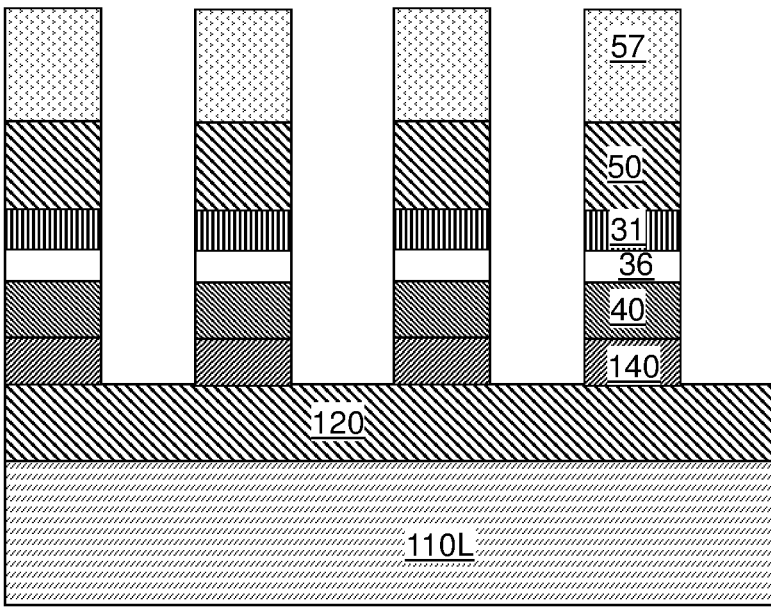
FIG. 62 is a vertical cross-sectional view of the sixth exemplary structure after formation of an array of memory pillar structures according to the sixth embodiment of the present disclosure.

Referring to FIG. 62, an array of discrete photoresist material portions 57 can be formed above the metallic cap layer 50L. In one embodiment, the array of discrete photoresist material portions 57 may be formed as a two-dimensional periodic array. The processing steps of FIGS. 7 and/or 52 can be performed with any needed changes to divide the layer stack including the metallic cap layer 50L, the optional first single crystalline metal layer, the single crystalline ferroelectric material layer 31L, the optional second single crystalline metal layer, the tunnel barrier layer 36L, the first metallic material layer 40L, and the second metallic material layer 140L. The etch chemistry of the anisotropic process employed at the processing steps of FIG. 7 can be modified to etch the optional first single crystalline metal layer (not shown), the single crystalline ferroelectric material layer 31L, the optional second single crystalline metal layer (not shown), and the tunnel barrier layer 36L in lieu of the combination of the distal single crystalline semiconductor layer 24L and the single crystalline ferroelectric material layer 30L, and to omit etching of the selector-level layers 130L (which are not present in the sixth exemplary structure).

Each patterned portion of the layer stack of the metallic cap layer 50L, the optional first single crystalline metal layer (not shown), the single crystalline ferroelectric material layer 31L, the optional second single crystalline metal layer (not shown), the tunnel barrier layer 36L, the first metallic material layer 40L, and the second metallic material layer 140L comprises a memory pillar structure (140, 40, 36, 31, 50). Generally, at least one memory pillar structure (140, 40, 36, 31, 50) can be formed by patterning the layer stack of the metallic cap layer 50L, the optional first single crystalline metal layer, the single crystalline ferroelectric material layer 31L, the optional second single crystalline metal layer, the tunnel barrier layer 36L, the first metallic material layer 40L, and the second metallic material layer 140L. In one embodiment, a two-dimensional periodic rectangular array of memory pillar structures (140, 40, 36, 31, 50) can be formed.

Each memory pillar structure (140, 40, 36, 31, 50) can include, from bottom to top, a second metallic material plate 140, a first metallic material plate 40, an optional second single crystalline metal plate, a tunnel barrier plate (which functions as the selector material plate) 36, a ferroelectric material plate 31, an optional first single crystalline metal plate, an optional single crystalline semiconductor plate (which comprises a patterned remaining portion of the single crystalline semiconductor layer 26L if present, not shown), and a metallic cap plate 50. Each second metallic material plate 140 is a patterned portion of the second metallic material layer 140L. Each first metallic material plate 40 is a patterned portion of the first metallic material layer 40L. Each tunnel barrier plate 36 is a patterned portion of the tunnel barrier layer 36L. Each second single crystalline metal plate, if present, is a patterned portion of the second single crystalline metal layer. Each ferroelectric material plate 31 is a patterned portion of the single crystalline ferroelectric material layer 31L. Each first single crystalline metal plate, if present, is a patterned portion of the first single crystalline metal layer. Each single crystalline semiconductor plate (if present) is a patterned portion of the single crystalline semiconductor layer 26L. Each metallic cap plate 50 is a patterned portion of the metallic cap layer 50L.

Each memory pillar structure (140, 40, 36, 31, 50) can have at least one sidewall that extends from the top surface of the respective memory pillar structure (140, 40, 36, 31, 50) to the bottom surface of the memory pillar structure (140, 40, 36, 31, 50). Each sidewall may be vertical, substantially vertical, or may have a taper angle in a range from 1 degree to 15 degrees. The discrete photoresist material portions 57 can be subsequently removed, for example, by ashing. The memory pillar structures (140, 40, 36, 31, 50) can have horizontal cross-sectional shapes of a rectangle, a rounded rectangle, a circle, an ellipse, or any generally curvilinear two-dimensional closed shape.

Figure 63A:
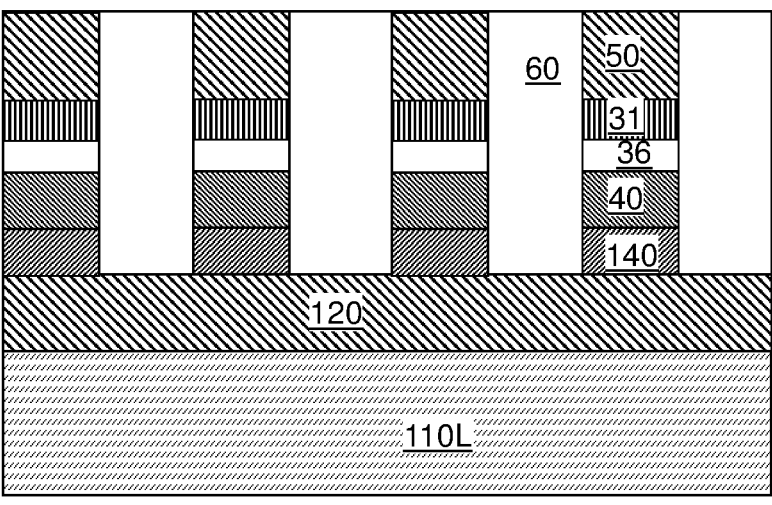
FIG. 63A is a vertical cross-sectional view of the sixth exemplary structure after formation of a dielectric isolation structure according to the sixth embodiment of the present disclosure.
Figure 63B:
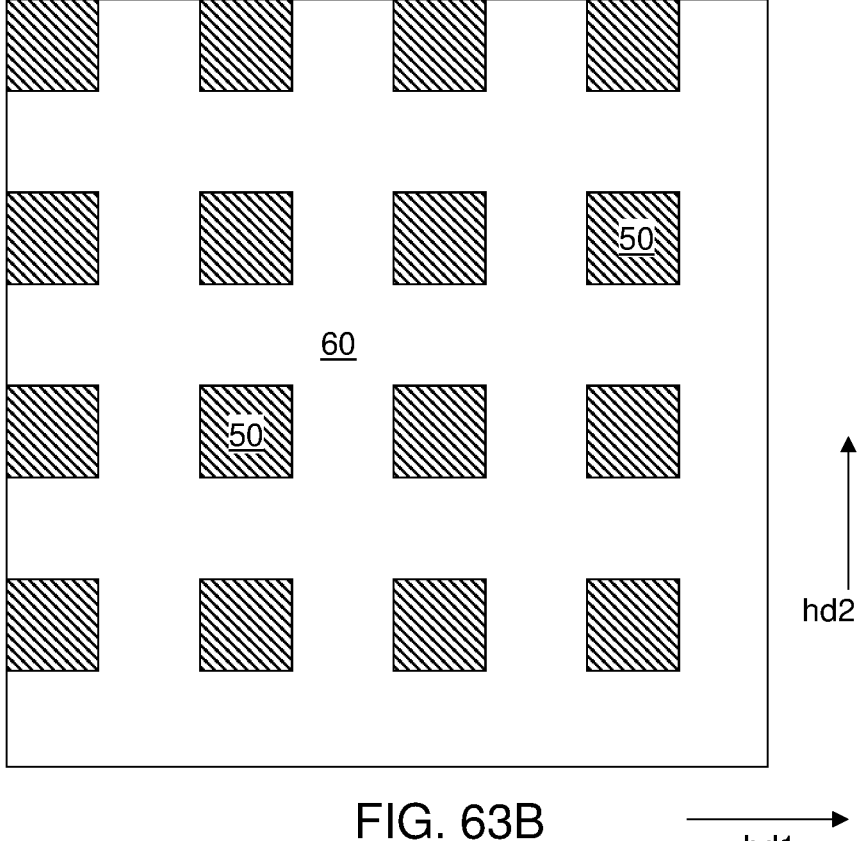
FIG. 63B is a top-down view of the sixth exemplary structure of FIG. 63A.

Referring to FIGS. 63A and 63B, the processing steps of FIGS. 8A and 8B can be performed with any needed changes to form a dielectric isolation structure 60. The top surface of the dielectric isolation structure 60 may be coplanar with the top surfaces of the memory pillar structures (140, 40, 36, 31, 50).

Figure 64A:
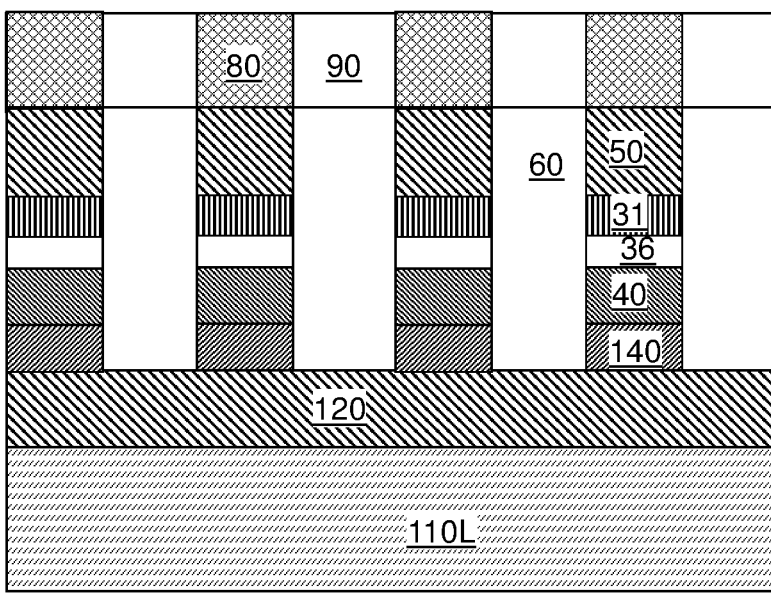
FIG. 64A is a vertical cross-sectional view of the sixth exemplary structure after formation of second electrically conductive lines laterally spaced by second dielectric rails according to the sixth embodiment of the present disclosure.
Figure 64B:
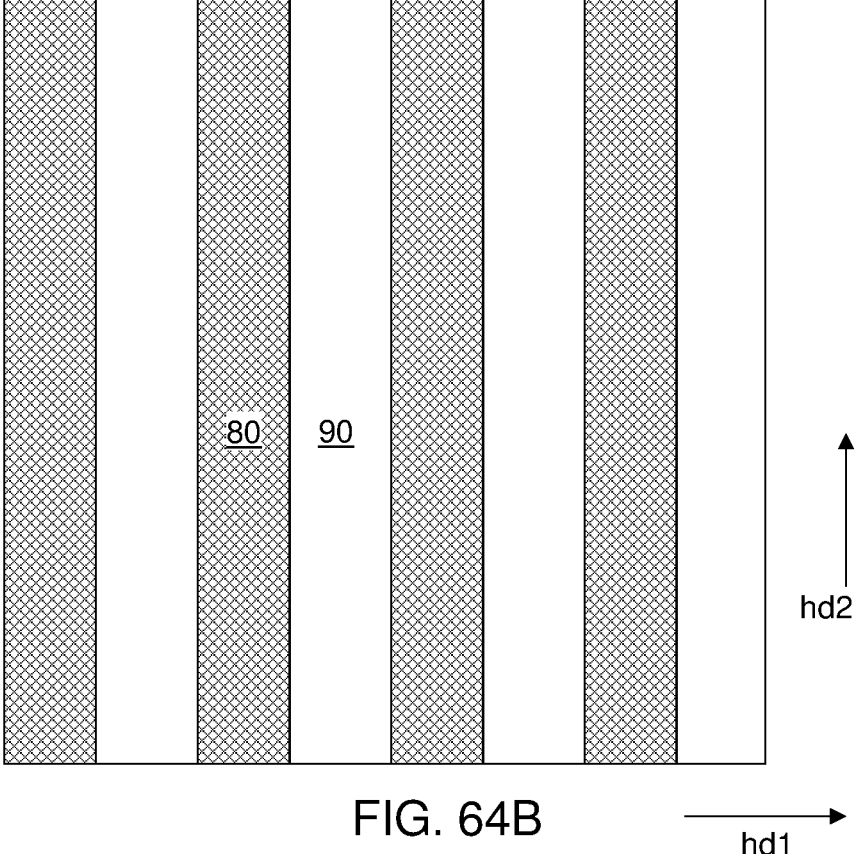
FIG. 64B is a top-down view of the sixth exemplary structure of FIG. 64A.

Referring to FIGS. 64A and 64B, second electrically conductive lines 80 and second dielectric rails 90 can be formed above the two-dimensional array of memory pillar structures (140, 40, 36, 31, 50) and the dielectric isolation structure 60 to provide the sixth exemplary structure. For example, the processing steps of FIGS. 9A and 9B can be performed to form the second electrically conductive lines 80 and the second dielectric rails 90.

Referring collectively to the first, second, fifth and sixth embodiments of the present disclosure, a memory device comprises a first electrically conductive line 120 laterally extending along a first horizontal direction hd1, a memory pillar structure (140, 40, 31, (36, 134), 50) overlying and contacting the first electrically conductive line 120, wherein the memory pillar structure (140, 40, 31, (36, 134), 50) comprises a ferroelectric material plate 31 and a selector material plate (36, 134), and a second electrically conductive line 90 laterally extending along a second horizontal direction hd2 and overlying and contacting the memory pillar structure (140, 40, 31, (36, 134), 50).

In one embodiment, the selector material plate comprises a tunnel barrier plate 36. In one embodiment, the tunnel barrier plate 36 comprises a material selected from magnesium oxide, aluminum oxide or a spinel material. In one embodiment, the tunnel barrier plate has a thickness in a range from 0.3 nm to 3.0 nm.

In another embodiment, the selector material plate comprises an ovonic threshold switch material or a diode 134. In one embodiment, a lower electrode plate 132 contacts a bottom surface of the selector material plate 134 and comprises a first non-metallic conductive material, and an upper electrode plate 136 contacts a top surface of the selector material plate 134 and comprises a second non-metallic conductive material. In one embodiment, each of the first non-metallic conductive material and the second non-metallic conductive material is selected from amorphous carbon, amorphous boron-doped carbon, amorphous nitrogen-doped carbon, amorphous silicon, amorphous germanium, alloys thereof, or layer stacks thereof.

In one embodiment, the ferroelectric material plate 31 comprises a single crystalline ferroelectric material plate in which an entirety of a ferroelectric material is single crystalline. In other words, the single crystalline structure of the ferroelectric material may extend throughout the entire volume of the ferroelectric material plate 31. In one embodiment, the single crystalline single crystalline ferroelectric material plate 31 comprises a single crystalline ferroelectric material having a Wurtzite crystalline structure. The single crystalline ferroelectric material comprises $Al_{1-x}Sc_xN$, where $0.25<x<0.45$, or at least one material selected from $Al_{1-y}B_yN$ where $0.02≤x≤0.15$, MgS, MgSe, AlN, GaN, $MgSiN_2$, $MgGeN_2$, $MgSnN_2$, $ZnSiN_2$, $ZnGeN_2$, $ZnSnN_2$, $MnGeN_2$, $LiSi_2N_3$, $LiGe_2N_3$, $Zn_2 TaN_3$, $Zn_2NbN_3$, $Zn_2SbN_3$, $Mg_2SbN_3$, $Zn_3MoN_4$, $Zn_3WN_4$, $Mg_3MoN_4$, or $Mg_3WN_4$.

In one embodiment, the memory pillar structure (140, 40, (36, 134) 31, 50) comprises a bonded pair of a first metallic material plate 40 and a second metallic material plate 140 with a bonding interface therebetween. In one embodiment, sidewalls of the first metallic material plate 40, sidewalls of the second metallic material plate 140, sidewalls of the single crystalline ferroelectric material plate 31, and sidewalls of the selector material plate (36, 134) are vertically coincident with each other.

In the fifth embodiment, the bonded pair of the first metallic material plate 40 and the second metallic material plate 140 are disposed between selector material plate 134 and the ferroelectric material plate 31.

Figures 65A, 65B:
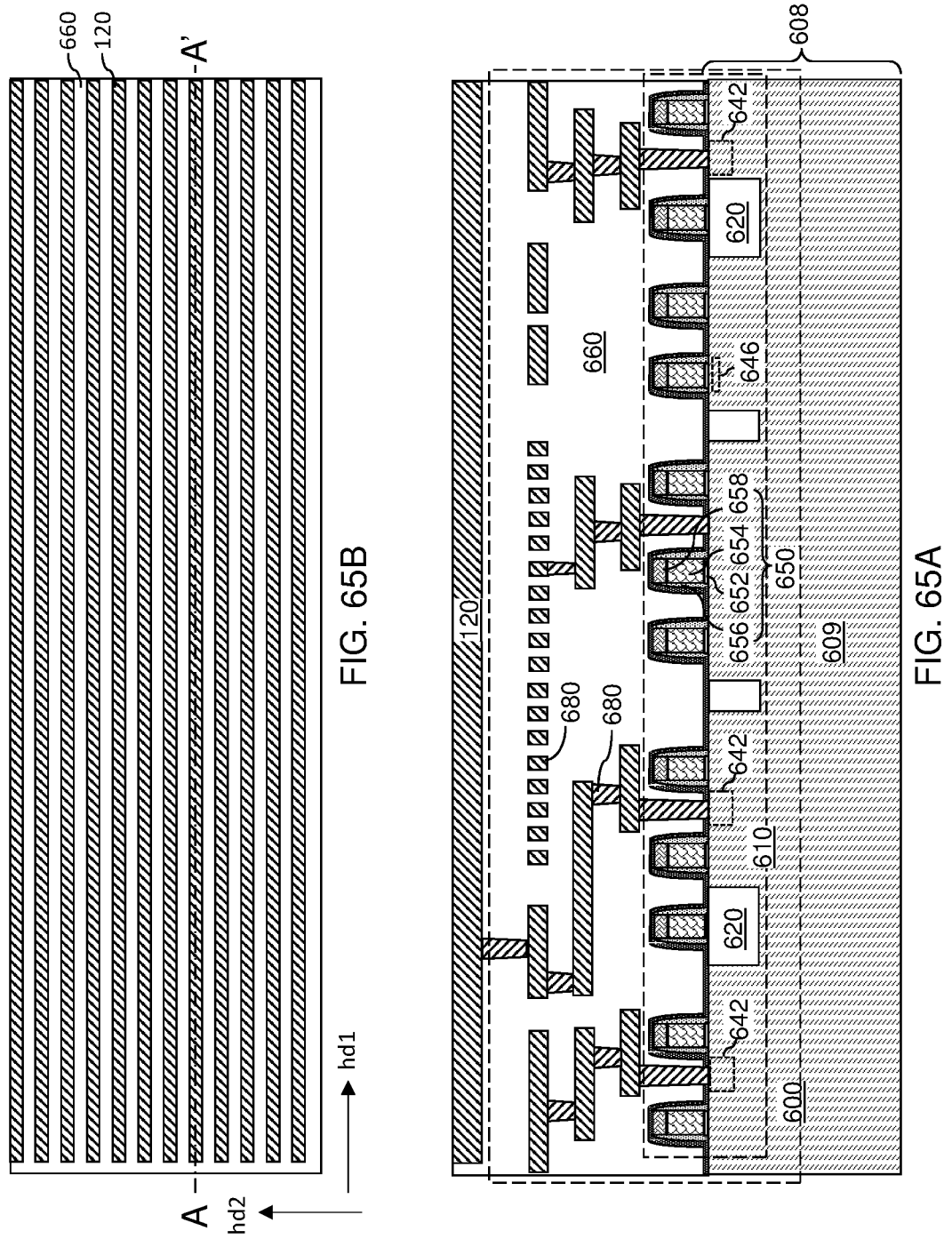
FIG. 65A is a vertical cross-sectional view of a seventh exemplary structure after formation of a peripheral circuity and first electrically conductive lines over a first substrate according to a seventh embodiment of the present disclosure.
FIG. 65B is a top-down view of the seventh exemplary structure of FIG. 65A. The vertical plane A-A' is the cut plane of the vertical cross-sectional view of FIG. 65A.

Referring to FIGS. 65A and 65B, a seventh exemplary structure according to a seventh embodiment of the present disclosure is illustrated. The seventh exemplary structure includes a first substrate 608 and semiconductor devices 610 formed thereupon. The first substrate 608 includes a substrate semiconductor layer 609 at least at an upper portion thereof. The first substrate 608 may be a semiconductor wafer, such as a single crystal silicon wafer. The substrate semiconductor layer 609 may comprise an upper portion of the silicon wafer, a doped well in the silicon wafer or an epitaxial silicon layer deposited on the silicon wafer.

Shallow trench isolation structures 620 may be formed in an upper portion of the substrate semiconductor layer 609 to provide electrical isolation between neighboring semiconductor devices. The semiconductor devices 610 may include, for example, field effect transistors including respective transistor active regions 642 (i.e., source regions and drain regions), channel regions 646, and gate structures 650. The field effect transistors may be arranged in a CMOS configuration. Each gate structure 650 may include, for example, a gate dielectric 652, a gate electrode 654, a dielectric gate spacer 656 and a gate cap dielectric 658. The semiconductor devices 610 may include any semiconductor circuitry to support operation of a memory structure to be subsequently formed. Additional circuity may control data access, data reading, data caching, data writing, data error correction after reading data, and temperature monitoring circuitry as operation of these devices may change depending on ambient temperature. Such semiconductor devices 610 are typically referred to as a driver (e.g., peripheral) circuitry 600. As used herein, driver circuitry refers to any, each, or all of word line decoder circuitry, word line switching circuitry, bit line decoder circuitry, bit line sensing and/or switching circuitry, power supply/distribution circuitry, data buffer and/or latch, or any other semiconductor circuitry that may be implemented outside a memory array structure for controlling a memory device. For example, the semiconductor devices may include word line switching devices for electrically biasing word lines of three-dimensional memory structures to be subsequently formed.

Dielectric material layers 660 are formed over the semiconductor devices 610. Metal interconnect structures 680 can be formed in the dielectric material layers 660 to provide electrical connection among the semiconductor devices 610 and between the semiconductor devices 610 and various memory-level structures to be subsequently formed. The dielectric material layers 760 function as a matrix for the metal interconnect structures 780. The metal interconnect structures 780 may comprise metal lines and metal via structures.

First electrically conductive lines 120 can be formed at the topmost level of the dielectric material layers 660. In one embodiment, the first electrically conductive lines 120 may comprise word lines. Alternatively, they may comprise bit lines. The first electrically conductive lines 120 laterally extend along a first horizontal direction (e.g., word line direction) hd1, and are laterally spaced apart along a second horizontal direction (e.g., bit line direction) hd2 that is perpendicular to the first horizontal direction. Generally, the first electrically conductive lines 120 can be laterally spaced apart by first dielectric rails, which may be uppermost patterned portions of the dielectric material layers 660. The first electrically conductive lines 120 in the seventh exemplary structure may be formed in the same manner as the first electrically conductive lines 120 described above, and may have the same material composition and the dimension range as the first electrically conductive lines 120 described above.

Figure 66:
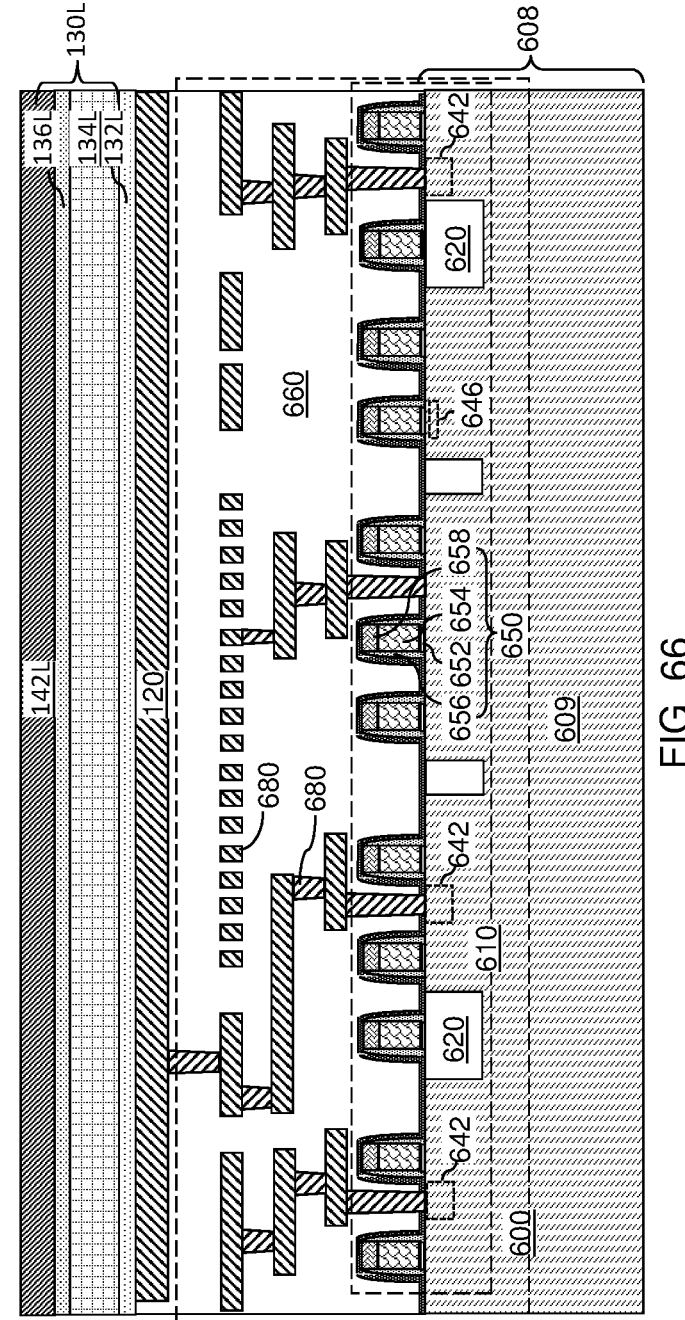
FIG. 66 is a vertical cross-sectional view of the seventh exemplary structure after formation of selector-level layers and a selector-side bonding material layer according to the seventh embodiment of the present disclosure.

Referring to FIG. 66, a layer stack comprising a selector material layer 134L and an optional selector-side bonding material layer 142L can be formed over the first electrically conductive lines 120. In one embodiment, the layer stack can include, from bottom to top, a lower electrode layer 132L, the selector material layer 134L, an upper electrode layer 136L, and the selector-side bonding material layer 142L. The combination of the lower electrode layer 132L, the selector material layer 134L, and the upper electrode layer 136L is herein referred to as selector-level layers 130L.

Generally, each of the lower electrode layer 132L, the selector material layer 134L, and the upper electrode layer 136L in the seventh exemplary structure may have the same material composition as, and may have the same thickness range as, the lower electrode layer 132L, the selector material layer 134L, an upper electrode layer 136L, respectively, that are described with reference to FIG. 3. Further, the selector-side bonding material layer 142L, if present, may have the same material composition as, and may have the same thickness range as, the second metallic material layer 140L described with reference to FIG. 3.

The selector material layer 134L may comprise any material that can provide a non-linear switching behavior as a function of an electrical bias voltage thereacross. In one embodiment, the selector material layer 134L comprises an ovonic threshold switch material layer or a diode layer stack.

In one embodiment, the lower electrode layer 132L comprises, and/or consists essentially of, a first non-metallic conductive material, and the upper electrode layer 136L comprises, and/or consists essentially of, a second non-metallic conductive material. In one embodiment, each of the first non-metallic conductive material and the second non-metallic conductive material may be selected from amorphous carbon, amorphous boron-doped carbon, amorphous nitrogen-doped carbon, amorphous silicon, amorphous germanium, alloys thereof, or layer stacks thereof. Alternatively, the lower electrode layer 132L and the upper electrode layer 136L may comprise metal or metal alloy materials (e.g., tungsten, tantalum, titanium nitride, tungsten nitride, etc.).

The material of the selector-side bonding material layer 142L is herein referred to as a first metallic bonding material, which is a metallic material that may be bonded with another metallic material. In one embodiment, the selector-side bonding material layer 142L may have the same material composition as, and the same thickness range as, the second metallic material layer 140L described above with reference to FIG. 3.

The seventh exemplary structure illustrated in FIG. 66 comprises a first semiconductor die 600. The first semiconductor die 600 may be located within a two-dimensional array of first semiconductor dies on the common first substrate 608, or may be provided as a singulated semiconductor die.

Referring to FIG. 67, a second semiconductor die 800 is provided. The second semiconductor die 800 may be located within a two-dimensional array of second semiconductor dies on a common second substrate 808, or may be provided as a singulated semiconductor die. Generally, the second semiconductor die 800 may have the same size as the first semiconductor die 600 so that the second semiconductor die 800 may be subsequently bonded to the first semiconductor die 600.

The second semiconductor die 800 comprises the second substrate 808, which is also referred to as a carrier substrate. The second substrate 808 may comprise a semiconductor material (e.g., a silicon wafer), an insulating material (e.g., a ceramic or glass substrate), or a conductive material (e.g., a metal substrate).

A planarization stop material layer 807 can be optionally formed on a top surface of the second substrate 808. The planarization stop material layer 807 can include a material that can be employed as a stopping material during subsequent removal of the second substrate 808. The planarization stop material layer 807 may comprise a polishing stop material or an etch stop material. For example, the planarization stop material layer 807 may comprise silicon nitride, silicon carbide, silicon carbide nitride, silicon oxide, or a dielectric metal oxide. Alternatively, layer 807 may comprise a sacrificial release layer, as will be described below.

A continuous MRAM layer stack (820L, 830L, 870L, 880L, 940L) can be deposited over the first electrically conductive lines 30. The continuous MRAM layer stack (820L, 830L, 870L, 880L, 940L) may include, from bottom to top or from top to bottom, a synthetic antiferromagnet structure (SAF) layer 820L, a continuous magnetic tunnel junction layer stack 830L, a continuous capping dielectric layer 870L, and an optional continuous nonmagnetic metal capping layer 880L. Further, the continuous MRAM layer stack (820L, 830L, 870L, 880L, 940L) may include an optional junction-side bonding material layer 840L as a topmost layer. The continuous magnetic tunnel junction layer stack 830L may comprise, from a side that is distal from the continuous capping dielectric layer 870L to a side that is proximal to the continuous capping dielectric layer 870L, a continuous reference layer 832L, a continuous tunnel barrier layer 836L, and a continuous free layer 838L.

The SAF layer 820L may include a superlattice structure including an alternating sequence of ferromagnetic material layers and nonmagnetic metal layers. In an illustrative example, the superlattice structure may include $[X/Q]_n$, in which X represents a ferromagnetic material layer, such as Co, CoFe, Fe, or CoFeB layer, Q represents a nonmagnetic metal layer, such as Pt or Pd layer, and n represents the total number of repetitions of a bilayer stack of the ferromagnetic material layer and the nonmagnetic metal layer. The total number n of repetitions may be in a range from 2 to 20, such as from 3 to 8, although a greater number may also be employed. An antiferromagnetic coupling layer, such as ruthenium, iridium, a platinum-manganese alloy or an iridium-manganese alloy may be located between the lower and upper portions of the superlattice structure. Additional layers, such as one or more metal seed layers and/or one or more metal electrodes (e.g., tungsten or tantalum electrodes) may be formed below and/or above the SAF layer 820.

The continuous reference layer 832L includes a ferromagnetic material having perpendicular magnetic anisotropy. The continuous reference layer 832L includes a ferromagnetic material such as Co, Fe, CoFe, or CoFeB.

The continuous tunnel barrier layer 836L includes an insulating tunnel barrier material, such as MgO, $Al_2O_3$, $MgAl_2O_4$, or another spinel material having a same crystal structure as $MgAl_2O_4$. In one embodiment, the continuous tunnel barrier layer 836L may be formed as a polycrystalline film having multiple grains and grain boundaries. The polycrystalline film of the continuous tunnel barrier layer 836L may have a preferred grain growth direction such as a <001> direction in the case of MgO.

The continuous free layer 838L includes a ferromagnetic material having perpendicular magnetic anisotropy. The continuous free layer 838L includes a ferromagnetic material, such as Co, Fe, CoFe, or CoFeB. The continuous free layer 838L may include the same material as, or may include a material different from, the material of the continuous reference layer 832L. The continuous free layer 838L may include an amorphous CoFe layer, a CoFeB layer, or an amorphous stack of Co/Ni multilayers or Co/Fe multilayers. The continuous free layer 838L may be deposited as an amorphous material by physical vapor deposition performed at room temperature. Alternatively, the continuous free layer 838L can be deposited as a crystalline layer.

The continuous capping dielectric layer 870L can be deposited by sputtering or by vacuum evaporation. The continuous capping dielectric layer 870L may comprise polycrystalline magnesium oxide. In one embodiment, a predominant portion of the continuous capping dielectric layer 870L may be formed with a <001> growth direction with a (001) growth plane. The deposition temperature depositing the continuous capping dielectric layer 870L can be room temperature.

The optional continuous nonmagnetic metal capping layer 880L includes a nonmagnetic transition metal, and may include one or more of Ta, Ti, V, Cr, Mn, Zr, Nb, Mo, Tc, Ru, Rh, Hf, W, Re, Os, or Ir. The optional continuous nonmagnetic metal capping layer 880L may be deposited by sputtering.

The optional junction-side bonding material layer 840L comprises a second metallic bonding material, which is a metallic material that may be bonded with the first metallic bonding material of the selector-side bonding material layer 142L. In one embodiment, the junction-side bonding material layer 840L may have the same material composition as, and the same thickness range as, the first metallic material layer 40L described above with reference to FIG. 1D.

A post-deposition anneal process can be performed at an elevated temperature above 300 degrees Celsius, such as 325 degrees Celsius to 600 degrees Celsius, including 400 degrees Celsius to 600 degrees Celsius, optionally in the presence of a magnetic field. The anneal improves the properties of the tunnel junction layer stack 830L. Since there are no driver circuit devices (e.g., transistors) nor selector-level layers 130L located on the second substrate 808, the anneal does not damage or disrupt the driver circuit devices or damage the selector device (i.e., the selector-level layers 130L).

If the continuous free layer 838L is deposited as an amorphous layer, then the free layer 838 may be crystallized during the anneal process. During the thermal anneal process, the (001) texture grains in the magnesium oxide continuous capping dielectric layer 870L may further grow and merge while maintaining the (001) texture. The (001) textured crystalline structure of the magnesium oxide continuous capping dielectric layer 870L functions as a crystallization template for the amorphous materials of the continuous free layer 838L. In other words, in one embodiment, the thermal anneal process comprises a solid phase epitaxy process. Grains in the continuous free layer 838L grow along the (001) texture during the solid phase epitaxy process to form a crystalline continuous free layer having a (001) preferred orientation (i.e., texture).

Figure 68:
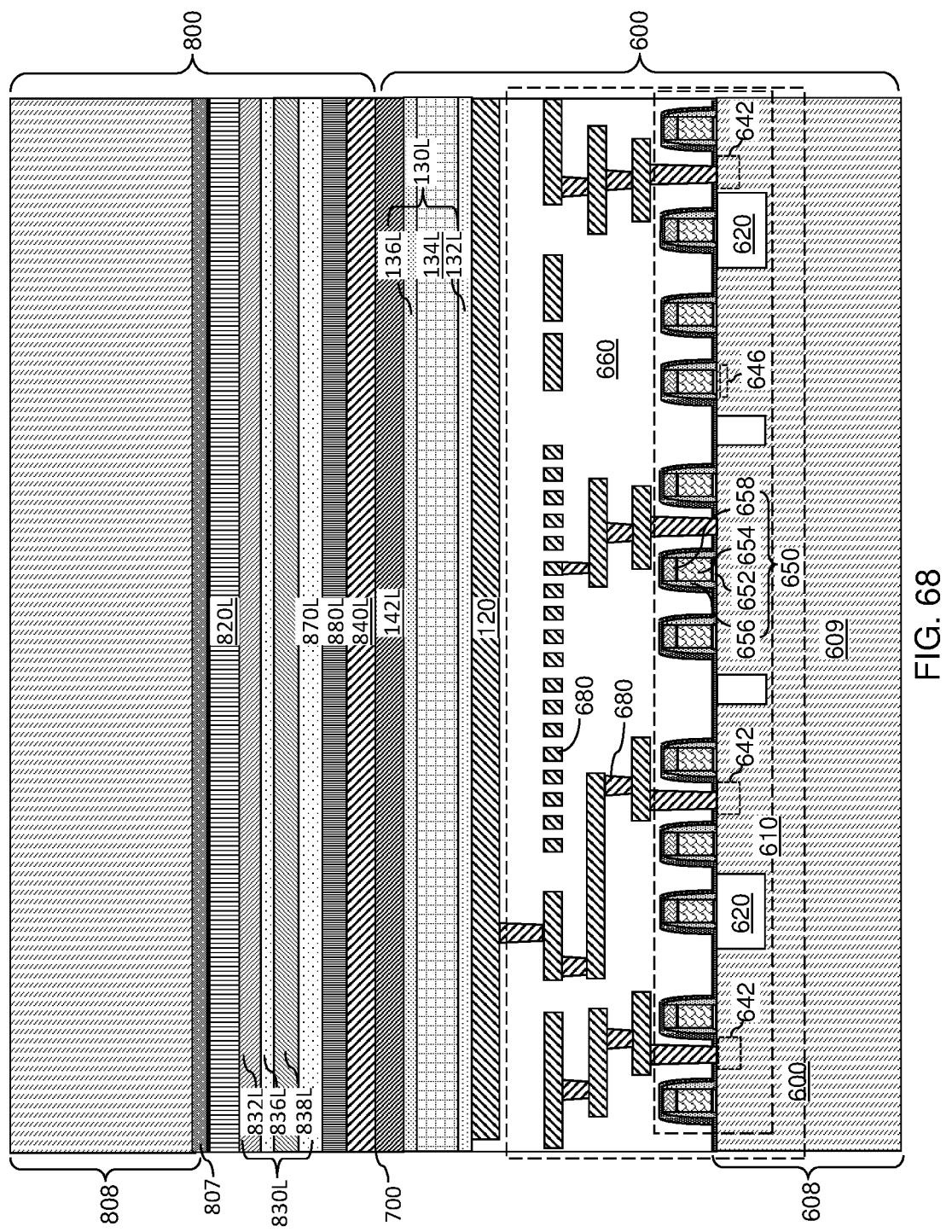
FIG. 68 is a vertical cross-sectional view of the seventh exemplary structure after bonding the junction-side bonding material layer with the selector-side bonding material layer according to the seventh embodiment of the present disclosure.

Referring to FIG. 68, the junction-side bonding material layer 840L of the second semiconductor die 800 can be bonded to the selector-side bonding material layer 142L of the first semiconductor die 600. If the junction-side bonding material layer 840L is omitted, then the continuous nonmagnetic metal capping layer 880L may be bonded to the selector-side bonding material layer 142L. The bonding process occurs after the anneal process described above.

A wafer-to-wafer bonding process, a die-to-wafer bonding process, or a die-to-die bonding process may be employed. The second metallic bonding material of the junction-side bonding material layer 840L can be bonded to the first metallic bonding material of the selector-side bonding material layer 142L by metal-to-metal bonding. The bonding process may be conducted at a relatively low temperature (e.g., 400 degrees Celsius or less, such as 250 to 400 degrees Celsius) to avoid damaging the driver circuit semiconductor devices 610.

A bonded assembly (600, 800) of the first semiconductor die 600 and the second semiconductor die 800 can be formed with a bonding interface 700 located between the two dies. Alternatively, if one or both semiconductor dies have an insulating surface facing the bonding interface 700, then dielectric-to-dielectric bonding or hybrid metal-to-dielectric bonding may be used.

Figure 69:
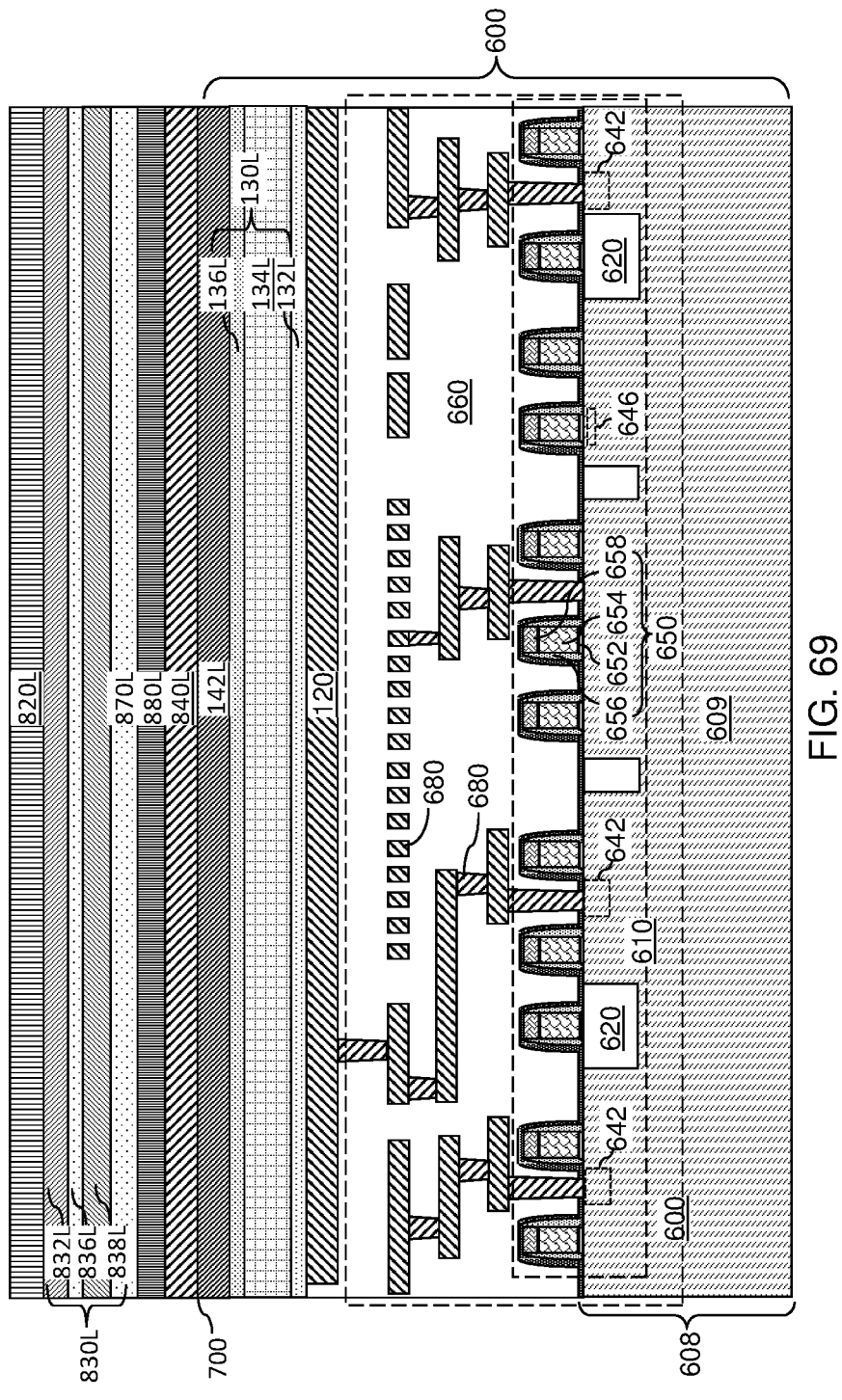
FIG. 69 is a vertical cross-sectional view of the seventh exemplary structure after removal of the second substrate according to the seventh embodiment of the present disclosure.

Referring to FIG. 69, the second substrate 808 can be removed from the bonded assembly (600, 800). Specifically, the second substrate 808 can be removed from the backside by performing a grinding process, a polishing process, an anisotropic etch process, and/or an isotropic etch process.

The planarization stop material layer 807 may be employed as a polishing stop material layer or as an etch stop material layer during removal of the second substrate 808. Subsequently, the planarization stop material layer 807 may be removed selective to the material of the continuous MRAM layer stack (820L, 830L, 870L, 880L, 840L). For example, the planarization stop material layer 807 may be removed selective to the material of the continuous anisotropy enhancement layer 820L.

Alternatively, layer 807 may comprise a sacrificial release layer. In this case, layer 807 has a different material composition than any other layer which is exposed at the edge of the bonded assembly (600, 800). A selective wet etch is used to etch away the sacrificial release layer 807 to separate the second substrate 808 from the rest of the bonded assembly (600, 800). The separated second substrate 808 may optionally be reused to form additional MRAM layers and then provided into another bonded assembly.

Figure 70A:
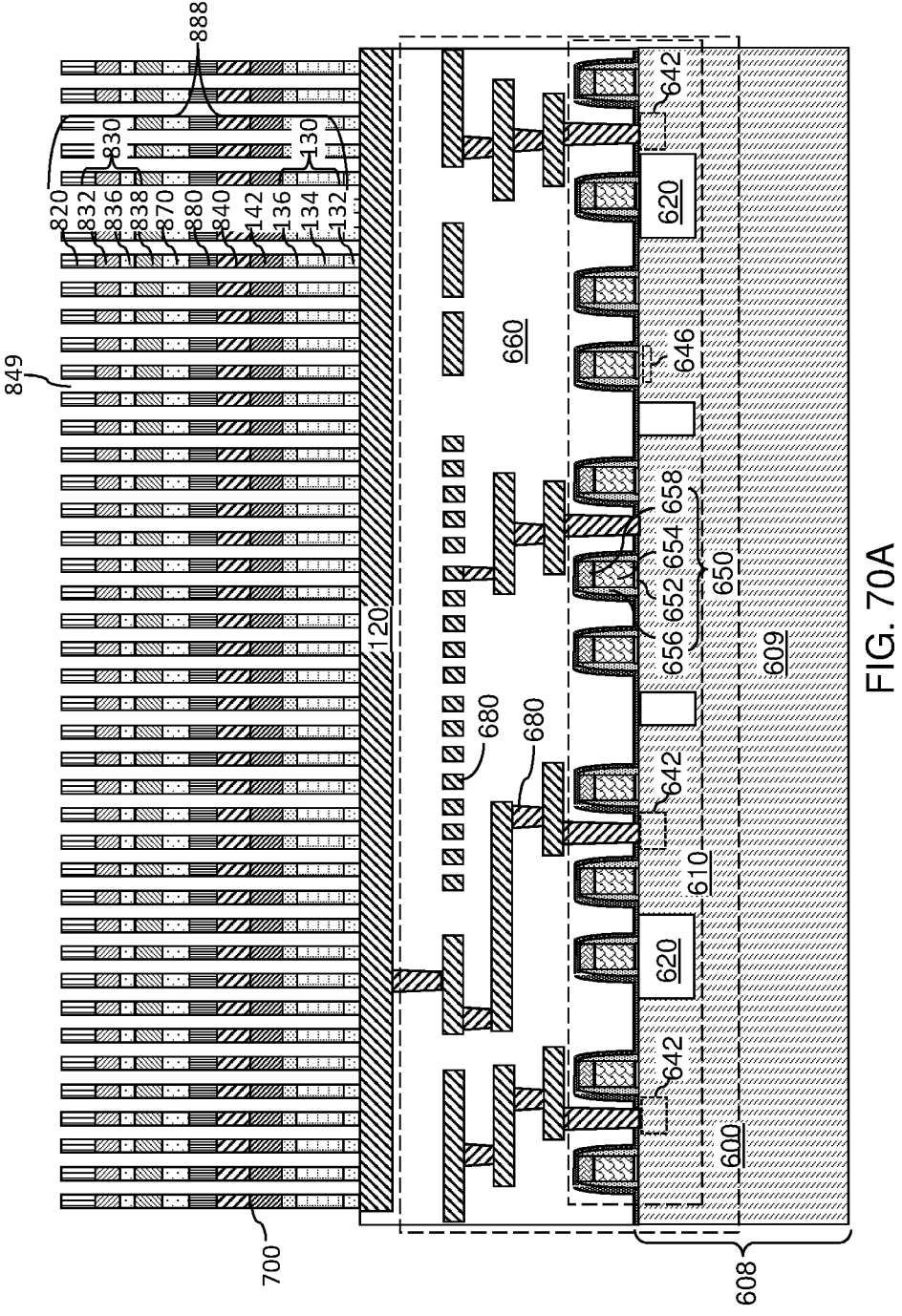
FIG. 70A is a vertical cross-sectional view of the seventh exemplary structure after patterning a two-dimensional array of magnetic tunnel junction (MTJ) pillar structures and a two-dimensional array of selector pillar structures according to the seventh embodiment of the present disclosure.
Figure 70B:
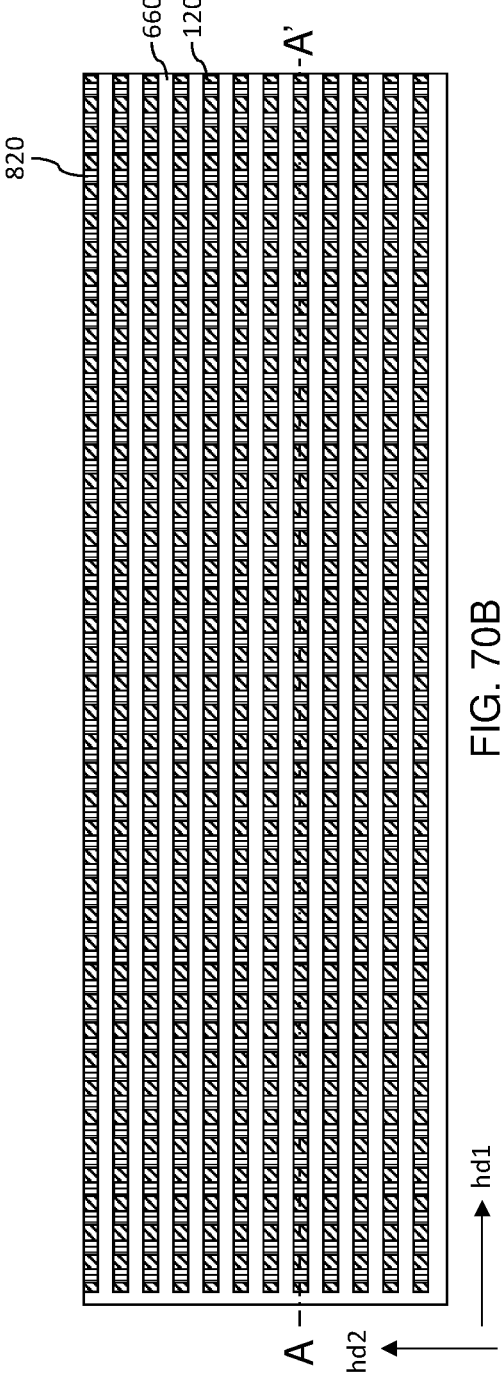
FIG. 70B is a top-down view of the seventh exemplary structure of FIG. 70A. The vertical plane A-A' is the cut plane of the vertical cross-sectional view of FIG. 70A.

Referring to FIGS. 70A and 70B, a patterned etch mask layer (not shown) can be formed over a top surface of the SAF layer 820L. The patterned etch mask layer may comprise a patterned photoresist layer, and/or a patterned hard mask layer that can be formed by depositing and photolithographically patterning a hard mask layer. The pattern in the patterned etch mask layer may comprise a pattern of a periodic two-dimensional array of discrete areas having a first pitch along the first horizontal direction hd1 and having a second pitch along the second horizontal direction hd2. The second pitch may be the same as the pitch of the first electrically conductive lines 120 along the second horizontal direction hd2. The first pitch may be the same as the pitch of second electrically conductive lines to be subsequently formed along the first horizontal direction hd1. Each of the first pitch and the second pitch may be in a range from 20 nm to 100 nm, such as from 30 nm to 50 nm, although lesser and greater pitches may also be employed. The first pitch and the second pitch may be independently selected. The shape of each discrete area may rectangular, circular, oval, or of any closed two-dimensional curvilinear shape. In one embodiment, the shape of each discrete area within the pattern in the patterned etch mask layer may be a circle, a square, or a rounded square (i.e., a shape that is derived from a square by rounding the corners).

An anisotropic etch process can be performed to transfer the pattern in the patterned etch mask layer through the continuous MRAM layer stack (820L, 830L, 870L, 880L, 840L), the selector-side bonding material layer 142L, and the selector-level layers 130L. The anisotropic etch process may comprise an ion beam etching (IBE) process (also referred to as an ion milling process). Alternatively, the continuous MRAM layer stack and the selector-side bonding material layer 142L may be etched by IBE and the selector-level layers 130L may be etched by reactive ion etching (RIE). The patterned etch mask layer can be employed as an etch mask for the anisotropic etch process. The combination of the continuous MRAM layer stack (820L, 830L, 870L, 880L, 840L), the selector-side bonding material layer 142L, and the selector-level layers 130L can be patterned into a two-dimensional periodic array of memory pillar stacks 888. Specifically, the continuous MRAM layer stack (820L, 830L, 870L, 880L, 840L) can be patterned into a two-dimensional array of magnetic tunnel junction (MTJ) pillar structures (820, 830, 870, 880, 840), and the combination of the selector-side bonding material layer 142L and the selector-level layers 130L can be patterned into a two-dimensional array of selector pillar structures (130, 142).

Each MTJ pillar structure (820, 830, 870, 880, 840) comprises a SAF 820 that is a patterned portion of the SAF layer 820L, a magnetic tunnel junction 830 that is a patterned portion of the continuous magnetic tunnel junction layer stack 830L, a capping dielectric layer 870 that is a patterned portion of the continuous capping dielectric layer 870L, an optional nonmagnetic metal capping layer 880 that is a patterned portion of the continuous nonmagnetic metal capping layer 880L, and an optional junction-side bonding plate 840 that is a patterned portion of the junction-side bonding material layer 840L. The magnetic tunnel junction 830 may comprise, from a side that is distal from the capping dielectric layer 870 to a side that is proximal to the capping dielectric layer 870, a reference layer 832 that is a patterned portion of the continuous reference layer 832L, a tunnel barrier layer 836 that is a patterned portion of the continuous tunnel barrier layer 836L, and a free layer 838 that is a patterned portion of the continuous free layer 838L. Thus, the reference layer 832 is further from the bonding interface 700 between the first and second dies (600, 800) than the free layer 838. Thus, each MTJ pillar structure comprises a top pinned MTJ pillar structure with the SAF 820 and reference layer 832 further from the respective underlying selector pillar structure (130, 142) than the free layer 838.

Each selector pillar structure (130, 142) comprises a selector element 130 that is a patterned portion of the selector-level layers 130L, and an optional selector-side bonding pad 142 that is a patterned portion of the selector-side bonding material layer 142L. Each selector element 130 may comprise a selector material plate 134 that is a patterned portion of the selector material layer 134L. In one embodiment, each selector element 130 may comprise a lower electrode plate 132 that is a patterned portion of the lower electrode layer 132L, an upper electrode plate 136 that is a patterned portion of the upper electrode layer 136L, and the selector material plate 134 located between them. The lower electrode plate 132 contacts a bottom surface of the selector material plate 134, and comprises the first non-metallic conductive material. The upper electrode plate 136 contacts a top surface of the selector material plate 134, and comprises the second non-metallic conductive material.

Generally, each memory pillar stack 888 overlies and contacts a respective first electrically conductive line 120. Each memory pillar stack 888 comprises a selector pillar structure (130, 142) and a magnetic tunnel junction (MTJ) pillar structure (820, 830, 870, 880, 840). The selector pillar structure (130, 142) comprises a selector material plate 134 and a selector-side bonding plate 142. The selector-side bonding plate 142 is bonded to a junction-side bonding plate 840 within the MTJ pillar structure (820, 830, 870, 880, 840) with a bonding interface 700 located between the MTJ pillar structure and the selector pillar structure. The MTJ pillar structure (820, 830, 870, 880, 840) comprises a tunnel barrier layer 836 disposed between a free layer 838 and a reference layer 832.

In one embodiment, the free layer 838 is more proximal to the junction-side bonding plate 840 (and the bonding interface 700) than the reference layer 832 is to the junction-side bonding plate 840 (and the bonding interface 700). In one embodiment, sidewalls of the junction-side bonding plate 840 are vertically coincident with sidewalls of the free layer 838, the tunnel barrier layer 836, and the reference layer 832. Furthermore, the sidewalls of the MTJ pillar structure and the selector pillar structure in the same memory pillar stack 888 may be vertically coincident because they are patterned during the same patterning step. The patterned etch mask layer can be subsequently removed.

For example, if the patterned etch mask layer comprises a photoresist layer, then an ashing or solvent removal process may be performed to remove remaining portions of the photoresist layer. If the patterned etch mask layer comprises a hard mask layer, then a selective etching process may be used to remove the hard mask layer.

Figure 71A:
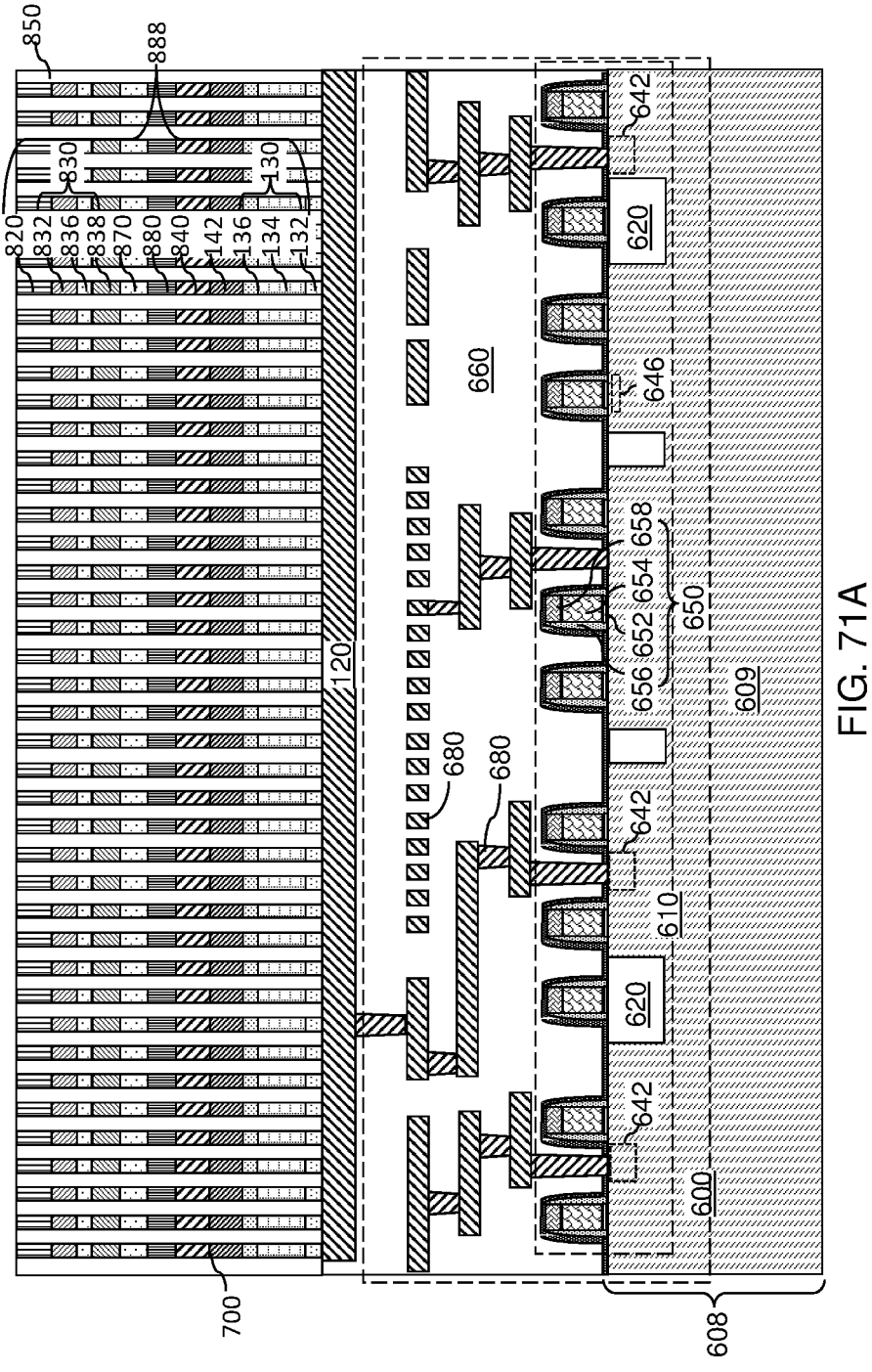
FIG. 71A is a vertical cross-sectional view of the seventh exemplary structure after formation of a dielectric matrix around the two-dimensional array of magnetic tunnel junction (MTJ) pillar structures and the array of selector pillar structures according to the seventh embodiment of the present disclosure.
Figure 71B:
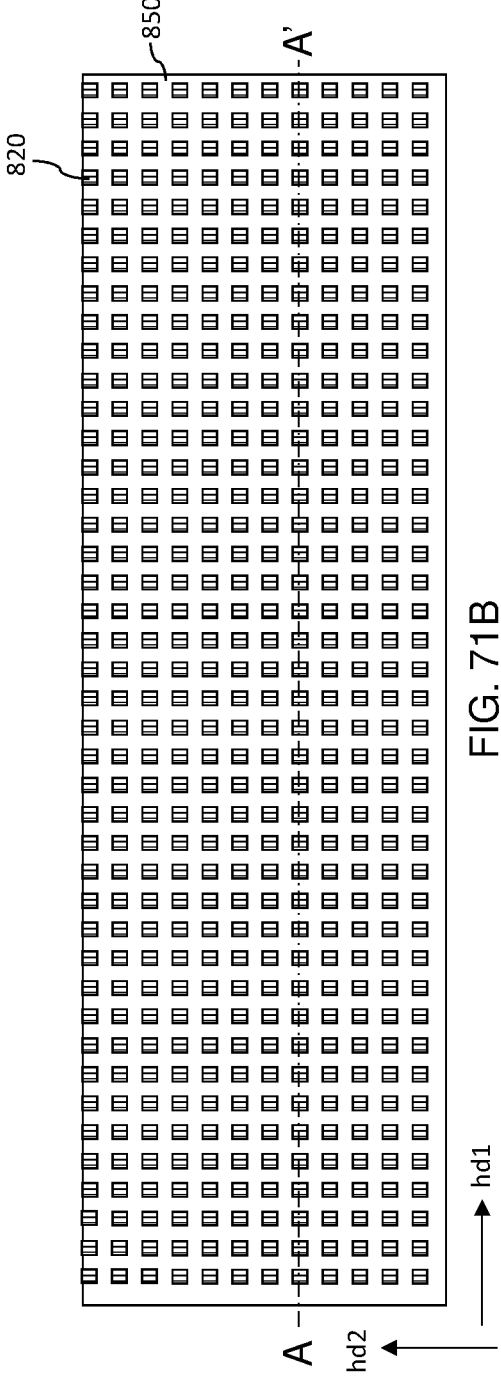
FIG. 71B is a top-down view of the seventh exemplary structure of FIG. 71A. The vertical plane A-A' is the cut plane of the vertical cross-sectional view of FIG. 71A.

Referring to FIGS. 71A and 71B, physically exposed sidewalls of the memory pillar stacks 888 may be passivated, for example, by performing a surface nitridation process. A dielectric matrix 850 can be formed around the two-dimensional array of memory pillar stacks 888 by conformally depositing at least one dielectric fill material such as silicon nitride, silicon carbide nitride, silicon oxide, and/or a dielectric metal oxide. Each of the at least one dielectric fill material may vertically extend across the horizontal plane including the bonding interfaces.

Figure 72A:
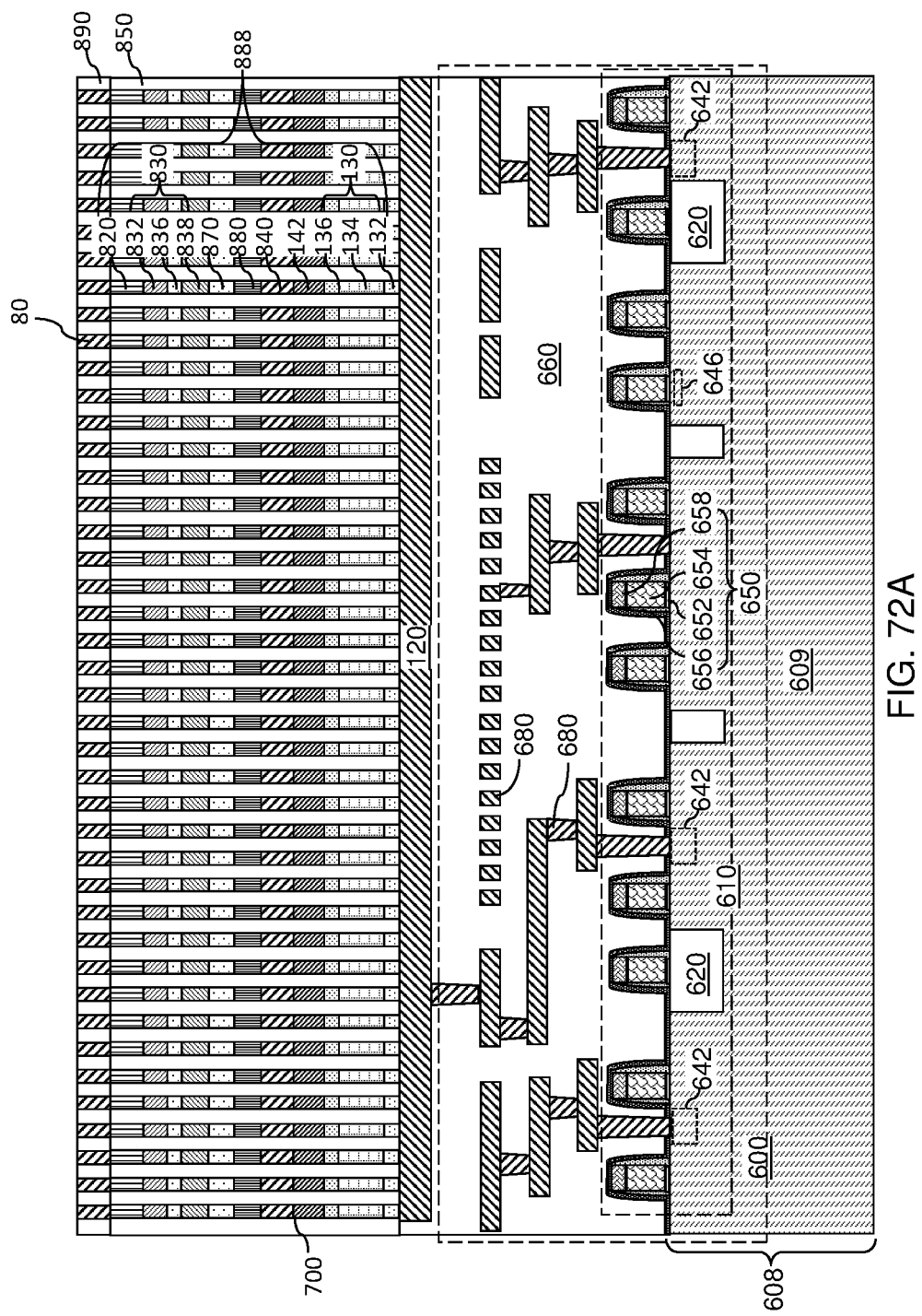
FIG. 72A is a vertical cross-sectional view of the seventh exemplary structure after formation of second electrically conductive lines according to the seventh embodiment of the present disclosure.
Figure 72B:
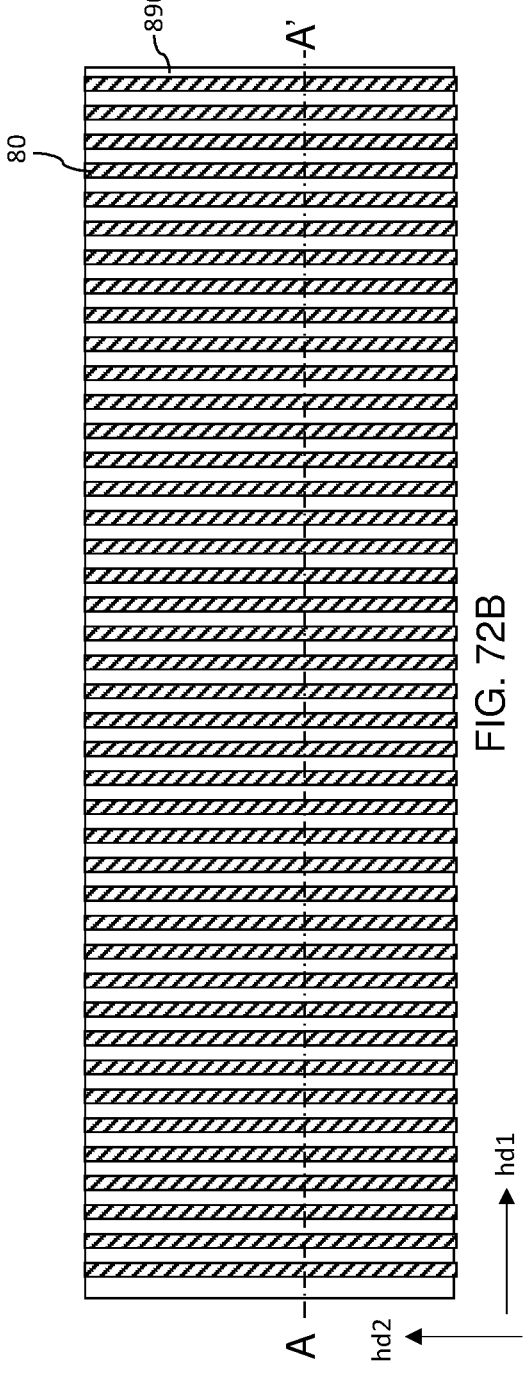
FIG. 72B is a top-down view of the seventh exemplary structure of FIG. 72A. The vertical plane A-A' is the cut plane of the vertical cross-sectional view of FIG. 72A.

Referring to FIGS. 72A and 72B, the processing steps of FIGS. 9A and 9B can be performed to form second electrically conductive lines 80 that are embedded in a dielectric material layer 890. The dielectric material layer 890 may comprise a same material as the second dielectric rails 90 described with reference to FIGS. 9A and 9B. Each second electrically conductive line 80 can contact top surfaces of a respective column of memory pillar stacks 888, which can be top surfaces of the SAF 820 or a top surface of the optional metal seed layer located over the SAF 820. The second electrically conductive lines (e.g., bit lines) 80 laterally extend along the second horizontal direction hd2, and are laterally spaced apart along the first horizontal direction hd1. The second electrically conductive lines 80 may have a uniform pitch along the first horizontal direction hd1 that can be the same as the first pitch of the two-dimensional periodic array of memory pillar stacks 888 along the first horizontal direction hd1.

Generally, the first electrically conductive lines 120 laterally extend along the first horizontal direction hd1, and the second electrically conductive lines 80 laterally extend along the second horizontal direction hd2 and overlie and contact the memory pillar structures 888. In one embodiment, each selector pillar structure (130, 142) comprises first straight sidewalls that vertically extend straight from a first electrically conductive line 120 to the bonding interface 700, and each overlying MTJ pillar structure (820, 830, 870, 880, 840) comprises second straight sidewalls that vertically extend from the bonding interface to a second electrically conductive line 80. The second straight sidewalls can be vertically coincident with the first straight sidewalls. Thus, each of the memory pillar structures 888 may comprise at least one straight sidewall (which may be a cylindrical straight sidewall or a plurality of straight sidewalls that are adjoined to each other at vertically-extending edges) that vertically extends from a first electrically conductive line 120 to a second electrically conductive line 80.

Subsequently, additional metal interconnect structures (not shown) embedded in additional dielectric material layers (not shown) may be formed to provide electrical connection between the second electrically conductive lines 80 and the semiconductor devices 610 via the metal interconnect structures 680 that are embedded in dielectric material layers 660. The additional metal interconnect structures are herein referred to as upper metal interconnect structures, the additional dielectric material layers are herein referred to as upper dielectric material layers, the metal interconnect structures 680 are referred to as lower metal interconnect structures, and the dielectric material layers 660 are referred to as lower dielectric material layers.

Figure 73:
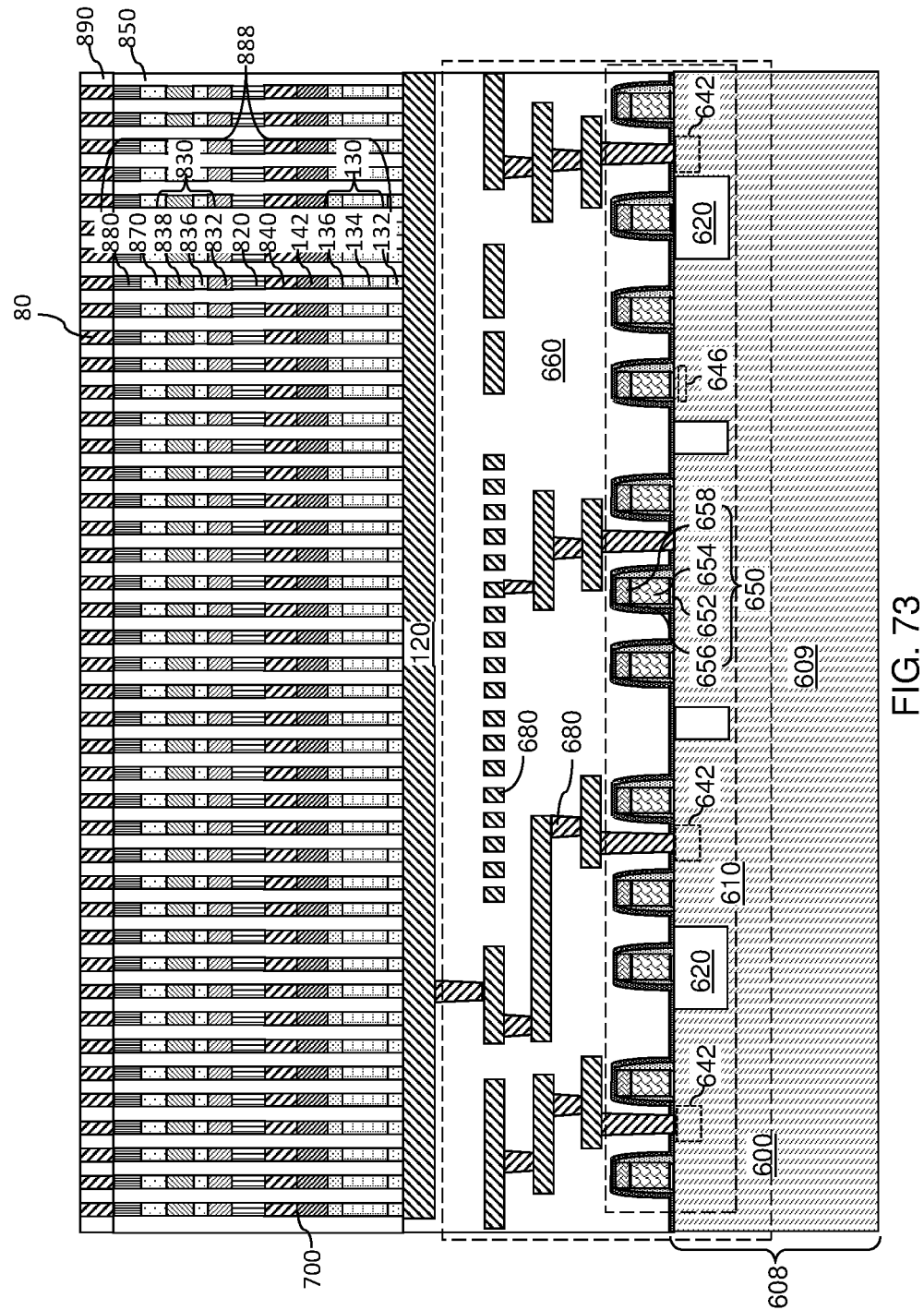
FIG. 73 is a vertical cross-sectional view of an alternative embodiment of the seventh exemplary structure after formation of second electrically conductive lines according to the seventh embodiment of the present disclosure.

Referring to FIG. 73, an alternative embodiment of the seventh exemplary structure may be derived from the seventh exemplary structure illustrated in FIGS. 72A and FIG. 72B by changing the order of layers within the continuous MRAM layer stack (820L, 830L, 870L, 880L, 840L) that is formed at the processing steps of FIG. 67. Specifically, the continuous MRAM layer stack (820L, 830L, 870L, 880L, 940L) may include, from top to bottom, the SAF layer 820L, a continuous magnetic tunnel junction layer stack 830L, a continuous capping dielectric layer 870L, and an optional continuous nonmagnetic metal capping layer 880L. Further, the continuous MRAM layer stack (820L, 830L, 870L, 880L, 940L) may include an optional junction-side bonding material layer 840L as a topmost layer. In other words, the continuous MRAM layer stack (820L, 830L, 870L, 880L, 940L) may include, from bottom to top, the SAF layer 880L, the continuous capping dielectric layer 870L, the continuous magnetic tunnel junction layer stack 830L, the optional continuous SAF layer 820L, and the optional junction-side bonding material layer 840L. The continuous magnetic tunnel junction layer stack 830L may comprise, from a side that is distal from the continuous capping dielectric layer 870L to a side that is proximal to the continuous capping dielectric layer 870L, the continuous reference layer 832L, the continuous tunnel barrier layer 836L, and the continuous free layer 838L.

Subsequently, the processing steps of FIGS. 68-72B may be performed, with any needed changes in view of the change in the order of layers within the continuous MRAM layer stack (820L, 830L, 870L, 880L, 940L), to provide the alternative configuration of the seventh exemplary structure illustrated in FIG. 73. Changes in the processing steps may include changes in the order of the etch steps employed during the anisotropic etch process that forms the two-dimensional array of memory pillar structures 888. In this alternative configuration, the free layer 838 is located further from the bonding interface 700 than the reference layer 832.

Figure 74A:
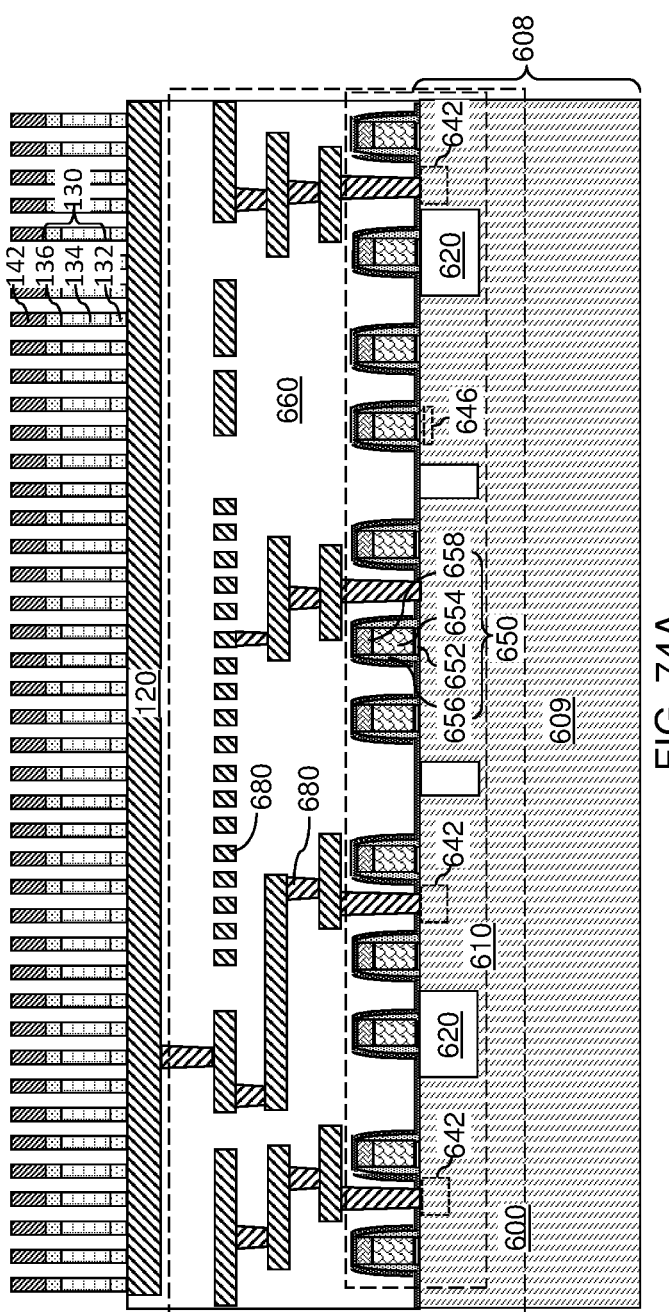
FIG. 74A is a vertical cross-sectional view of an eighth exemplary structure after formation of a two-dimensional array of selector pillar structures according to an eighth embodiment of the present disclosure.
Figure 74B:
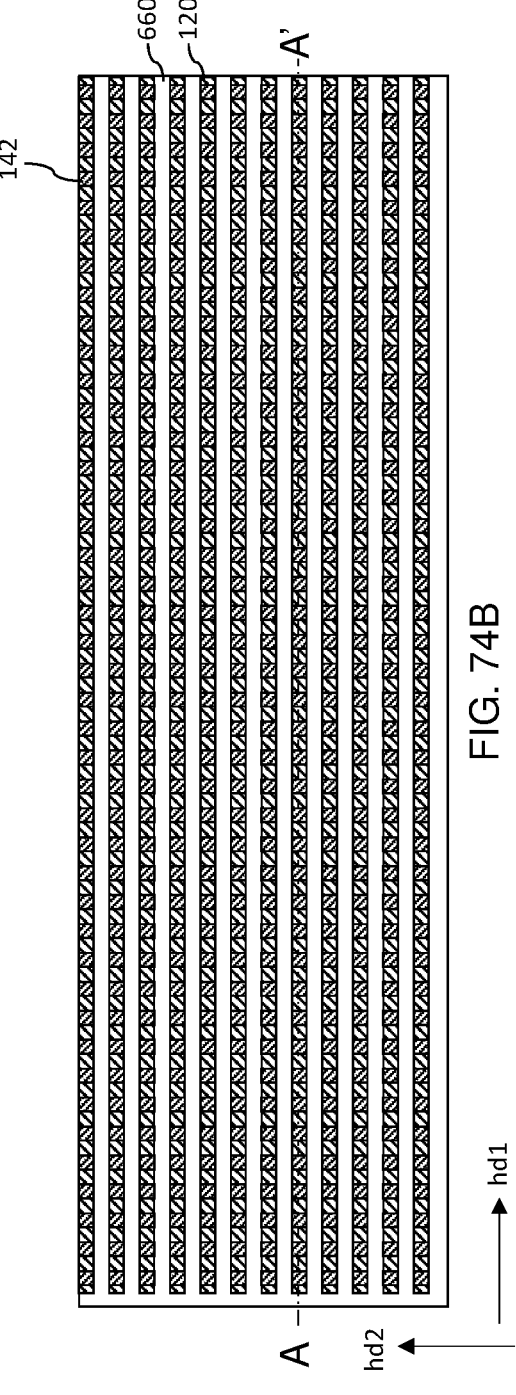
FIG. 74B is a top-down view of the eighth exemplary structure of FIG. 74A. The vertical plane A-A' is the cut plane of the vertical cross-sectional view of FIG. 74A.

Referring to FIGS. 74A and 74B, an eighth exemplary structure according to an eighth embodiment of the present disclosure may be derived from the seventh exemplary structure illustrated in FIG. 66 by forming a first patterned etch mask layer (not shown) over the top surface of the selector-side bonding material layer 142L. The first patterned etch mask layer may comprise a patterned photoresist layer, or a patterned hard mask layer that can be formed by depositing and patterning a hard mask layer. The pattern in the first patterned etch mask layer may comprise a pattern of a periodic two-dimensional array of discrete areas having a first pitch along the first horizontal direction hd1 and having a second pitch along the second horizontal direction hd2. The second pitch may be the same as the pitch of the first electrically conductive lines 120 along the second horizontal direction hd2. The first pitch may be the same as the pitch of second electrically conductive lines to be subsequently formed along the first horizontal direction hd1. Each of the first pitch and the second pitch may be in a range from 20 nm to 100 nm, such as from 30 nm to 50 nm, although lesser and greater pitches may also be employed. The first pitch and the second pitch may be independently selected. The shape of each discrete area may rectangular, circular, oval, or of any closed two-dimensional curvilinear shape. In one embodiment, the shape of each discrete area within the pattern in the patterned etch mask layer may be a circle, a square, or a rounded square (i.e., a shape that is derived from a square by rounding the corners).

A first anisotropic etch process can be performed to transfer the pattern in the first patterned etch mask layer through the optional selector-side bonding material layer 142L and the selector-level layers 130L. The first patterned etch mask layer can be employed as an etch mask for the first anisotropic etch process. The combination of the selector-side bonding material layer 142L and the selector-level layers 130L can be patterned into a two-dimensional periodic array of selector pillar structures (130, 142).

Each selector pillar structure (130, 142) comprises a selector element 130 that is a patterned portion of the selector-level layers 130L, and an optional selector-side bonding pad 142 that is a patterned portion of the selector-side bonding material layer 142L. Each selector element 130 may comprise a selector material plate 134 that is a patterned portion of the selector material layer 134L. In one embodiment, each selector element 130 may also comprise a lower electrode plate 132 that is a patterned portion of the lower electrode layer 132L, an upper electrode plate 136 that is a patterned portion of the upper electrode layer 136L, and the selector material plate 134 located between them. The first patterned etch mask layer can be subsequently removed.

Figure 75A:
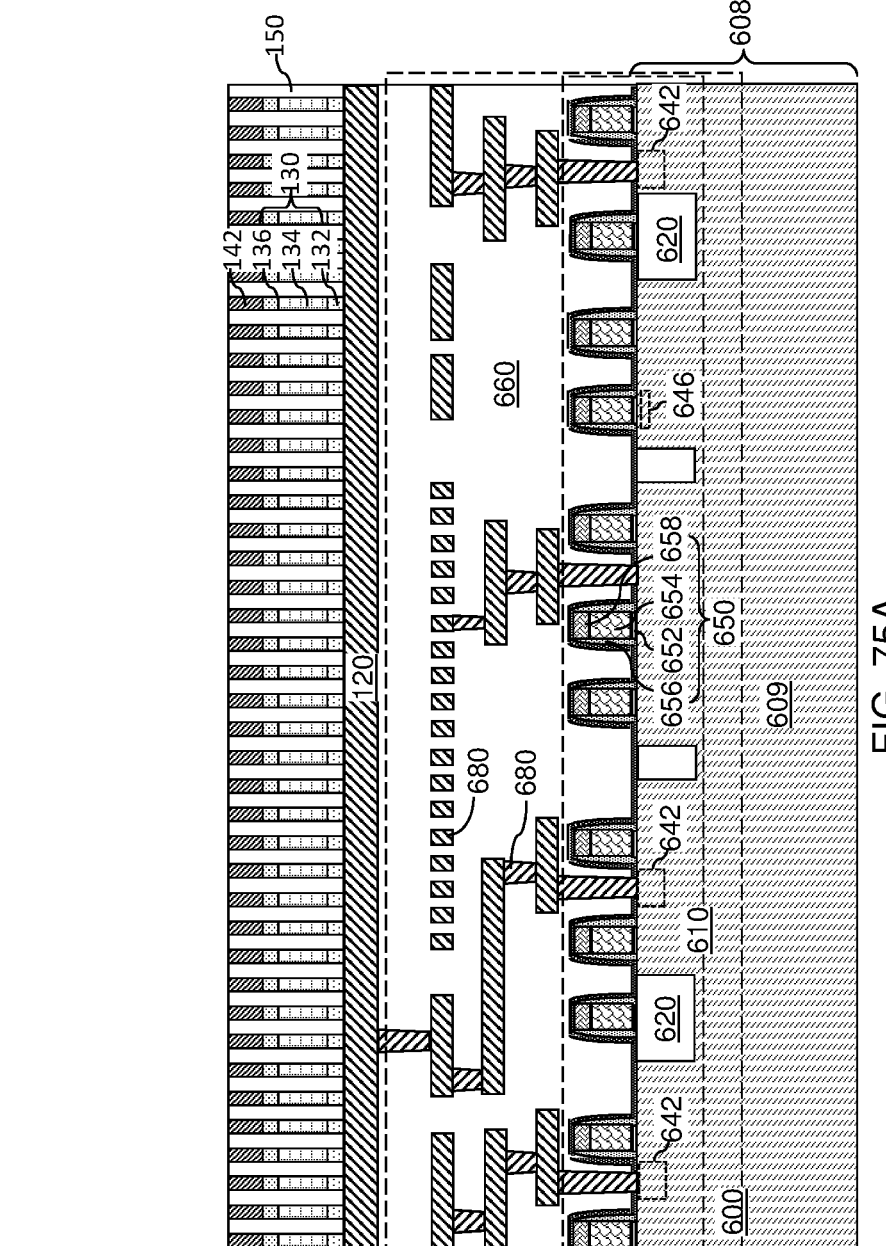
FIG. 75A is a vertical cross-sectional view of the eighth exemplary structure after formation of a first dielectric matrix around the two-dimensional array of selector pillar structures according to the eighth embodiment of the present disclosure.
Figure 75B:
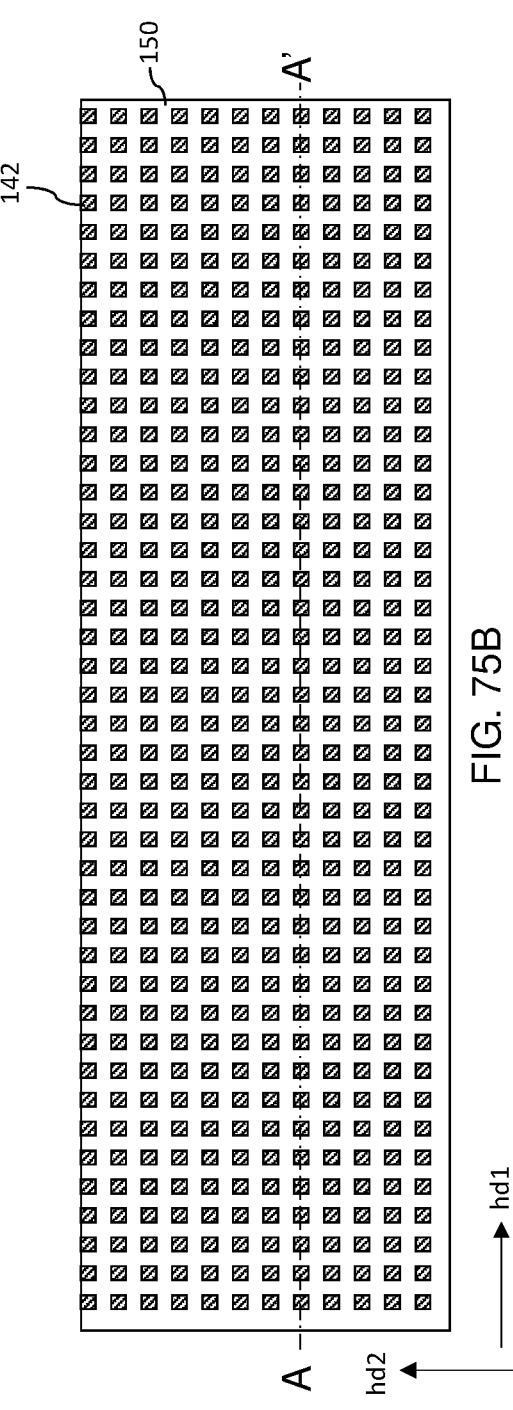
FIG. 75B is a top-down view of the eighth exemplary structure of FIG. 75A. The vertical plane A-A' is the cut plane of the vertical cross-sectional view of FIG. 75A.

Referring to FIGS. 75A and 75B, a first dielectric matrix 150 can be formed around the two-dimensional array of selector pillar structures (130, 142) by conformally depositing at least one first dielectric fill material, such as silicon nitride, silicon carbide nitride, silicon oxide, and/or a dielectric metal oxide. The top surface of the first dielectric matrix 150 may be formed within a same horizontal plane as the top surfaces of the two-dimensional array of selector pillar structures (130, 142).

Figure 76:
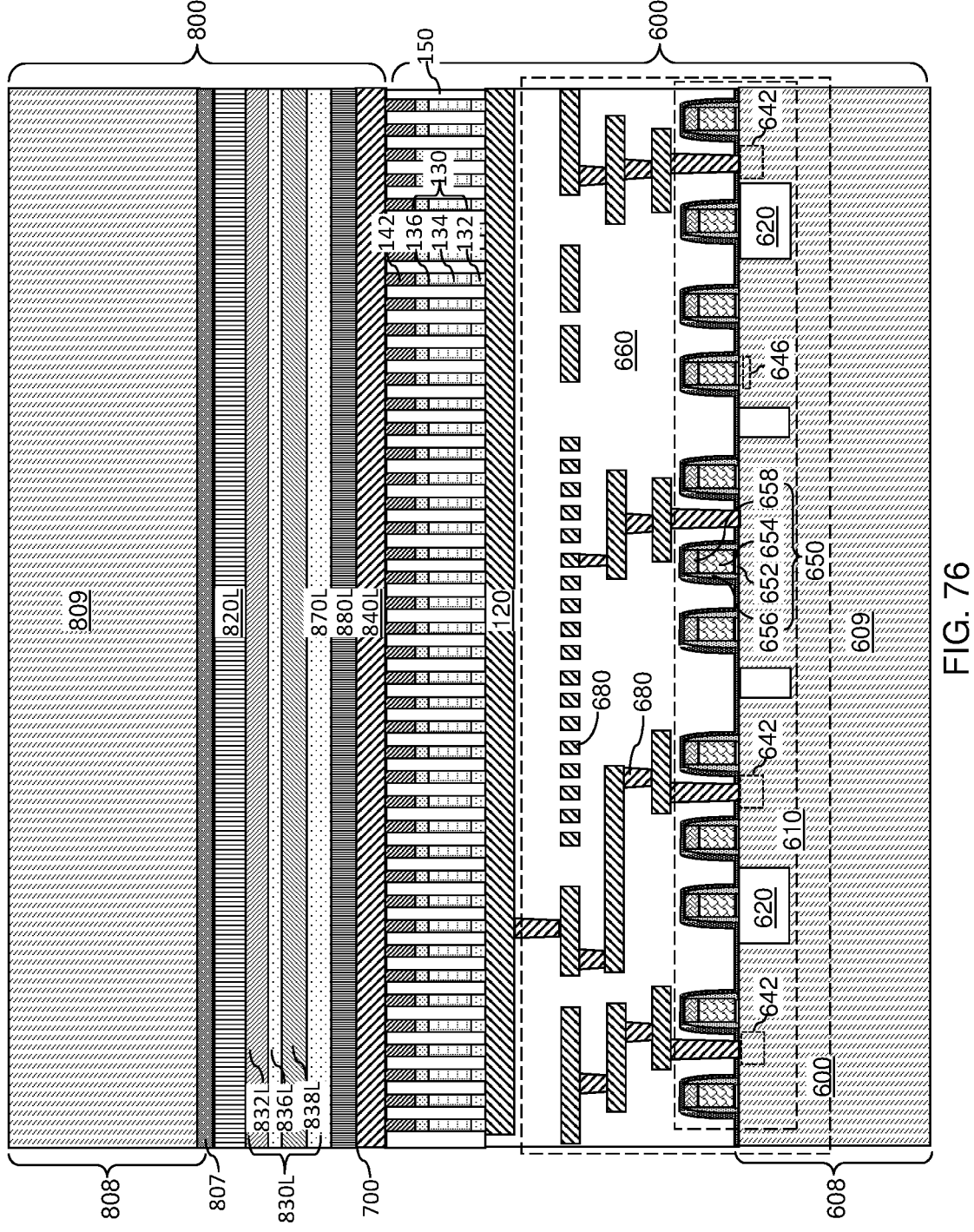
FIG. 76 is a vertical cross-sectional view of the eighth exemplary structure after bonding the junction-side bonding material layer on a second substrate with the selector-side bonding material layer according to the eighth embodiment of the present disclosure.

Referring to FIG. 76, the first semiconductor die 600 as formed at the processing steps of FIGS. 75A and 75B can be bonded to the second semiconductor die 800 that is provided at the processing steps of FIG. 67. The second metallic bonding material of the junction-side bonding material layer 840L can be bonded to the first metallic bonding material of the selector-side bonding plates 142 by metal-to-metal bonding. Additionally, the second metallic bonding material of the junction-side bonding material layer 840L can be bonded to the at least one first dielectric fill material of the first dielectric matrix 150.

Figure 77:
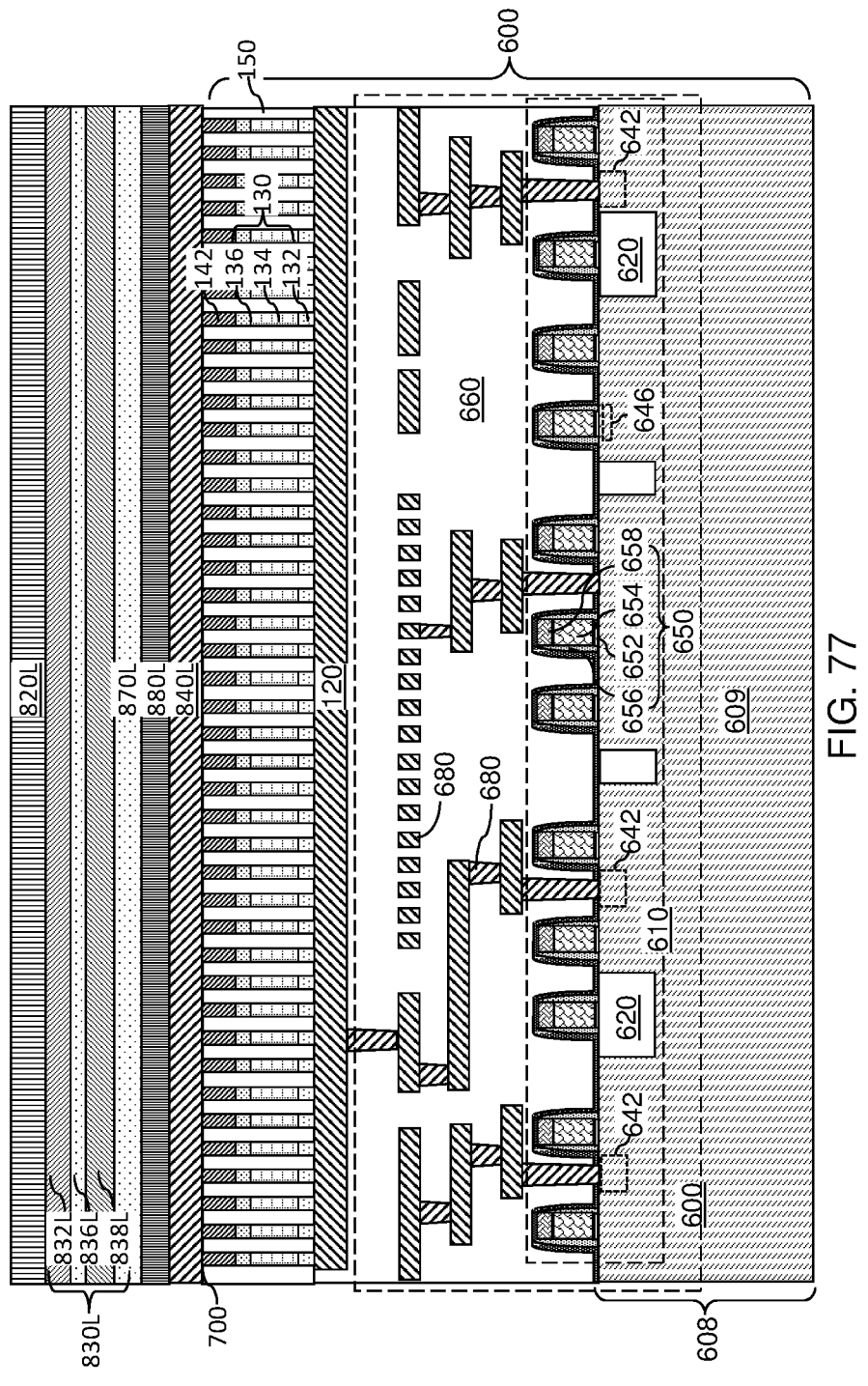
FIG. 77 is a vertical cross-sectional view of the eighth exemplary structure after removal of the second substrate according to the eighth embodiment of the present disclosure.

Referring to FIG. 77, the processing steps of FIG. 69 can be performed to remove the second substrate 808 from the bonded assembly of the first semiconductor die 600 and the second semiconductor die 800. Subsequently, the planarization stop material layer 807 may be removed selective to the material of the continuous MRAM layer stack (820L, 830L, 870L, 880L, 840L).

Figure 78A:
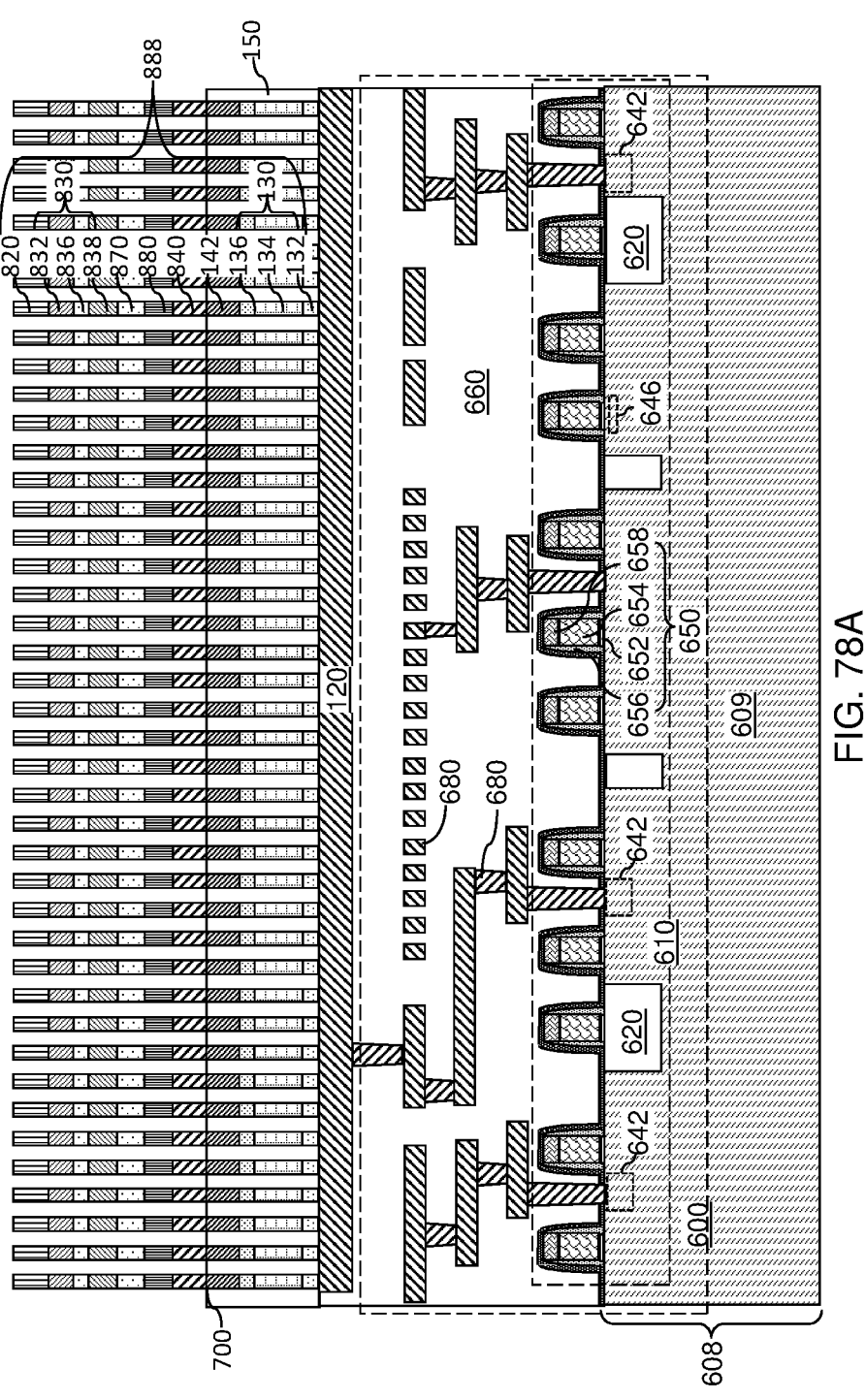
FIG. 78A is a vertical cross-sectional view of the eighth exemplary structure after patterning a two-dimensional array of magnetic tunnel junction (MTJ) pillar structures and a two-dimensional array of selector pillar structures according to the eighth embodiment of the present disclosure.
Figure 78B:
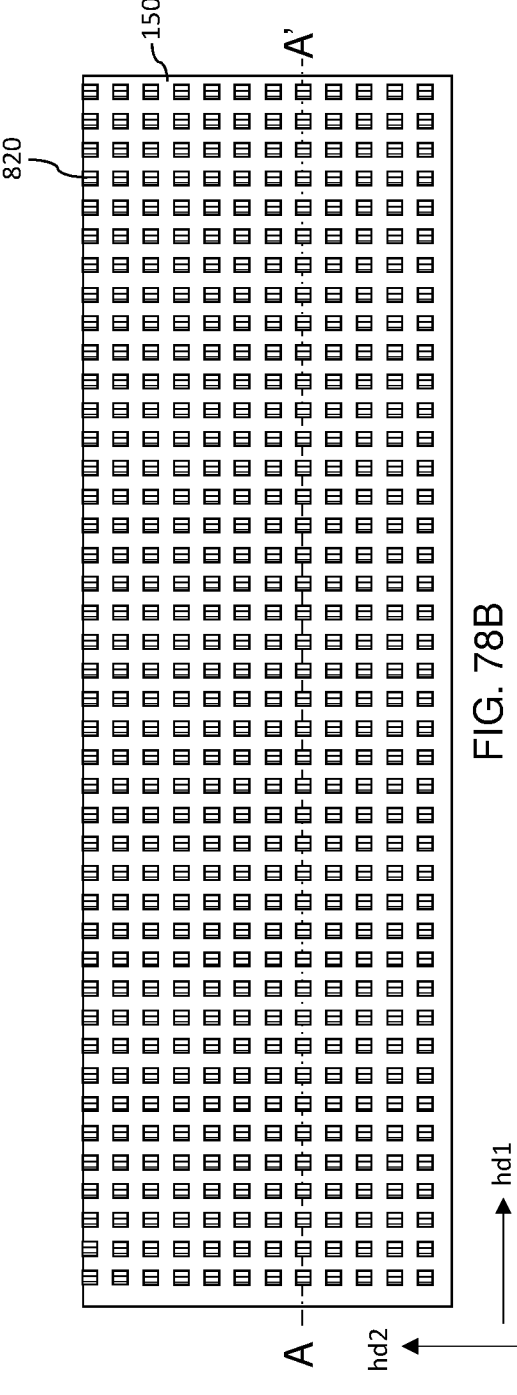
FIG. 78B is a top-down view of the eighth exemplary structure of FIG. 78A. The vertical plane A-A' is the cut plane of the vertical cross-sectional view of FIG. 78A.

Referring to FIGS. 78A and 78B, a second patterned etch mask layer (not shown) can be formed over a top surface of the continuous MRAM layer stack. In one embodiment, the pattern in the second patterned etch mask layer may comprise a mirror image pattern of the pattern in the first patterned etch mask layer described above.

A second anisotropic etch process (e.g. an IBE process) can be performed to transfer the pattern in the patterned etch mask layer through the continuous MRAM layer stack (820L, 830L, 870L, 880L, 840L). The second patterned etch mask layer can be employed as an etch mask for the second anisotropic etch process. The continuous MRAM layer stack (820L, 830L, 870L, 880L, 840L) can be patterned into the above described two-dimensional periodic array of magnetic tunnel junction (MTJ) pillar structures (820, 830, 870, 880, 840). Each vertically adjoined pair of a selector pillar structure (130, 142) and an MTJ pillar structure (820, 830, 870, 880, 840) constitutes a memory pillar stack 888. Thus, a two-dimensional array of memory pillar stacks 888 can be formed.

Figure 79A:
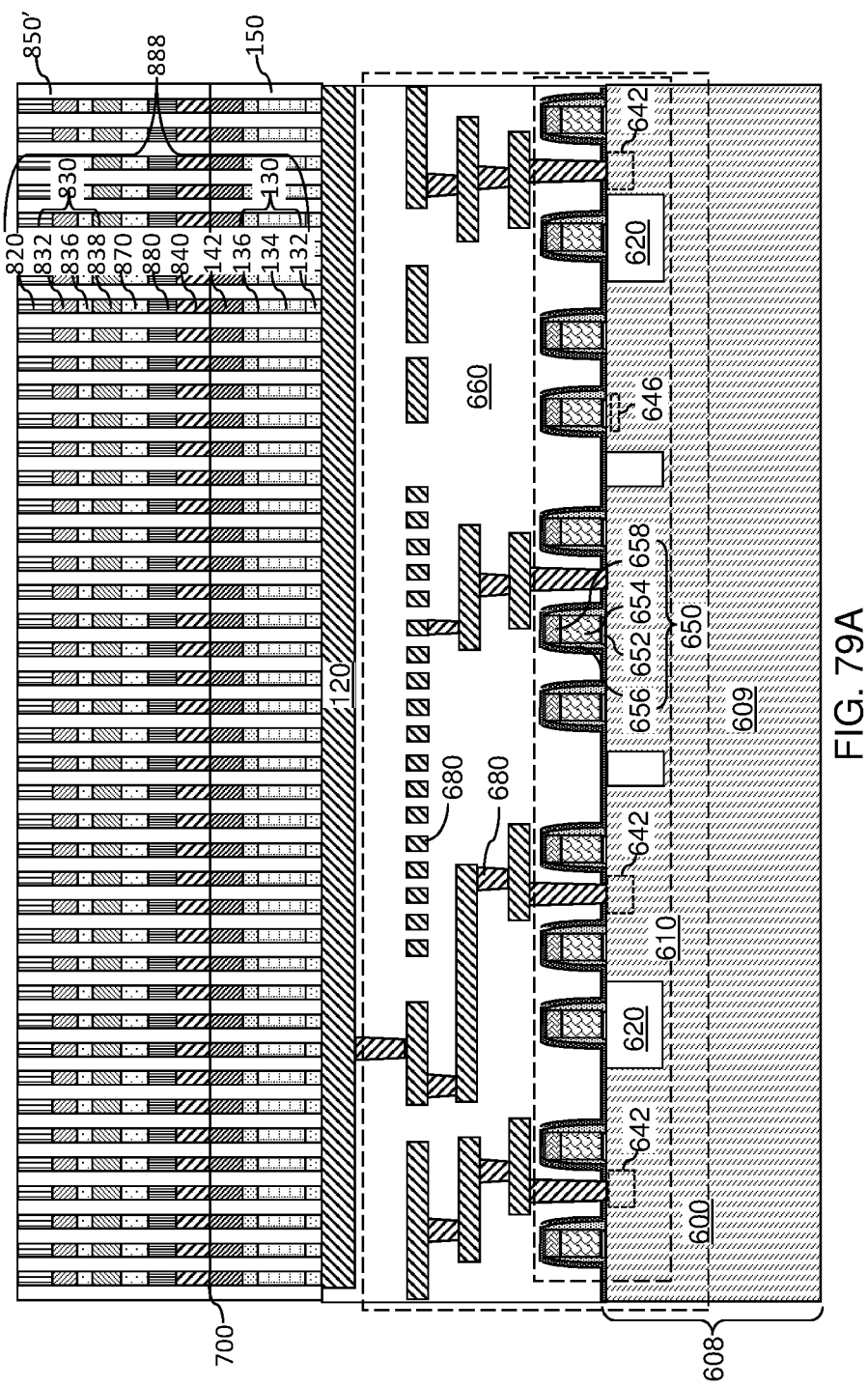
FIG. 79A is a vertical cross-sectional view of the eighth exemplary structure after formation of a second dielectric matrix around the two-dimensional array of magnetic tunnel junction (MTJ) pillar structures and the array of selector pillar structures according to the eighth embodiment of the present disclosure.
Figure 79B:
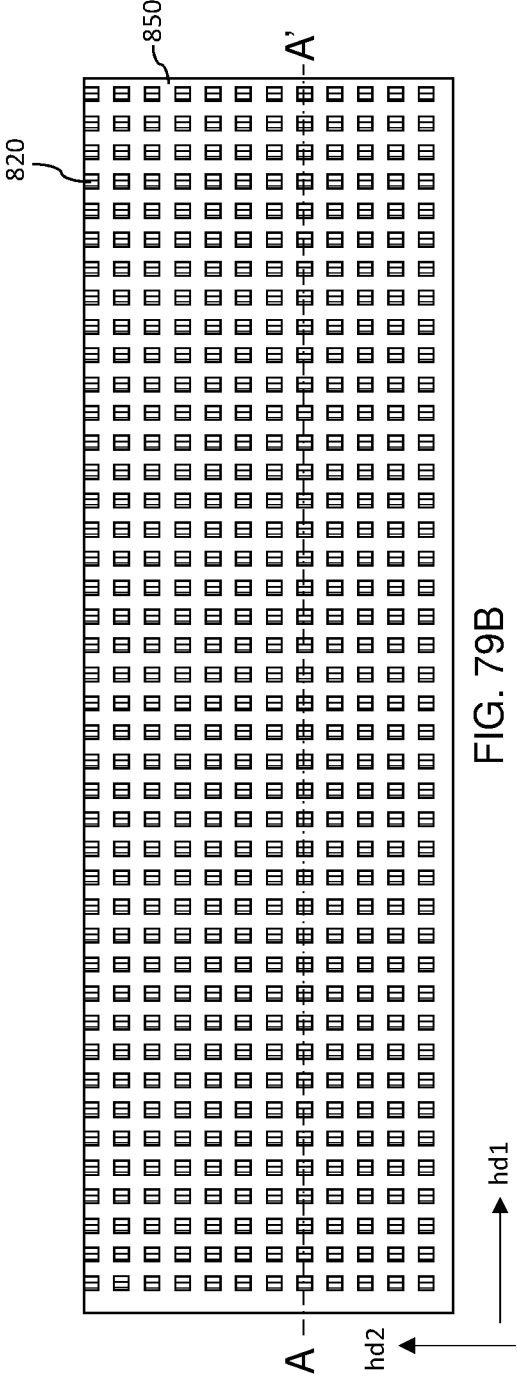
FIG. 79B is a top-down view of the eighth exemplary structure of FIG. 79A. The vertical plane A-A' is the cut plane of the vertical cross-sectional view of FIG. 79A.

Referring to FIGS. 79A and 79B, a second dielectric matrix 850' can be formed around the two-dimensional array of MTJ pillar structures (820, 830, 870, 880, 840) by conformally depositing at least one dielectric fill material, such as silicon nitride, silicon carbide nitride, silicon oxide, and/or a dielectric metal oxide. The top surface of the second dielectric matrix 850' may be formed within a same horizontal plane as top surfaces of the MTJ pillar structures (820, 830, 870, 880, 840). In one embodiment, a periphery of a first planar surface of the first dielectric matrix 150 within the bonding interface 700 may be is laterally offset from a periphery of a second planar surface of the second dielectric matrix 850' within the bonding interface 700. An extent of the offset may be less than a width of the MTJ pillar structure (820, 830, 870, 880, 840).

Figure 80A:
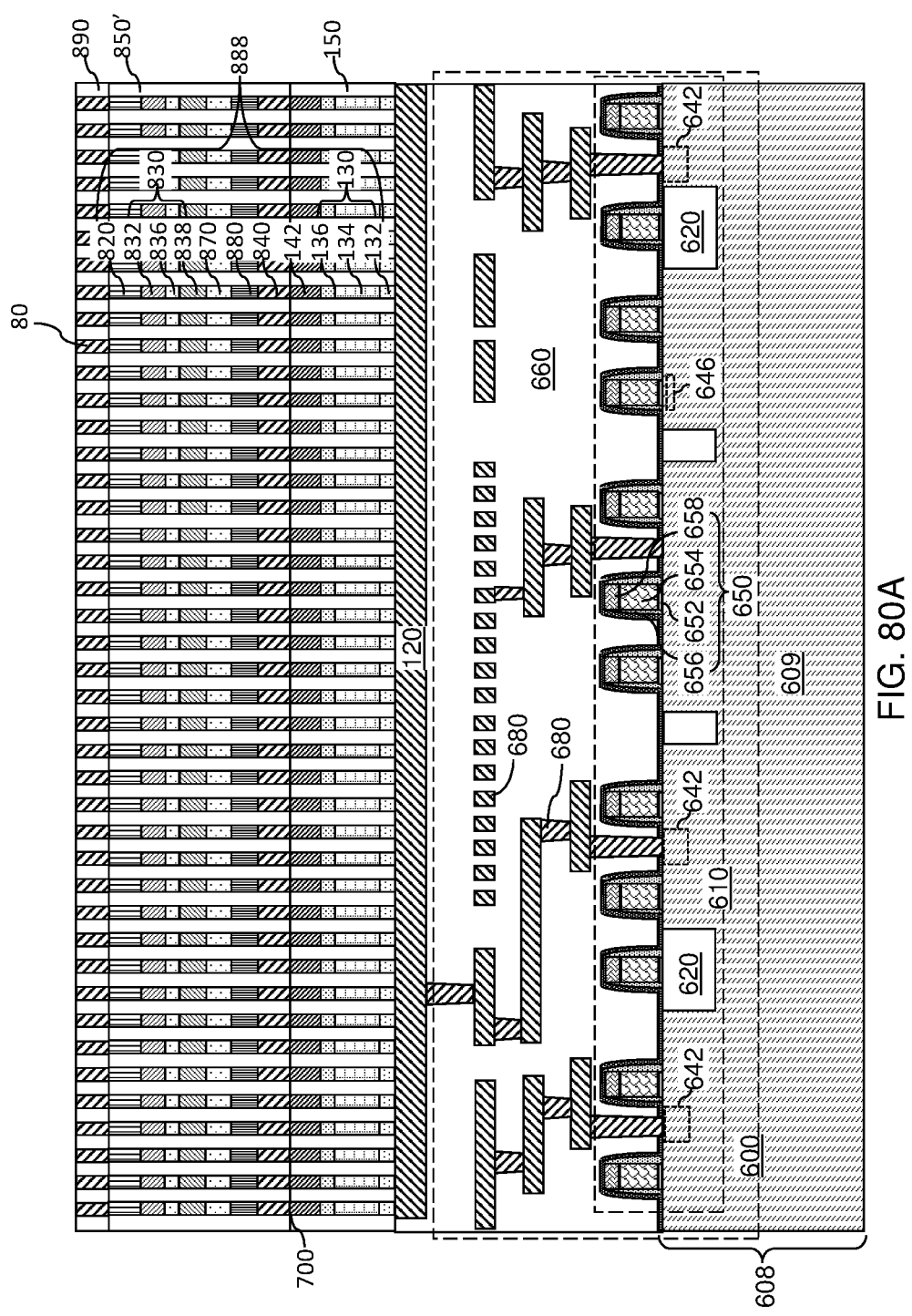
FIG. 80A is a vertical cross-sectional view of the eighth exemplary structure after formation of second electrically conductive lines according to the eighth embodiment of the present disclosure.
Figure 80B:
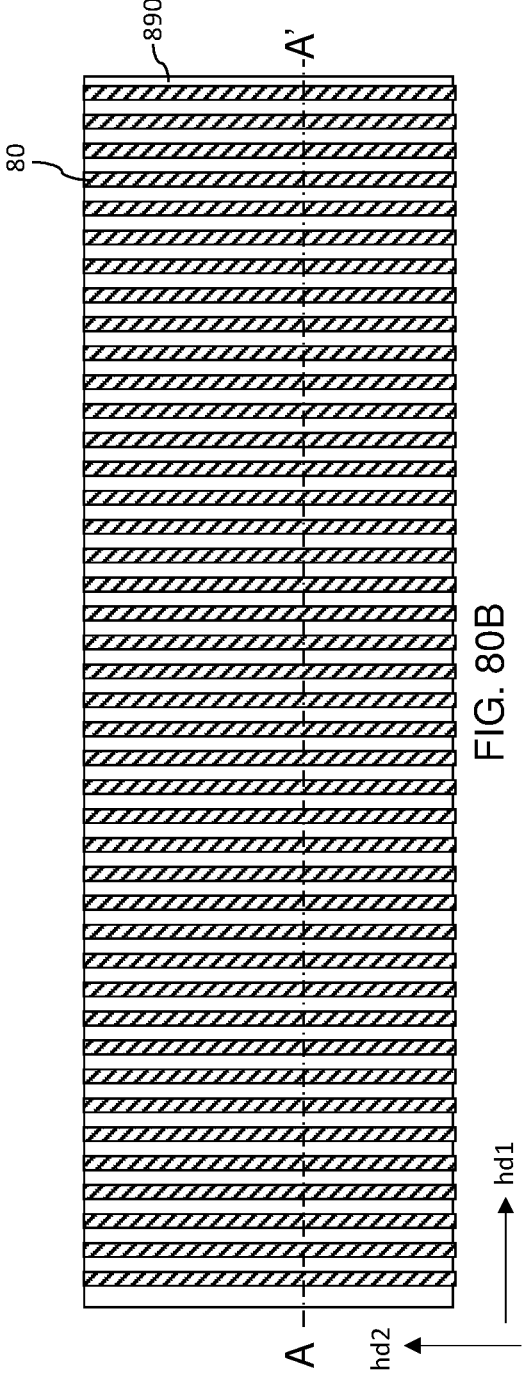
FIG. 80B is a top-down view of the eighth exemplary structure of FIG. 80A. The vertical plane A-A' is the cut plane of the vertical cross-sectional view of FIG. 80A.

Referring to FIGS. 80A and 80B, the processing steps of FIGS. 9A and 9B can be performed to form second electrically conductive lines 80 that are embedded in a dielectric material layer 890. The dielectric material layer 890 may comprise a same material as the second dielectric rails 90 as described with reference to FIGS. 9A and 9B. Each second electrically conductive line 80 can contact top surfaces of a respective column of memory pillar stacks 888, as described above. The second electrically conductive lines 80 laterally extend along the second horizontal direction hd2, and are laterally spaced apart along the first horizontal direction hd1. The second electrically conductive lines 80 may have a uniform pitch along the first horizontal direction hd1 that can be the same as the first pitch of the two-dimensional periodic array of memory pillar stacks 888 along the first horizontal direction hd1.

In one embodiment, each selector pillar structure (130, 142) comprises first straight sidewalls that vertically extend straight from a first electrically conductive line 120 to the bonding interface 700, and each overlying MTJ pillar structure (820, 830, 870, 880, 840) comprises second straight sidewalls that vertically extend from the bonding interface 700 to a second electrically conductive line 80. The second straight sidewalls can be laterally offset from the first straight sidewalls. The lateral offset along the first horizontal direction hd1 may be less than 50%, such as less than 30%, and/or less than 15%, (e.g., 1 to 10%) of the pitch of the two-dimensional array of memory pillar structures 888 along the first horizontal direction hd1 (i.e., the first pitch). The lateral offset along the second horizontal direction hd2 may be less than 50%, such as less than 30%, and/or less than 15% (e.g., 1 to 10%), of the pitch of the two-dimensional array of memory pillar structures 888 along the second horizontal direction hd2 (i.e., the second pitch). In an embodiment, the extent of the offset along the first horizontal direction hd1 and/or along the second horizontal direction hd2 is less than a width of the MTJ pillar structure (820, 830, 870, 880, 840). Thus, each of the memory pillar structures 888 may comprise a stepped sidewall that vertically extends from a first electrically conductive line 120 to a second electrically conductive line 80 with a horizontally-extending step within a horizontal plane including the bonding interfaces 700.

Subsequently, additional metal interconnect structures (not shown) embedded in additional dielectric material layers (not shown) may be formed to provide electrical connection between the second electrically conductive lines 80 and the semiconductor devices 610 via the metal interconnect structures 680 that are embedded in dielectric material layers 660.

Figure 81:
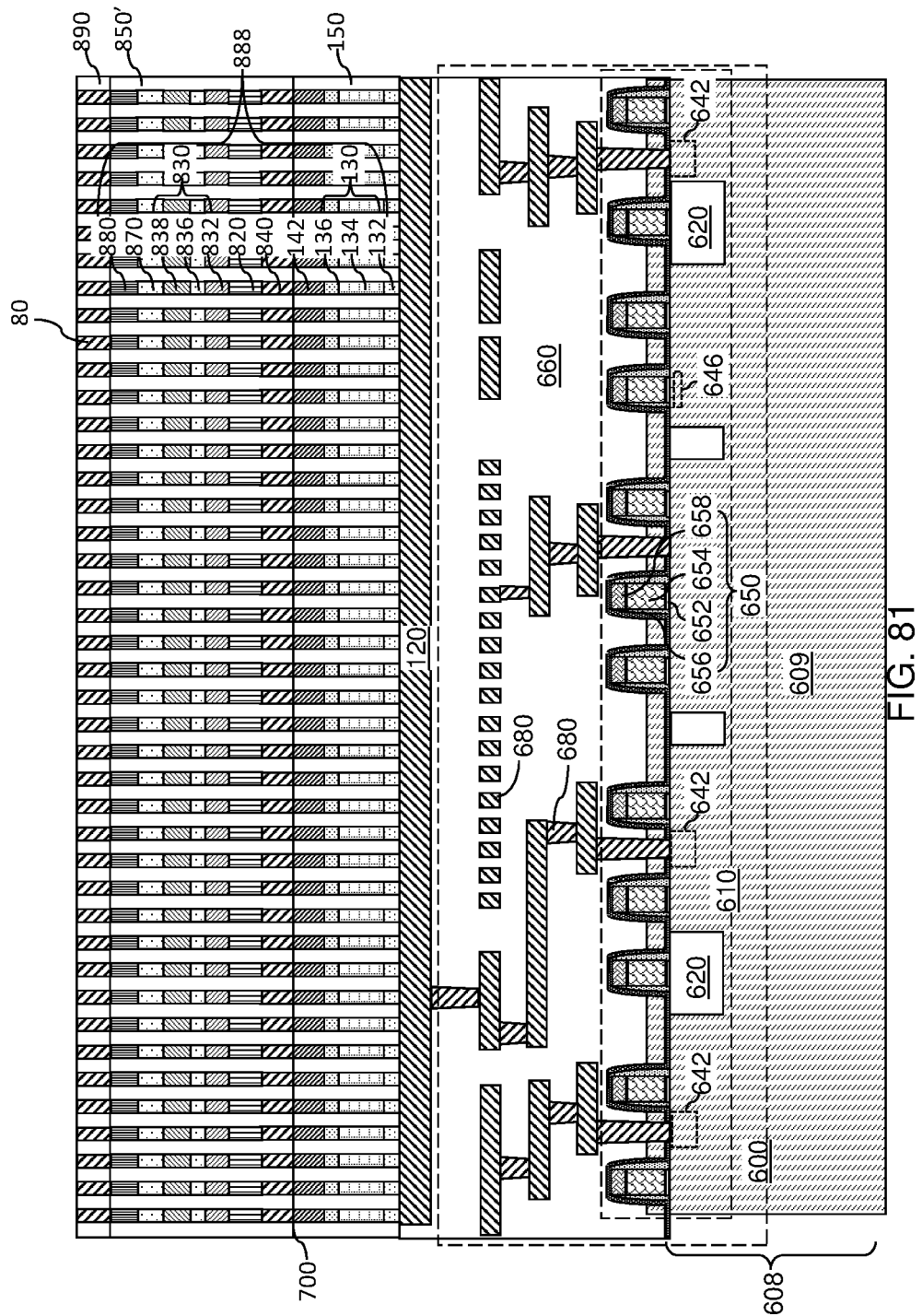
FIG. 81 is a vertical cross-sectional view of an alternative embodiment of the eighth exemplary structure after formation of second electrically conductive lines according to the eighth embodiment of the present disclosure.

Referring to FIG. 81, an alternative embodiment of the seventh exemplary structure may be derived from the eighth exemplary structure illustrated in FIGS. 80A and FIG. 80B by changing the order of layers within the continuous MRAM layer stack (820L, 830L, 870L, 880L, 840L) that is formed at the processing steps of FIG. 76. In this case, the continuous MRAM layer stack (820L, 830L, 870L, 880L, 940L) may include, from bottom to top, an optional continuous nonmagnetic metal capping layer 880L, a continuous capping dielectric layer 870L, a continuous magnetic tunnel junction layer stack 830L, the SAF layer 820L, and a junction-side bonding material layer 840L. The continuous magnetic tunnel junction layer stack 830L may comprise, from a side that is distal from the continuous capping dielectric layer 870L to a side that is proximal to the continuous capping dielectric layer 870L, a continuous reference layer 832L, a continuous tunnel barrier layer 836L, and a continuous free layer 838L.

Subsequently, the second semiconductor die 800 is bonded with the first semiconductor die 600 as provided at the processing steps of FIGS. 75A and 75B. the processing steps of FIGS. 76-80B may be performed, with any needed changes in view of the change in the order of layers within the continuous MRAM layer stack (820L, 830L, 870L, 880L, 940L), to provide the alternative configuration of the seventh exemplary structure illustrated in FIG. 73. Changes in the processing steps may include changes in the order of the etch steps employed during the anisotropic etch process that forms the two-dimensional array of memory pillar structures 888.

The various methods and structures described with reference to the seventh and eighth embodiments may be employed to facilitate economical and high-yield production of MRAM devices. By forming the MRAM layer stack on a separate substrate from the driver circuit, the MRAM layer stack may be annealed prior to bonding at a higher temperature (e.g., above 400 degrees Celsius) to obtain more favorable magnetic properties without damaging the driver circuit devices.

In the eighth embodiment, the selector layer stack may be patterned by RIE prior to the bonding step without damaging the MRAM layer stack. Likewise, the MRAM layer stack may be patterned by IBE prior to the bonding step without damaging the selector layer stack.

In some configurations, the continuous free layer and the continuous tunnel barrier layer are is located near the top of the MRAM layer stack prior to bonding the two dies. Thus, the tunnel barrier layer located near the top of the MRAM layer stack is less susceptible to metallic redeposition which causes shorts during the subsequent IBE process. Furthermore, a grown bottom reference layer and SAF structure in the MRAM layer stack may have a more magnetically desirable stack post anneal.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

50

What is claimed is:

1. A memory device, comprising:
a first electrically conductive line;
a second electrically conductive line; and
a memory pillar stack located between the first and the second electrically conductive lines, wherein:
the memory pillar stack comprises a selector pillar structure bonded to a magnetic tunnel junction (MTJ) pillar structure comprising a ferromagnetic reference layer, a tunnel barrier layer, a ferromagnetic free layer, and a junction-side bonding plate comprising second metallic bonding material;
the selector pillar structure comprises a material functioning as a voltage-dependent switch, and a selector-side bonding pad comprising a first metallic bonding material; and
a bonding interface at which the junction-side bonding plate is bonded to the selector-side bonding pad by metal-to-metal bonding is located between the selector pillar structure and the MTJ pillar structure.

2. The memory device of claim 1, wherein:
the first electrically conductive line laterally extends along a first horizontal direction over a substrate and contacts a bottom end of the memory pillar structure; and
the second electrically conductive line laterally extends along a second horizontal direction and contacts a top end of the memory pillar structure.

3. The memory device of claim 2, wherein the memory pillar stack comprises straight sidewalls that vertically extend straight from the first electrically conductive line to the second electrically conductive line and are free of any lateral steps.

4. The memory device of claim 3, wherein the memory pillar stack is laterally surrounded by a dielectric matrix having a homogeneous material composition throughout, and vertically extending from the first electrically conductive line to the second electrically conductive line.

5. The memory device of claim 1, wherein:
the selector pillar structure comprises a selector material plate and a selector-side bonding plate;
the MTJ pillar structure comprises a junction-side bonding plate; and
the selector-side bonding plate is bonded to the junction-side bonding plate with the bonding interface located therebetween.

6. The memory device of claim 5, wherein the selector material plate comprises an ovonic threshold switch material plate located between upper and lower electrode plates.

7. The memory device of claim 1, wherein the ferromagnetic free layer is located more proximal to the bonding interface than the ferromagnetic reference layer is to the bonding interface.

8. The memory device of claim 1, wherein sidewalls of the selector pillar structure are laterally offset from sidewalls of the MTJ pillar structure, and wherein an extent of the offset is less than a width of the MTJ pillar structure.

9. The memory device of claim 1, wherein:
the selector pillar structure comprises first straight sidewalls that vertically extend straight from the first electrically conductive line to the bonding interface;
the MTJ pillar structure comprises second straight sidewalls that vertically extend from the bonding interface to the second electrically conductive line; and
the second straight sidewalls are laterally offset from the first straight sidewalls.

10. The memory device of claim 1, wherein:

the selector pillar structure is laterally surrounded by a first dielectric matrix having a first homogeneous material composition; and the MTJ pillar structure is laterally surrounded by a second dielectric matrix having a second homogeneous material composition;

a periphery of a first planar surface of the first dielectric matrix within the bonding interface is laterally offset from a periphery of a second planar surface of the second dielectric matrix within the bonding interface; and an extent of the offset is less than a width of the MTJ pillar structure.

11. The memory device of claim 1, wherein the bonding interface is located between the selector pillar structure and the free layer of the MTJ pillar structure.

12. The memory device of claim 11, wherein the selector pillar structure comprises a stack including a first electrode plate comprising a first non-metallic conductive material, a second electrode plate comprising a second non-metallic conductive material, and a selector material plate located between the first electrode plate and the second electrode plate.

13. The memory device of claim 12, wherein each of the first non-metallic conductive material and the second non-metallic conductive material is selected from amorphous carbon, amorphous boron-doped carbon, amorphous nitrogen-doped carbon, amorphous silicon, amorphous germanium, alloys thereof, or layer stacks thereof.

14. The memory device of claim 1, wherein the MTJ pillar structure further comprises a capping dielectric layer in contact with the ferromagnetic free layer, and the capping dielectric layer is located between the ferromagnetic free layer and the bonding interface.

15. The memory device of claim 1, wherein:

the magnetic tunnel junction pillar structure comprises a nonmagnetic metal capping layer in direct contact with the capping dielectric layer and the junction-side bonding plate;

the selector pillar structure is laterally surrounded by a first dielectric matrix comprising a first dielectric material;

the magnetic tunnel junction pillar structure is laterally surrounded by a second dielectric matrix comprising a second dielectric material;

the second dielectric material is bonded to the first dielectric matrix material by dielectric-to-dielectric bonding at a dielectric bonding interface that is located within a same horizontal plane as the bonding interface; and a periphery of a horizontal surface of the selector-side bonding pad within a horizontal plane including the bonding interface is laterally offset relative to a periphery of a horizontal surface of the junction-side bonding plate within the horizontal plane.

16. A memory system, comprising:

data control circuits;

data reading and writing circuits;

data error correction circuits;

a temperature monitoring circuit; and an array of non-volatile memory elements, wherein each non-volatile memory element comprises a magnetic tunnel junction (MTJ) and a selector device;

wherein the MTJ comprises a ferromagnetic reference layer, a tunnel barrier layer, a ferromagnetic free layer, and a junction-side bonding plate comprising a second metallic bonding material;

wherein the selector device comprises a material portion functioning as a voltage-dependent switch, and a selector-side bonding pad comprising a first metallic bonding material; and wherein a bonding interface at which the junction-side bonding plate is bonded to the selector-side bonding pad by metal-to-metal bonding is located between the MTJ and the selector device.

17. The memory system of claim 16, wherein:

the selector device is laterally offset from the MTJ; and an extent of the offset is less than a width of the MTJ.

18. The memory device of claim 16, wherein the bonding interface is located between the selector device and the free layer of the MTJ.

19. The memory device of claim 18, wherein the selector device comprises a stack including a first electrode plate comprising a first non-metallic conductive material, a second electrode plate comprising a second non-metallic conductive material, and a selector material plate located between the first electrode plate and the second electrode plate.

20. The memory device of claim 19, wherein each of the first non-metallic conductive material and the second non-metallic conductive material is selected from amorphous carbon, amorphous boron-doped carbon, amorphous nitrogen-doped carbon, amorphous silicon, amorphous germanium, alloys thereof, or layer stacks thereof.

* * * * *